US011737350B2

(12) United States Patent
Lee et al.

(10) Patent No.: US 11,737,350 B2
(45) Date of Patent: Aug. 22, 2023

(54) ORGANOMETALLIC COMPOUND, ORGANIC LIGHT-EMITTING DEVICE INCLUDING THE ORGANOMETALLIC COMPOUND, AND DIAGNOSIS COMPOSITION INCLUDING THE ORGANOMETALLIC COMPOUND

(71) Applicants: Jiyoun Lee, Seoul (KR); Yoonhyun Kwak, Seoul (KR); Bumwoo Park, Seoul (KR); Sunyoung Lee, Seoul (KR); Jungin Lee, Hwaseong-si (KR); Youngjae Park, Seoul (KR)

(72) Inventors: Jiyoun Lee, Seoul (KR); Yoonhyun Kwak, Seoul (KR); Bumwoo Park, Seoul (KR); Sunyoung Lee, Seoul (KR); Jungin Lee, Hwaseong-si (KR); Youngjae Park, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 240 days.

(21) Appl. No.: 17/103,498

(22) Filed: Nov. 24, 2020

(65) Prior Publication Data

US 2021/0083207 A1 Mar. 18, 2021

Related U.S. Application Data

(63) Continuation of application No. 15/234,349, filed on Aug. 11, 2016, now abandoned.

(30) Foreign Application Priority Data

Aug. 13, 2015 (KR) ........................ 10-2015-0114549
Aug. 11, 2016 (KR) ........................ 10-2016-0102248

(51) Int. Cl.
*H01L 51/00* (2006.01)
*H10K 85/30* (2023.01)
(Continued)

(52) U.S. Cl.
CPC ....... *H10K 85/346* (2023.02); *C07F 15/0093* (2013.01); *C09K 11/06* (2013.01);
(Continued)

(58) Field of Classification Search
CPC ............... C07F 15/0086; C07F 7/0807; C09K 2211/185; C09K 2211/1007;
(Continued)

(56) References Cited

U.S. PATENT DOCUMENTS 7,429,426 B2 9/2008 Brown et al.
7,442,797 B2 10/2008 Itoh et al.
(Continued)

FOREIGN PATENT DOCUMENTS

DE 102011001007 A1 * 9/2012 ........... C07D 401/04
DE 102011001007 A1 9/2012
(Continued)

OTHER PUBLICATIONS

Anzhela Galstyan, et al., "Correlating the Structural and Photophysical Features of Pincer Lumiunophores and Mionodentate Ancillary Ligands in PtII Phosphors", Eur. J. Inorg. Chem. 2015, 5822-5831.
(Continued)

*Primary Examiner* — Sean M DeGuire
(74) *Attorney, Agent, or Firm* — Cantor Colburn LLP

(57) ABSTRACT

An organometallic compound represented by Formula 1:

$$M(L_1)(L_2) \quad \text{Formula 1}$$

wherein in Formula 1, M, $L_1$, and $L_2$ are the same as described in the specificaiton.

6 Claims, 1 Drawing Sheet

(51) Int. Cl.
*C07F 15/00* (2006.01)
*C09K 11/06* (2006.01)
*H10K 50/11* (2023.01)
*H10K 101/10* (2023.01)

(52) U.S. Cl.
CPC ................. *C09K 2211/1007* (2013.01); *C09K 2211/1044* (2013.01); *C09K 2211/185* (2013.01); *H10K 50/11* (2023.02); *H10K 2101/10* (2023.02)

(58) Field of Classification Search
CPC .... C09K 2211/1044; C09K 2211/1059; C09K 2211/1074
See application file for complete search history.

(56) References Cited

U.S. PATENT DOCUMENTS

| | | | | |
|---|---|---|---|---|
| 2007/0296329 | A1* | 12/2007 | Sotoyama ........... | C07F 15/0093 546/10 |
| 2011/0028723 | A1 | 2/2011 | Li et al. | |
| 2011/0136755 | A1 | 6/2011 | Rieger et al. | |
| 2011/0278555 | A1 | 11/2011 | Inoue et al. | |
| 2012/0138911 | A1 | 6/2012 | Inoue et al. | |
| 2013/0193142 | A1 | 8/2013 | Yam et al. | |
| 2014/0088307 | A1* | 3/2014 | De Cola ................ | H05B 33/14 546/2 |
| 2014/0142080 | A1 | 5/2014 | Che et al. | |
| 2014/0197386 | A1 | 7/2014 | Kim et al. | |
| 2014/0225088 | A1 | 8/2014 | Hwang et al. | |
| 2015/0318497 | A1 | 11/2015 | Hwang et al. | |
| 2015/0325807 | A1 | 11/2015 | Choi et al. | |
| 2016/0013431 | A1 | 1/2016 | Choi et al. | |
| 2016/0093814 | A1 | 3/2016 | Hwang et al. | |

FOREIGN PATENT DOCUMENTS

| | | | |
|---|---|---|---|
| EP | 2873711 | A1 | 5/2015 |
| JP | 2008069268 | A | 3/2008 |
| KR | 1020140096203 | A | 8/2014 |
| KR | 1020140101699 | A | 8/2014 |
| WO | 2012117082 | A1 | 9/2012 |

OTHER PUBLICATIONS

Chemical Abstract Service CAS RN: 1671092-36-6, etc. CAS RN: 1671092-36-6, etc.
Chi-Ming Che et al., Single microcrystals of organoplatinum(II) complexes with high charge-carrier mobility, Chem. Sci., vol. 2, No. 2, Feb. 2011, pp. 216-220.
Ekaterina F. Zhilina, et al., "Neutral tetranuclear Cu(II) complex of 2,6-di(5-trifluoromethylphrazol-3-yl) pyridine: Synthesis, characterization and its transformation with selected aza-ligands", Polyhedron 53 (2013) 122-131.
Elizabeth Suk-Hang Lam, et al., Inorganic Chemistry, 2015, vol. 54, No. 7, p. 3624-3630.
English Translation of Office Action issued by the Chinese Patent Office dated Dec. 18, 2019 in the examination of the Chinese Patent Application No. 201610664007.2, which corresponds to the U.S. Application above.
English Translation of Office Action issued by the Chinese Patent Office dated Jul. 24, 2020 in the examination of the Chinese Patent Application No. 201610664007.2, which corresponds to the U.S. Application.
Examination Report issued by the European Patent Office dated Oct. 6, 2017.
Extended Search Report issued by the European Patent Office dated Jan. 10, 2017 W/English Translation.
Final Office Action dated Nov. 25, 2019.
Kang-Wei Wang, et al., "Mono-versus Dinuclear Pt(II) 6-(5-Trifluoromethyl-Pyrazol-3-yl)-2.2'-Bipyridine Complexes: Synthesis, Characterization, and Remarkable Difference in Luminescent Properties", Inor. Chem. 2010, 49, 1372-1383.
King-Chin Yim, et al., Chemistry—A European Journal, 2014, vol. 20, No. 32, p. 9930-9939.
Le Zhao, et al., Luminescent Amphilic 2,6-Bis(1-alkylpyrazol-3-yl)pyridyl Platinum(II) Complexes: Synthesis, Characterization, Electrochemical, Photophysical, and Langmuir-Blodgett Film Formulation Studies, Le Zhao, et al., Chem. Eur. J., pp. 6797-6809.
Maria Serratrice, et al., Dalton Transactions, 2012, vol. 41, No. 11, p. 3287-3293.
Mathias Mydlak, et al., "Controlling Aggregation in Highly Emissive Pt(II) Complexes Bearing Tridentate Dianionic N\/N\/N Ligands. Synthesis, Photophysics, and Electroluminescence", Chem. Mater. 2011, 23, 3659-3667.
NFOA, dated Aug. 16, 2018.
Nobuyuki Komine, et al., "Probing the Steric and Electronic Characteristics of a New Bis-Pyrrolide Pincer Ligand", ACS Publications 2014, 1361-1369.
Non-Final Office Action dated Aug. 8, 2019.
Office Action issued by the Chinese Patent Office dated Dec. 18, 2019 in the examination of the Chinese Patent Application No. 201610664007.2, which corresponds to the U.S. Application above.
Office Action issued by the Chinese Patent Office dated Jul. 24, 2020 in the examination of the Chinese Patent Application No. 201610664007.2, which corresponds to the U.S. Application above.
Office Action issued by the Japanese Patent Office dated Jul. 7, 2020 in the examination of the Japanese Patent Application No. 2016-158802, which corresponds to the U.S. Application above.
Qinde Liu, et al., "New red-orange phosphorescent/electroluminescent cycloplatinated complexes of 2, 6-bis(2'-indolyl) pyridine", J. Chem. Soc., Dalton Trans., 2002, 3234-3240.
Thomas G. Ostapowicz, et al., Chemistry—A European Journal, 2011, vol. 17, No. 37, p. 10329-10338.
Wen-Li Jia, et al., "Novel Phosphorescent Cyclometalated Organotin(IV) and Organolead (IV) Complexes of 2, 6-Bis (2'-indolyl)pyridine and 2, 6-Bis[2'-(7-azaindolyl)]pyridine", Organometallics 2003, 22, 4070-4078.
Xiaoxi Zhang, et al., CrystEngComm, 2013, vol. 15, No. 44, p. 9135-9147.
Yongbo Zhou, et al., "Mononuclear, dinuclear, hexanuclear, and one-dimensional polymeric silver complexes having ligand-supported and unsupported argentophilic interactions stabilized by pincer-like 2, 6-bis (5-pyrazolyl)pyridine ligands", Dalton Trans.,m 2008, 1444-1453.
English Translation of Office Action dated Aug. 2, 2022, issued in corresponding JP Patent Application No. 2021-121062, 3 pp.
Office Action dated Aug. 2, 2022, issued in corresponding JP Patent Application No. 2021-121062, 3 pp.

* cited by examiner

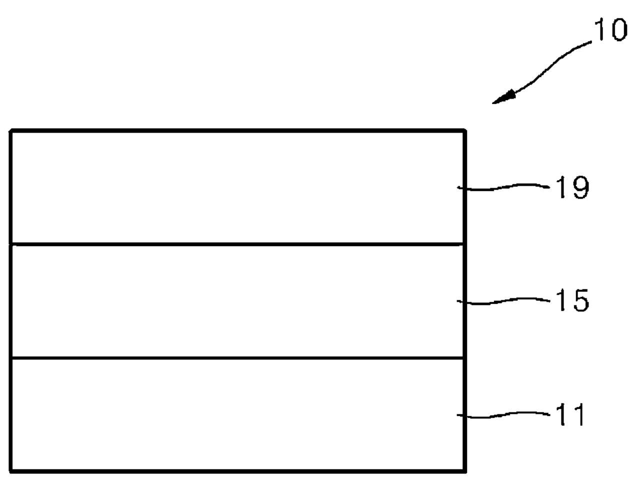
10
19
15
11

ORGANOMETALLIC COMPOUND, ORGANIC LIGHT-EMITTING DEVICE INCLUDING THE ORGANOMETALLIC COMPOUND, AND DIAGNOSIS COMPOSITION INCLUDING THE ORGANOMETALLIC COMPOUND

CROSS-REFERENCE TO RELATED APPLICATION

This is a continuation application of U.S. application Ser. No. 15/234,349, filed on Aug. 11, 2016, which claims priority to Korean Patent Application Nos. 10-2015-0114549, filed on Aug. 13, 2015, and 10-2016-0102248, filed on Aug. 11, 2016, in the Korean Intellectual Property Office, and all the benefits accruing therefrom under 35 U.S.C. § 119, the contents of which are incorporated herein in their entirety by reference.

BACKGROUND

1. Field

One or more aspects of exemplary embodiments of the present disclosure are related to an organometallic compound, an organic light-emitting device including the organometallic compound, and a diagnosis composition including the organometallic compound.

2. Description of the Related Art

Organic light-emitting devices (OLEDs) are self-emission devices having better characteristics such as a viewing angle, response time, brightness, driving voltage, and a response speed, than conventional devices. OLEDs produce full-color images.

In an example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state, thereby generating light.

Meanwhile, luminescent compounds may be used to monitor, sense, or detect a biological material, such as a cell protein. Examples of such luminescent compounds include a phosphorescent luminescent compound. However, there still remains a need in novel luminescent compounds that can be used in diagnostic tools.

SUMMARY

One or more embodiments include an organometallic compound, an organic light-emitting device including the organometallic compound, and a diagnosis composition including the organometallic compound.

Additional aspects will be set forth in part in the description which follows and, in part, will be apparent from the description, or may be learned by practice of the presented embodiments.

According to one or more embodiments, an organometallic compound is represented by Formula 1 below:

$$M(L_1)(L_2) \quad \text{Formula 1}$$

Formula 2

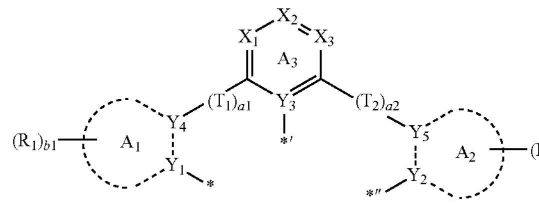

In Formulae 1 and 2,

M may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au), $L_1$ may be selected from tridentate ligands represented by Formula 2, $L_2$ may be selected from monodentate organic ligands,

*, *', and *" in Formula 2 each indicate a binding site to M in Formula 1, $Y_1$ to $Y_3$ may each be nitrogen (N), $Y_4$ and $Y_5$ may each be carbon (C), a bond between $Y_1$ and $Y_4$ may be a single bond or a double bond, and a bond between $Y_2$ and $Y_5$ may be a single bond or a double bond, one selected from a bond between $Y_1$ and M, a bond between $Y_2$ and M, and a bond between ligand $L_2$ and M may be a coordinate bond, and the other two may be covalent bonds, a bond between $Y_3$ and M may be a coordinate bond, rings $A_1$ and $A_2$ may each independently be selected from a pyrrole ring, a pyrazole ring, an imidazole ring, an oxazole ring, an iso-oxazole ring, an oxadiazole ring, a thiazole ring, an isothiazole ring, and a thiadiazol ring, $X_1$ may be N or $C(R_3)$, $X_2$ may be N or $C(R_4)$, $X_3$ may be N or $C(R_5)$, two or more selected from $R_3$ to $R_5$ may be optionally connected to each other to form a substituted or unsubstituted $C_5$-$C_{30}$ carbocyclic group or a substituted or unsubstituted $C_2$-$C_{30}$ heterocyclic group, and ring $A_3$ may have two or less nitrogen atoms as a ring-forming atom, $T_1$ and $T_2$ may each independently be selected from a single bond, *—O—*', *—S—*', *—C($R_6$)($R_7$)—*', *—C($R_6$)=*', *=C($R_6$)—*', *—C($R_6$)=C($R_7$)—*', *—C(=O)—*', *—C(=S)—*', *—C≡C—*', *—N($R_6$)—*', and *—Si($R_6$)($R_7$)—*', wherein $R_6$ and $R_7$ may be optionally connected to each other to form a substituted or unsubstituted $C_5$-$C_{30}$ carbocyclic group or a substituted or unsubstituted $C_2$-$C_{30}$ heterocyclic group, a1 and a2 may each independently be an integer selected from 1 to 3, $R_1$ to $R_7$ may each independently be selected from hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(═O)($Q_8$)($Q_9$), b1 and b2 may each independently be an integer selected from 0 to 3, wherein, when b1 is two or more, two or more groups $R_1$ may be identical to or different from each other, and when b2 is two or more, two or more groups $R_2$ may be identical to or different from each other, two selected from groups $R_1$ in the number of b1 may be optionally connected to each other to form a substituted or unsubstituted $C_5$-$C_{30}$ carbocyclic group or a substituted or unsubstituted $C_2$-$C_{30}$ heterocyclic group, two selected from groups $R_2$ in the number of b2 may be optionally connected to form a substituted or unsubstituted $C_5$-$C_{30}$ carbocyclic group or a substituted or unsubstituted $C_2$-$C_{30}$ heterocyclic group, a moiety represented by

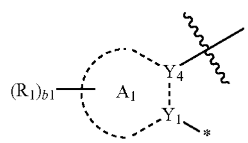

in Formula 2 may not be

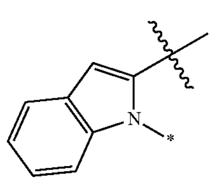

and

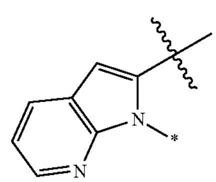

, and a moiety represented by

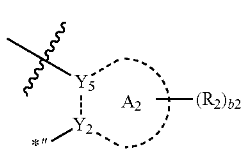

in Formula 2 may not be

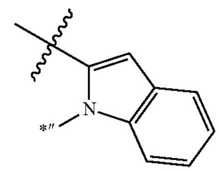

and

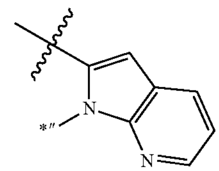

, at least one substituent selected from a substituent(s) of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{60}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be selected from:

deuterium, —F, —C, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —C, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(═O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, each substituted with at least one selected from deuterium, —F, —$C_1$, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$, wherein $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —$C_1$, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

In one or more embodiments, an organic light-emitting device includes:

a first electrode;

a second electrode; and an organic layer disposed between the first electrode and the second electrode, wherein the organic layer includes an emission layer and one or more organometallic compounds represented by Formula 1.

The organometallic compound may act as a dopant in the emission layer.

In one or more embodiments, a diagnosis composition includes one or more selected from the organometallic compounds represented by Formula 1.

BRIEF DESCRIPTION OF THE DRAWINGS

These and/or other aspects will become apparent and more readily appreciated from the following description of the embodiments, taken in conjunction with the accompanying drawing in which:

The FIGURE is a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects. As used herein, the term "and/or" includes any and all combinations of one or more of the associated listed items. Expressions such as "at least one of," when preceding a list of elements, modify the entire list of elements and do not modify the individual elements of the list.

The present disclosure will now be described more fully with reference to exemplary embodiments. The disclosure may, however, be embodied in many different forms and should not be construed as being limited to the embodiments set forth herein, rather, these embodiments are provided so that this disclosure will be thorough and complete, and will fully convey the concept of the disclosure to those skilled in the art. Advantages, features, and how to achieve them of the present inventive concept will become apparent by reference to the embodiment that will be described later in detail, together with the accompanying drawings. This inventive concept may, however, be embodied in many different forms and should not be limited to the exemplary embodiments.

Hereinafter, embodiments are described in detail by referring to the attached drawings, and in the drawings, like reference numerals denote like elements, and a redundant explanation thereof will not be provided herein.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

As used herein, the singular forms "a," "an" and "the" are intended to include the plural forms as well, unless the context clearly indicates otherwise.

The term "or" means "and/or." It will be further understood that the terms "comprises" and/or "comprising" or "includes" and/or "including" used herein specify the presence of stated features, regions, integers, steps, operations, elements, and/or components, but do not preclude the presence or addition of one or more other features, regions, integers, steps, operations, elements, and/or components.

It will be understood that when a layer, region, or component is referred to as being "on" or "onto" another layer, region, or component, it may be directly or indirectly formed on the other layer, region, or component. That is, for example, intervening layers, regions, or components may be present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Sizes of components in the drawings may be exaggerated for convenience of explanation. In other words, since sizes and thicknesses of components in the drawings are arbitrarily illustrated for convenience of explanation, the following embodiments are not limited thereto.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within 30%, 20%, 10%, 5% of the stated value.

The term "organic layer" as used herein refers to a single layer and/or a plurality of layers between the first electrode and the second electrode of the organic light-emitting device. A material included in the "organic layer" is not limited to an organic material.

An organometallic compound according to an embodiment may be represented by Formula 1 below:

$M(L_1)(L_2)$, Formula 1

M in Formula 1 may be beryllium (Be), magnesium (Mg), aluminum (Al), calcium (Ca), titanium (Ti), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au). For example, M in Formula 1 may be platinum (Pt).

$L_1$ in Formula 1 may be selected from tridentate ligands represented by Formula 2, $L_2$ may be selected from monodentate organic ligands, and *, *', and *" in Formula 2 each indicate a binding site to M in Formula 1.

Formula 2

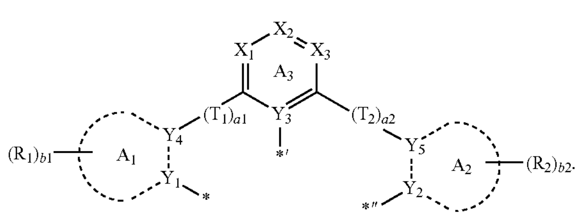

wherein, in Formula 2, $Y_1$ to $Y_3$ may be nitrogen (N), $Y_4$ and $Y_5$ may be carbon (C), a bond between $Y_1$ and $Y_4$ may be a single bond or a double bond, and a bond between $Y_2$ and $Y_5$ may be a single bond or a double bond.

In Formula 2, one selected from a bond between $Y_1$ and M, a bond between $Y_2$ and M, and a bond between ligand $L_2$ and M may be a coordinate bond, and the other two may be covalent bonds. Also, a bond between $Y_3$ and M may be a coordinate bond.

Therefore, the organometallic compound represented by Formula 1 is in a neutral state having no electric charge.

In one or more embodiments, in Formulae 1 and 2, a bond between $Y_1$ and M and a bond between $Y_2$ and M may be a covalent bond, and a bond between $Y_3$ and M and a bond between ligand $L_2$ and M may be a coordinate bond.

In one or more embodiments, in Formulae 1 and 2, a bond between $Y_1$ and M and a bond between ligand $L_2$ and M may be a covalent bond, and a bond between $Y_3$ and M and a bond between $Y_2$ and M may be a coordinate bond.

Rings $A_1$ and $A_2$ in Formula 2 may each independently be selected from a pyrrole ring, a pyrazole ring, an imidazole ring, an oxazole ring, an iso-oxazole ring, an oxadiazole ring, a thiazole ring, an isothiazole ring, and a thiadiazol ring. Accordingly, rings $A_1$ and $A_2$ may include one or two nitrogen atoms as a ring-forming atom.

In Formula 2, $X_1$ may be N or $C(R_3)$, $X_2$ may be N or $C(R_4)$, and $X_3$ may be N or $C(R_5)$. Two or more selected from $R_3$ to $R_5$ may be optionally connected to each other to form a substituted or unsubstituted $C_5$-$C_{30}$ carbocyclic group or a substituted or unsubstituted $C_2$-$C_{30}$ heterocyclic group (for example, a substituted or unsubstituted cyclopentadiene group, a substituted or unsubstituted cyclopentane group, a substituted or unsubstituted cyclohexane group, a substituted or unsubstituted adamantane group, a substituted or unsubstituted bicyclo[2.2.1]heptane group, a substituted or unsubstituted benzene group, a substituted or unsubstituted pyridine group, a substituted or unsubstituted pyrimidine group, a substituted or unsubstituted pyrazine group, a substituted or unsubstituted pyridazine group, a substituted or unsubstituted naphthalene group, a substituted or unsubstituted anthracene group, a substituted or unsubstituted tetracene group, a substituted or unsubstituted phenanthrene group, a substituted or unsubstituted dihydronaphthalene group, a substituted or unsubstituted phenalene group, a substituted or unsubstituted benzothiophene group, a substituted or unsubstituted benzofuran group, a substituted or unsubstituted indene group, a substituted or unsubstituted indole group, and the like). Descriptions for a susbtituent of the substituted $C_5$-$C_{30}$ carbocyclic group and the substituted $C_2$-$C_{30}$ heterocyclic group are same as descriptions for $R_1$ in this disclosure.

Ring $A_3$ in Formula 2 may have one or two nitrogen atoms as a ring-forming atom.

In one or more embodiments, a moiety represented by

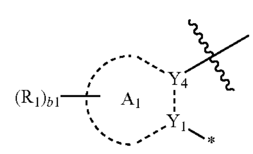

in Formula 2 and a moiety represented by

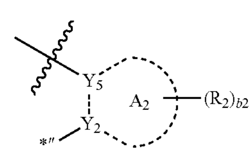

in Formula 2 may be identical to each other.

In one or more embodiments, a moiety represented by

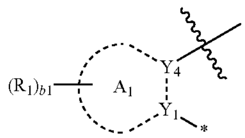

in Formula 2 and a moiety represented by

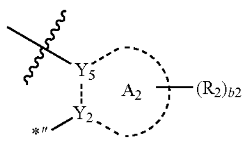

in Formula 2 may be different from each other.

In one or more embodiments, at least one selected from rings $A_1$ and $A_2$ in Formula 2 may be pyrazol ring.

In one or more embodiments, both rings $A_1$ and $A_2$ in Formula 2 may be a pyrazol ring, but embodiments of the present disclosure are not limited thereto.

$T_1$ and $T_2$ in Formula 2 may each independently be selected from a single bond, *—O—*', *—S—*', *—C($R_6$)($R_7$)—*', *—C($R_6$)═*, *═C($R_6$)—*, *—C($R_7$)═C($R_7$)—*', *—C(═O)*, *—C(═S)—*', *—C≡C—*', *—N($R_6$)—*', and *—Si($R_6$)($R_7$)—*'. $R_6$ and $R_7$ may be optionally connected to each other to form a substituted or unsubstituted $C_5$-$C_{30}$ carbocyclic group or a substituted or unsubstituted $C_2$-$C_{30}$ heterocyclic group (for example, a substituted or unsubstituted cyclopentane group, a substituted or unsubstituted cyclohexane group, a substituted or unsubstituted benzene group, a substituted or unsubstituted naphthalene group, and the like). $R_6$ and $R_7$ are the same as described below.

a1 and a2 in Formula 1 may each independently be an integer selected from 1 to 3. a1 indicates the number of groups $T_1$, wherein, when a1 is two or more, two or more groups $T_1$ may be identical to or different from each other. a2 indicates the number of groups $T_2$, wherein, when a2 is two or more, two or more groups $T_2$ may be identical to or different from each other. For example, a1 and a2 may each independently be 1 or 2.

In one or more embodiments, $T_1$ and $T_2$ in Formula 1 may each independently be selected from a single bond, *—O—*', *—S—*', *—C($R_6$)($R_7$)—*', *—C($R_6$)═*', *═C($R_6$)—*, *—C($R_6$)═C($R_7$)—*', *—C(═O)—*', *—C(═S)—*', *—C≡C—*', *—N($R_6$)—*', and a group represented by any of Formulae 11-1 to 11-4, and a1 and a2 may each independently be 1 or 2:

Formula 11-1

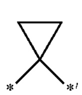

Formula 11-2

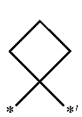

-continued

Formula 11-3

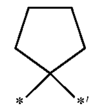

Formula 11-4

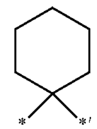

In one or more embodiments, $T_1$ and $T_2$ in Formula 1 may be a single bond, but embodiments of the present disclosure are not limited thereto.

A moiety represented by

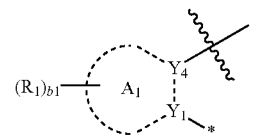

in Formula 2 may not be

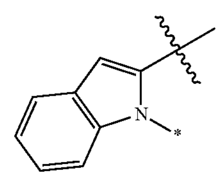

and

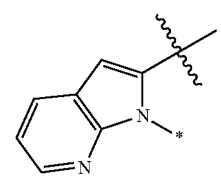

, and a moiety represented by

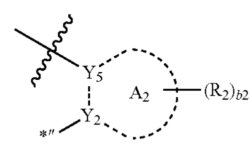

in Formula 2 may not

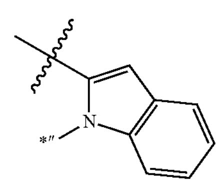

and

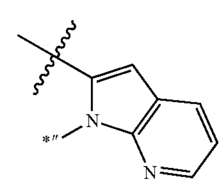

.

For example, a moiety represented by

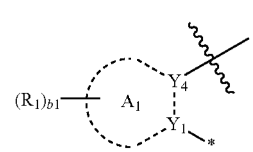

in Formula 2 may be represented by one selected from Formulae 3-1 to 3-25 and 3-31 to 3-74, a moiety represented by

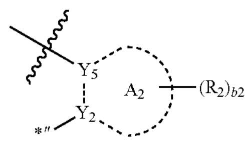

in Formula 2 may be represented by one selected from Formulae 4-1 to 4-25 and 4-31 to 4-74, and a moiety represented by

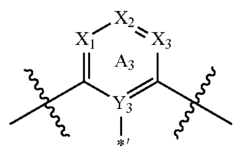

in Formula 2 may be represented by Formulae 5-1 to 5-47:

Formula 3-1

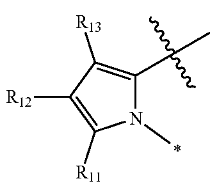

Formula 3-2

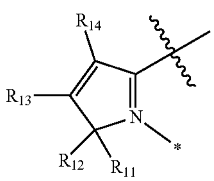

Formula 3-3

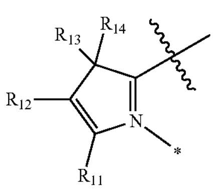

Formula 3-4

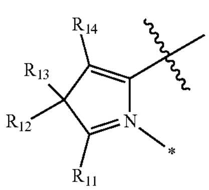

Formula 3-5

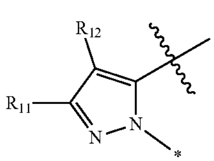

-continued

Formula 3-6

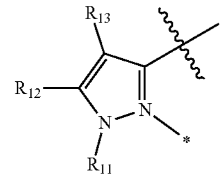

Formula 3-7

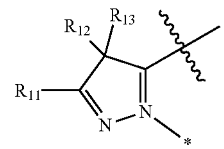

Formula 3-8

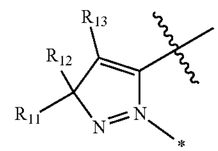

Formula 3-9

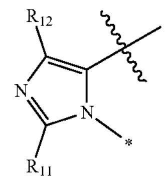

Formula 3-10

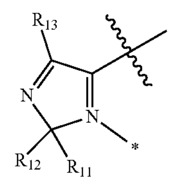

Formula 3-11

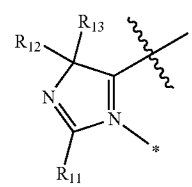

Formula 3-12

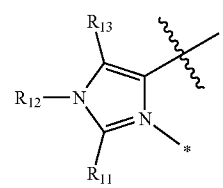

Formula 3-13

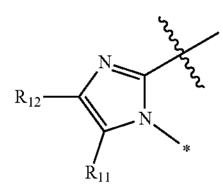

Formula 3-14

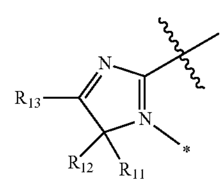

Formula 3-15
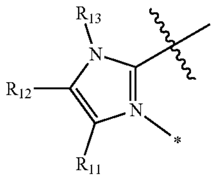
Formula 3-16
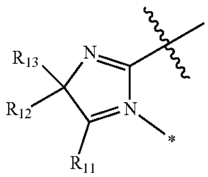
Formula 3-17
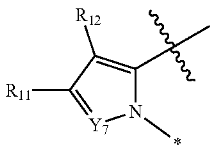
Formula 3-18
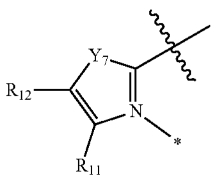
Formula 3-19
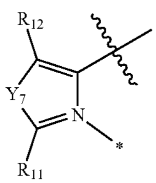
Formula 3-20
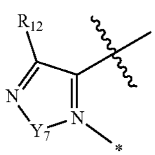
Formula 3-21
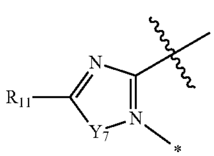
Formula 3-22
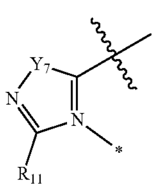
Formula 3-23
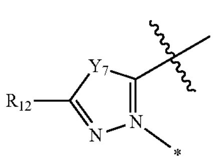
Formula 3-24
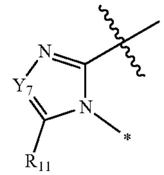
Formula 3-25
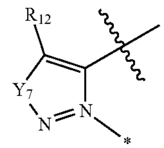
Formula 3-31
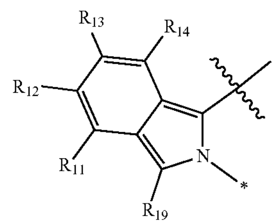
Formula 3-32
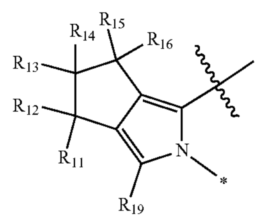
Formula 3-33
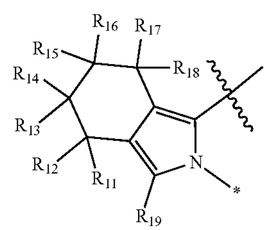
Formula 3-34
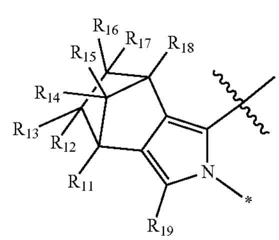
Formula 3-35
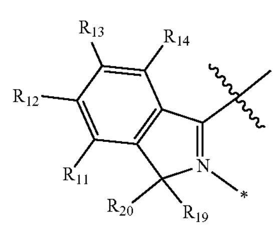

-continued
Formula 3-36
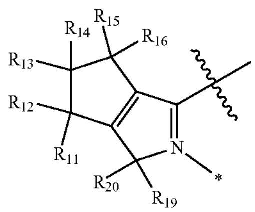
Formula 3-37
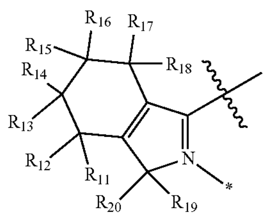
Formula 3-38
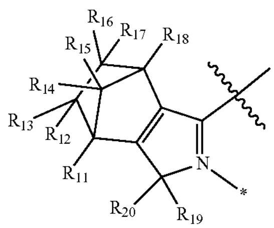
Formula 3-39
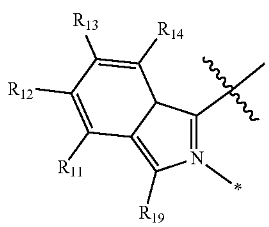
Formula 3-40
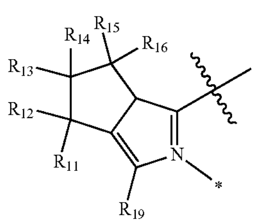
Formula 3-41
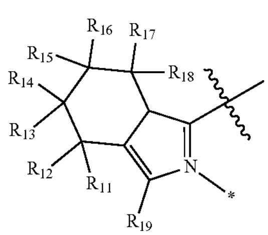
Formula 3-42
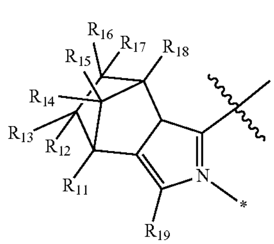
-continued
Formula 3-43
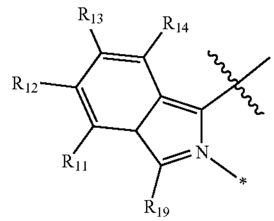
Formula 3-44
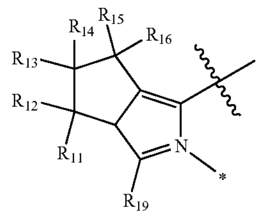
Formula 3-45
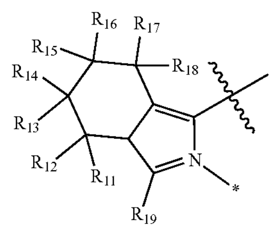
Formula 3-46
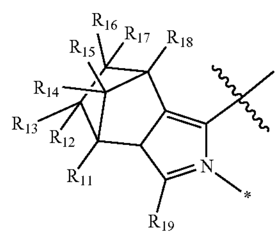
Formula 3-47
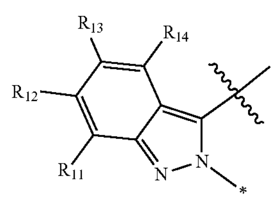
Formula 3-48
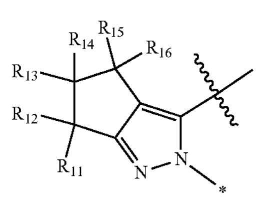
Formula 3-49
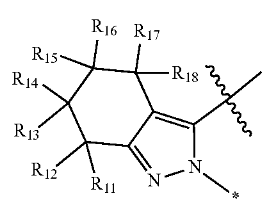

-continued
Formula 3-50
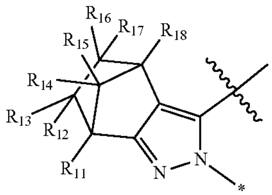
Formula 3-51
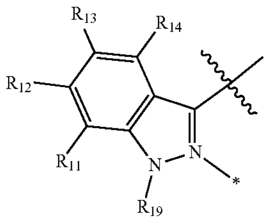
Formula 3-52
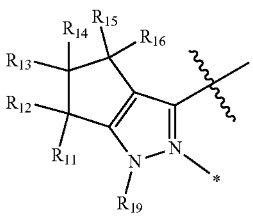
Formula 3-53
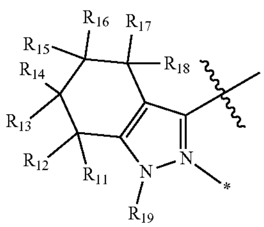
Formula 3-54
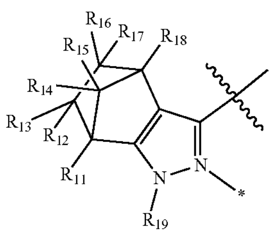
Formula 3-55
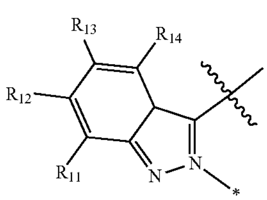
Formula 3-56
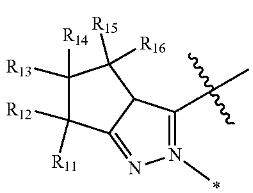
-continued
Formula 3-57
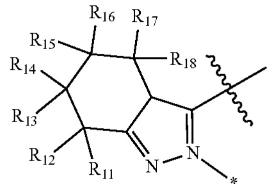
Formula 3-58
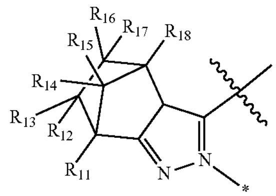
Formula 3-59
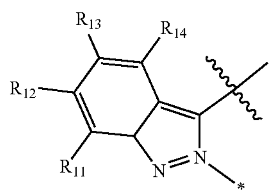
Formula 3-60
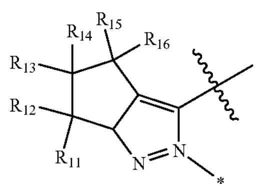
Formula 3-61
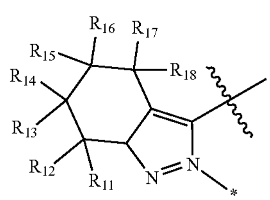
Formula 3-62
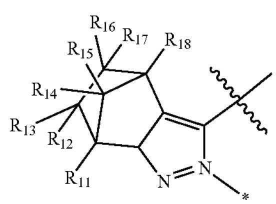
Formula 3-63
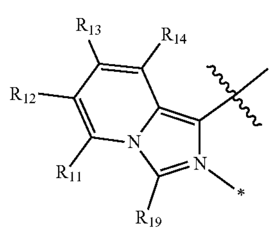

-continued
Formula 3-64
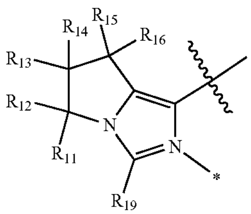
Formula 3-65
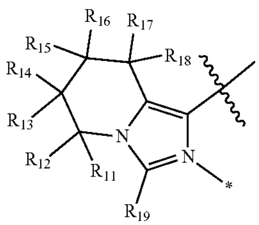
Formula 3-66
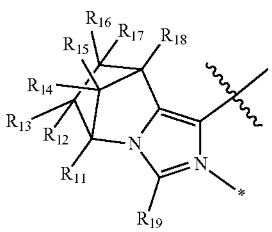
Formula 3-67
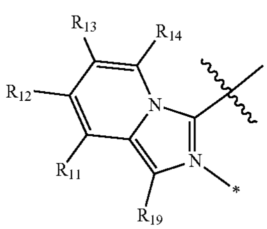
Formula 3-68
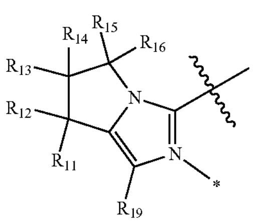
Formula 3-69
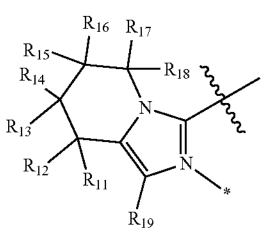
Formula 3-70
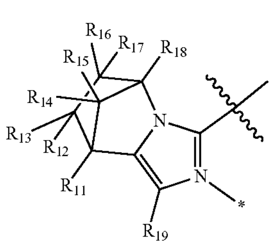
-continued
Formula 3-71
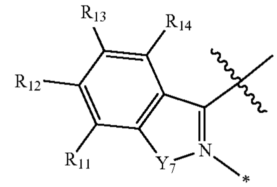
Formula 3-72
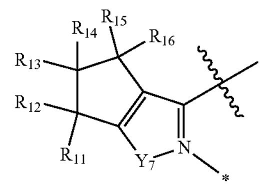
Formula 3-73
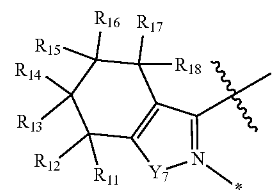
Formula 3-74
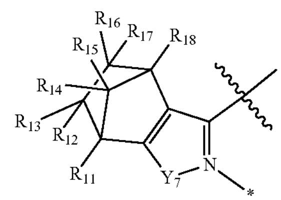
Formula 4-1
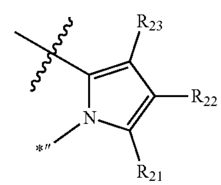
Formula 4-2
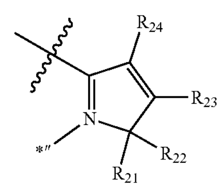
Formula 4-3
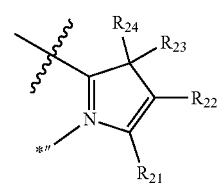
Formula 4-4
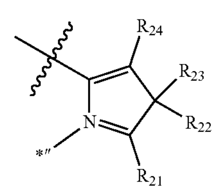

-continued
Formula 4-5
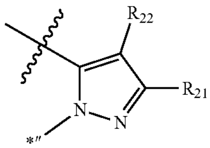
Formula 4-6
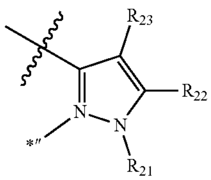
Formula 4-7
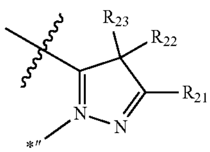
Formula 4-8
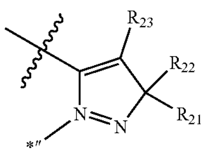
Formula 4-9
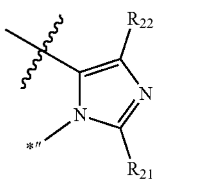
Formula 4-10
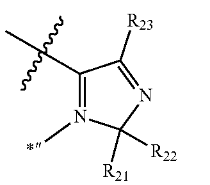
Formula 4-11
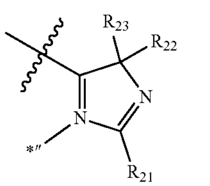
Formula 4-12
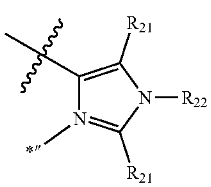
Formula 4-13
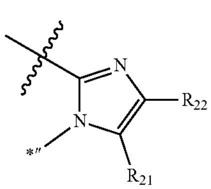
-continued
Formula 4-14
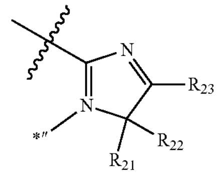
Formula 4-15
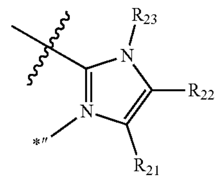
Formula 4-16
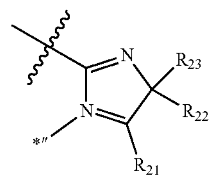
Formula 4-17
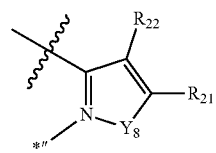
Formula 4-18
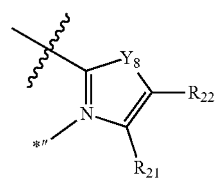
Formula 4-19
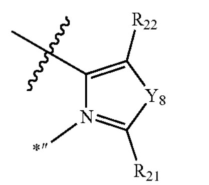
Formula 4-20
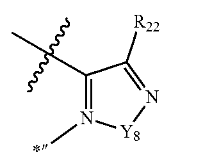
Formula 4-21
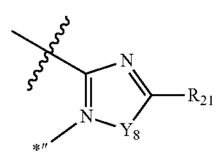
Formula 4-22
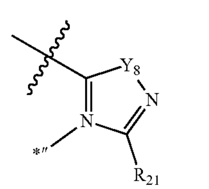

Formula 4-23
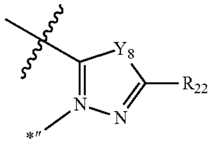
Formula 4-24
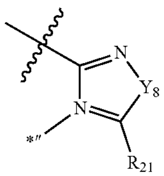
Formula 4-25
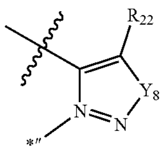
Formula 4-31
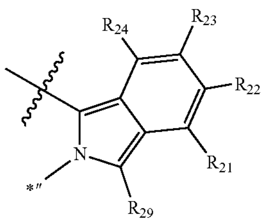
Formula 4-32
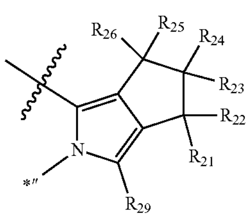
Formula 4-33
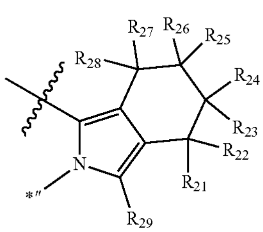
Formula 4-34
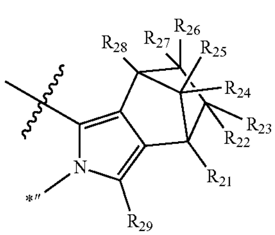
Formula 4-35
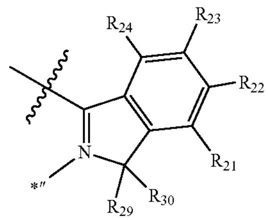
Formula 4-36
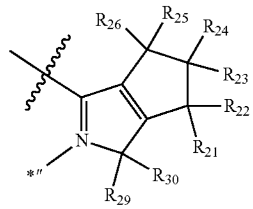
Formula 4-37
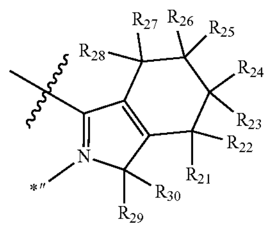
Formula 4-38
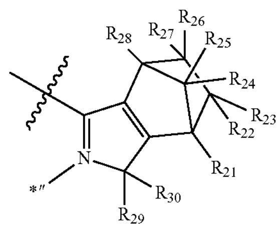
Formula 4-39
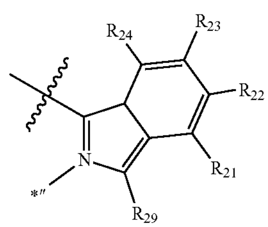
Formula 4-40
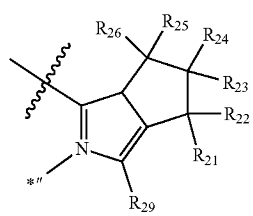
Formula 4-41
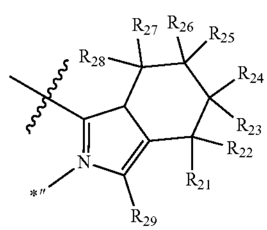

Formula 4-42
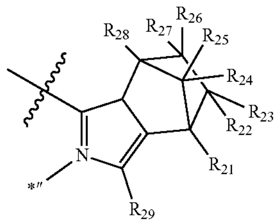
Formula 4-43
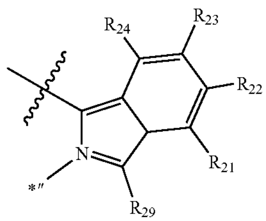
Formula 4-44
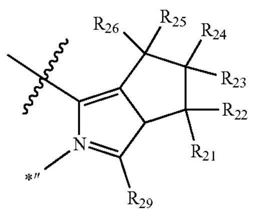
Formula 4-45
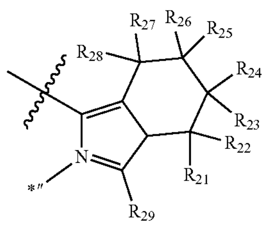
Formula 4-46
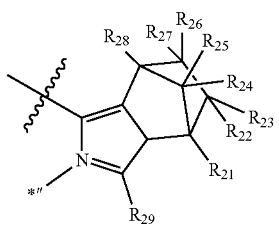
Formula 4-47
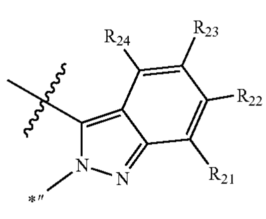
Formula 4-48
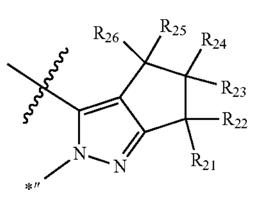
Formula 4-49
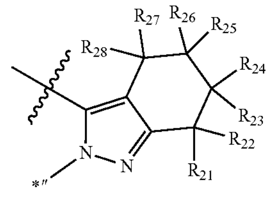
Formula 4-50
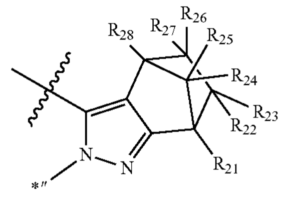
Formula 4-51
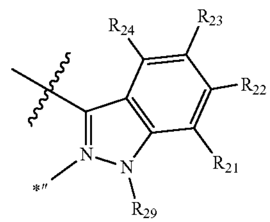
Formula 4-52
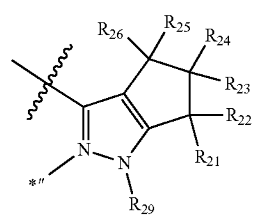
Formula 4-53
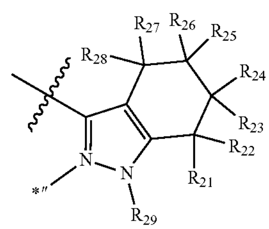
Formula 4-54
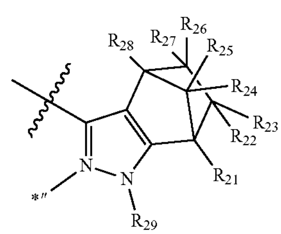
Formula 4-55
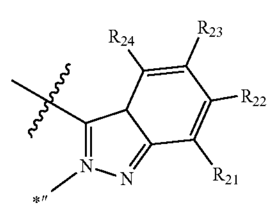

-continued
Formula 4-56
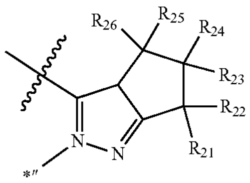
Formula 4-57
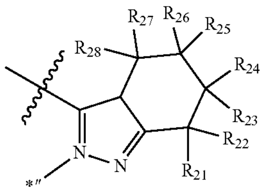
Formula 4-58
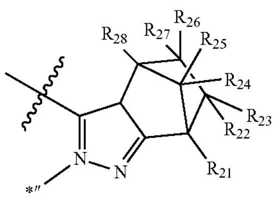
Formula 4-59
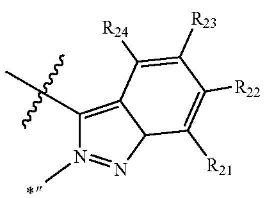
Formula 4-60
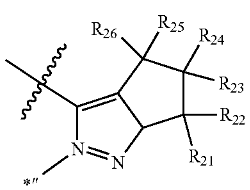
Formula 4-61
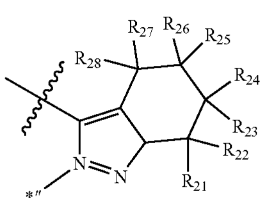
Formula 4-62
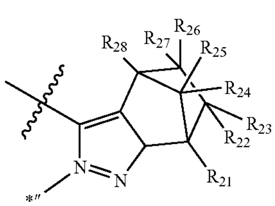
-continued
Formula 4-63
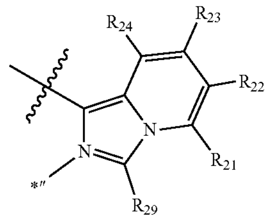
Formula 4-64
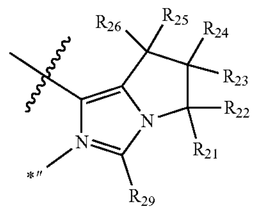
Formula 4-65
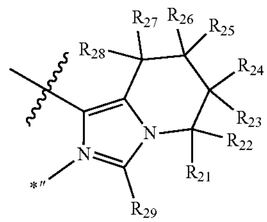
Formula 4-66
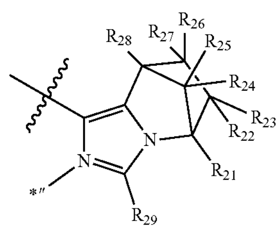
Formula 4-67
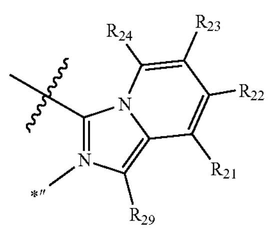
Formula 4-68
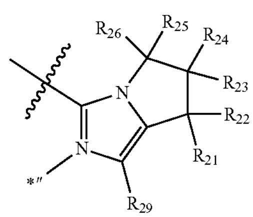
Formula 4-69
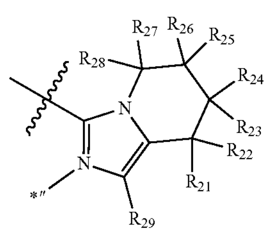

-continued
Formula 4-70
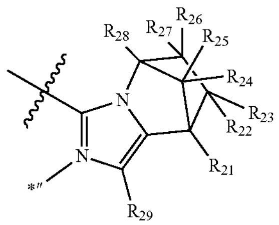
Formula 4-71
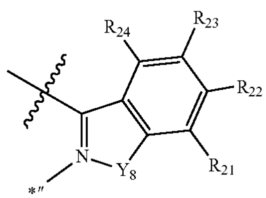
Formula 4-72
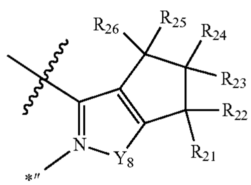
Formula 4-73
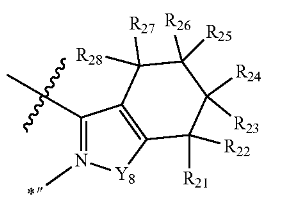
Formula 4-74
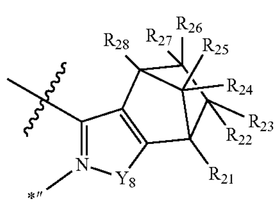
Formula 5-1
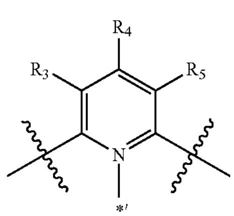
Formula 5-2
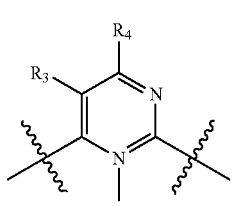
-continued
Formula 5-3
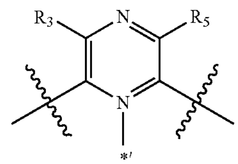
Formula 5-4
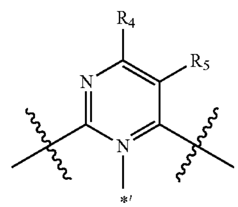
Formula 5-5
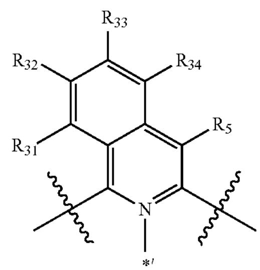
Formula 5-6
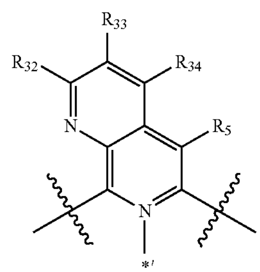
Formula 5-7
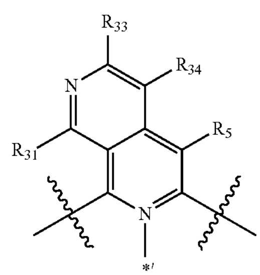
Formula 5-8
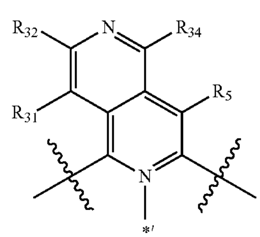

Formula 5-9
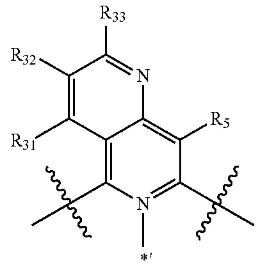
Formula 5-10
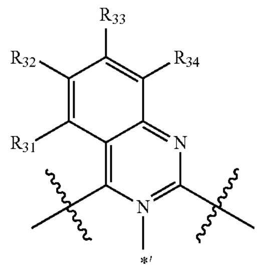
Formula 5-11
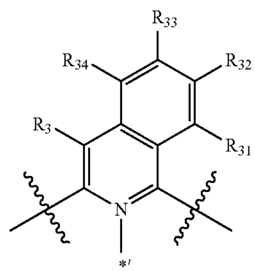
Formula 5-12
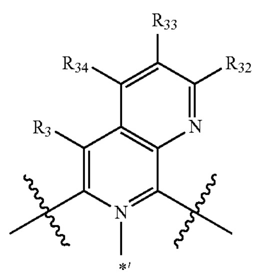
Formula 5-13
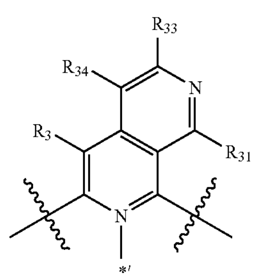
Formula 5-14
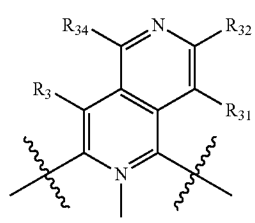
Formula 5-15
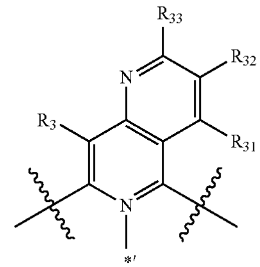
Formula 5-16
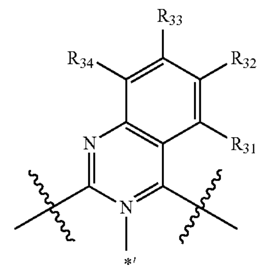
Formula 5-17
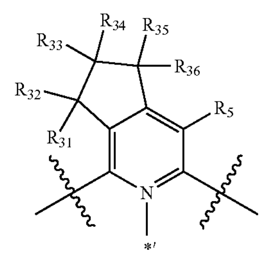
Formula 5-18
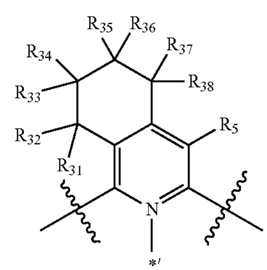
Formula 5-19
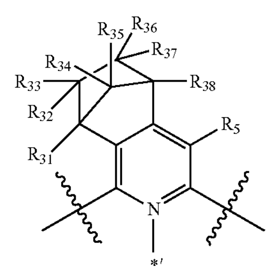
Formula 5-20
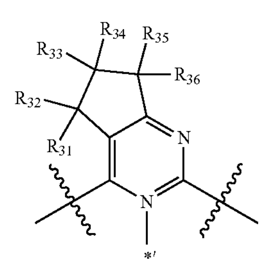

-continued
Formula 5-21
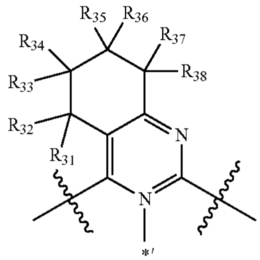
Formula 5-22
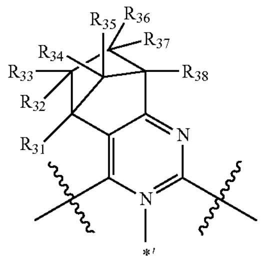
Formula 5-23
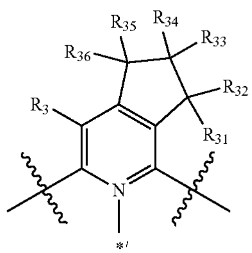
Formula 5-24
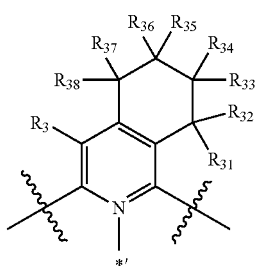
Formula 5-25
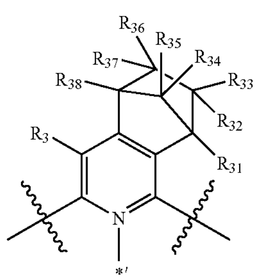
Formula 5-26
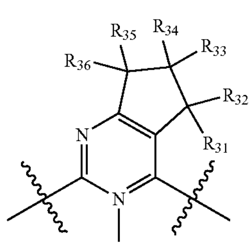
-continued
Formula 5-27
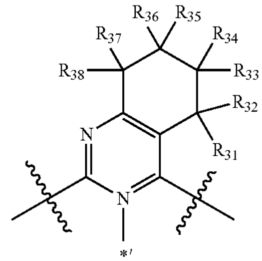
Formula 5-28
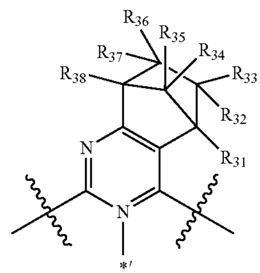
Formula 5-29
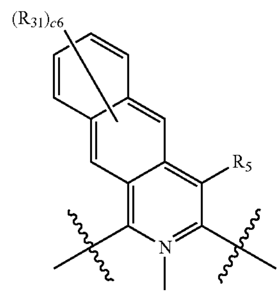
Formula 5-30
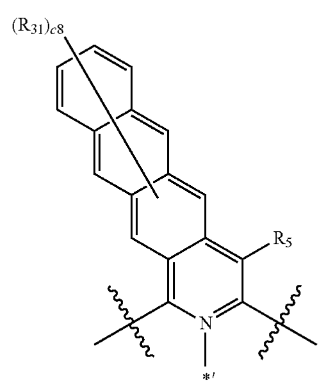

-continued
Formula 5-31
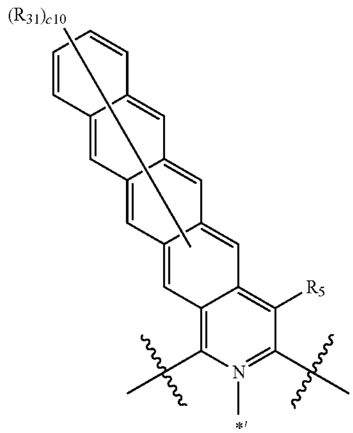
Formula 5-32
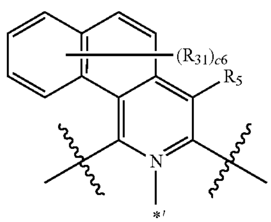
Formula 5-33
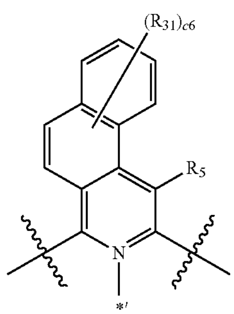
Formula 5-34
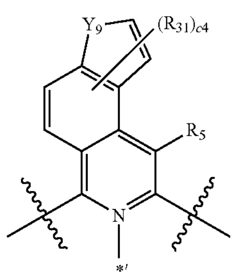
Formula 5-35
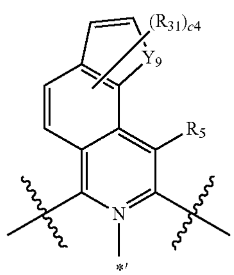
-continued
Formula 5-36
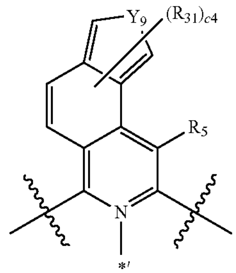
Formula 5-37
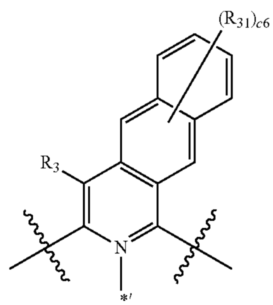
Formula 5-38
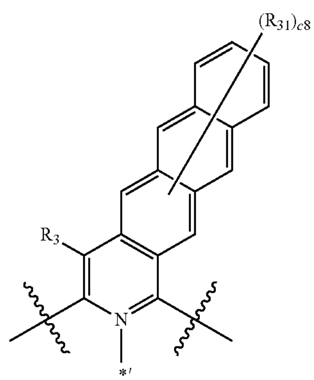
Formula 5-39
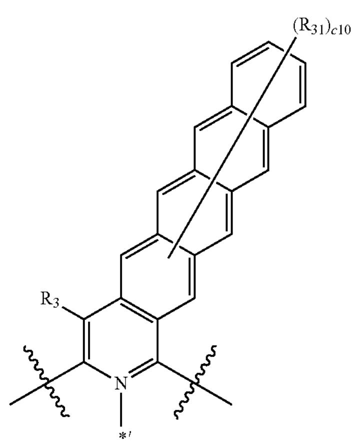

-continued

Formula 5-40

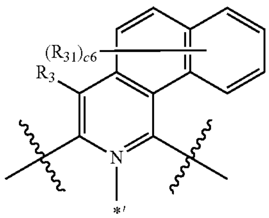

Formula 5-41

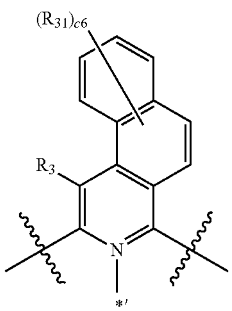

Formula 5-42

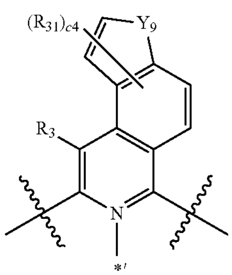

Formula 5-43

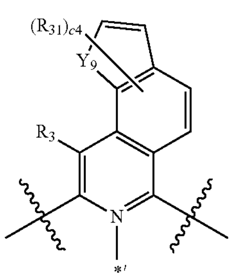

Formula 5-44

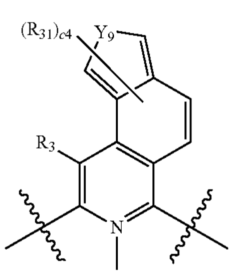

Formula 5-45

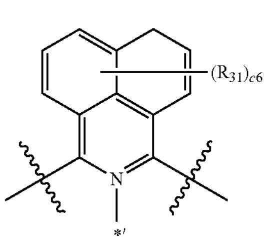

-continued

Formula 5-46

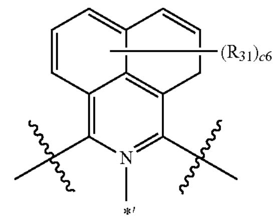

Formula 5-47

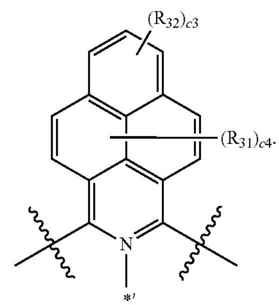

In Formulae 3-1 to 3-25, 3-31 to 3-74, 4-1 to 4-25, 4-31 to 4-74, and 5-1 to 5-47, $Y_7$ and $Y_8$ may each independently be O or S, $Y_9$ may be O, S or $N(R_{39})$, $R_3$ to $R_5$ are the same as described above, $R_{11}$ to $R_{20}$ are each independently the same as described above in connection with $R_1$, $R_{21}$ to $R_{30}$ are each independently the same as described above in connection with $R_2$, $R_{31}$ to $R_{39}$ are each independently the same as described above in connection with $R_3$, c3 may be an integer selected from 0 to 3, c4 may be an integer selected from 0 to 4, c6 may be an integer selected from 0 to 6, c8 may be an integer selected from 0 to 8, c10 may be an integer selected from 0 to 10, and

*, *', and *" each indicate a binding site to M in Formula 1.

$R_3$ to $R_5$ and $R_{11}$ to $R_{39}$ in Formulae 3-1 to 3-25, 3-31 to 3-74, 4-1 to 4-25, 4-31 to 4-74, and 5-1 to 5-47 are the same as described below.

$R_1$ to $R_7$ and $R_{11}$ to $R_{39}$ may each independently be selected from hydrogen, deuterium, —F, —C, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{10}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, and —$P(=O)(Q_8)(Q_9)$.

In one or more embodiments, $R_1$ to $R_7$ and $R_{11}$ to $R_{39}$ may each independently be selected from:

hydrogen, deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —C, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —C, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, and —$N(Q_1)(Q_2)$, —$Si(Q_3)(Q_4)(Q_5)$, —$B(Q_6)(Q_7)$, and —$P(=O)(Q_8)(Q_9)$, wherein $Q_1$ to $Q_9$ may each independently be selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{60}$ alkyl group, and a phenyl group.

For example, $R_1$ to $R_7$ and $R_{11}$ to $R_{39}$ may each independently be selected from:

hydrogen, deuterium, —F, a cyano group, a nitro group, —$SF_5$, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group;

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group, each substituted with at least one selected from deuterium, —F, $—CD_3$, $—CD_2H$, $—CDH_2$, $—CF_3$, $—CF_2H$, $—CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group; and $—N(Q_1)(Q_2)$, $—Si(Q_3)(Q_4)(Q_5)$, $—B(Q_6)(Q_7)$, and $—P({=}O)(Q_8)(Q_9)$, wherein $Q_1$ to $Q_9$ may each independently be selected from:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, and $—CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

In one or more embodiments, $R_1$ to $R_7$ and $R_{11}$ to $R_{39}$ may each independently be selected from hydrogen, deuterium, —F, a cyano group, a nitro group, $—SF_5$, $—CH_3$, $—CD_3$, $—CD_2H$, $—CDH_2$, $—CF_3$, $—CF_2H$, $—CFH_2$, a group represented by any of Formulae 9-1 to 9-19, a group represented by any of Formulae 10-1 to 10-38, and $—Si(Q_3)(Q_4)(Q_5)$ (descriptions for $Q_3$ to $Q_5$ are the same as described in this disclosure), but embodiments of the present disclosure are not limited thereto:

Formula 9-1

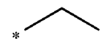

Formula 9-2

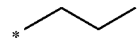

Formula 9-3

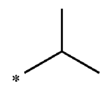

Formula 9-4

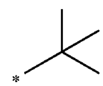

Formula 9-5

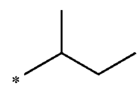

Formula 9-6

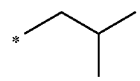

Formula 9-7

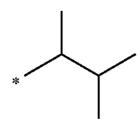

Formula 9-8

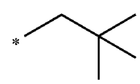

Formula 9-9

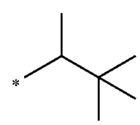

Formula 9-10

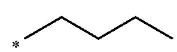

Formula 9-11

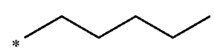

Formula 9-12

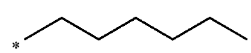

Formula 9-13

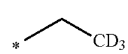

Formula 9-14

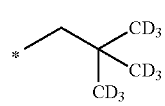

Formula 9-15

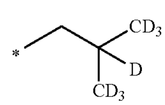

Formula 9-16

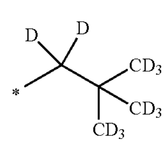

-continued
Formula 9-17
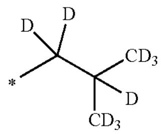
Formula 9-18
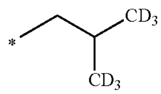
Formula 9-19
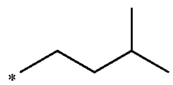
Formula 10-1
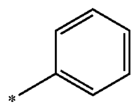
Formula 10-2
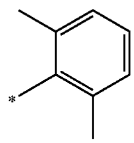
Formula 10-3
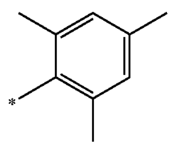
Formula 10-4
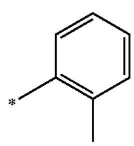
Formula 10-5
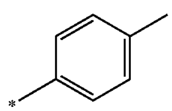
Formula 10-6
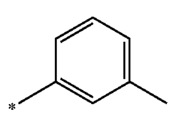
Formula 10-7
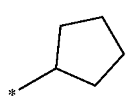
Formula 10-8
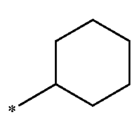
Formula 10-9
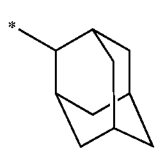
-continued
Formula 10-10
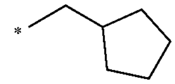
Formula 10-11
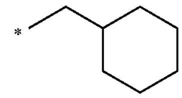
Formula 10-12
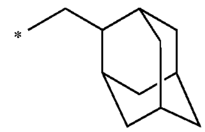
Formula 10-13
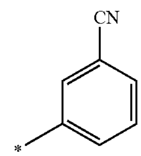
Formula 10-14
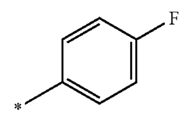
Formula 10-15
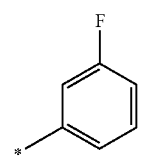
Formula 10-16
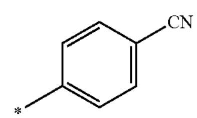
Formula 10-17
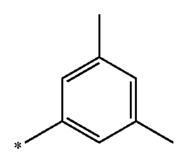
Formula 10-18
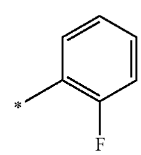
Formula 10-19
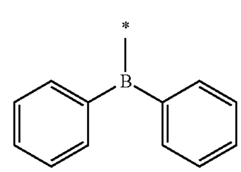
Formula 10-20
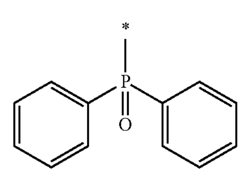

-continued
Formula 10-21
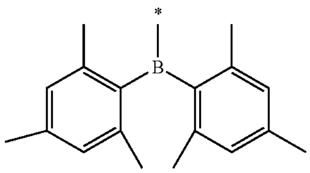
Formula 10-22
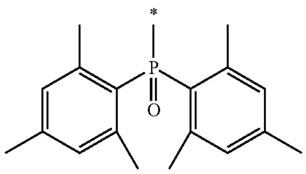
Formula 10-23
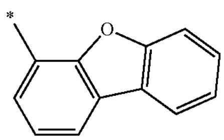
Formula 10-24
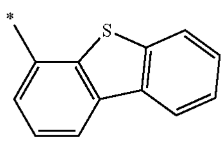
Formula 10-25
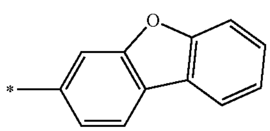
Formula 10-26
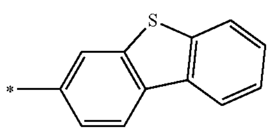
Formula 10-27
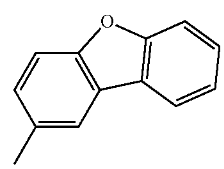
Formula 10-28
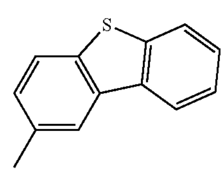
Formula 10-29
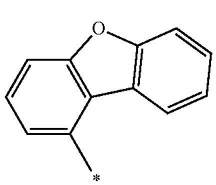
-continued
Formula 10-30
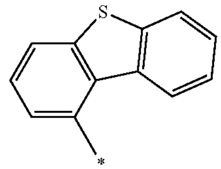
Formula 10-31
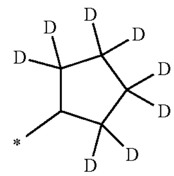
Formula 10-32
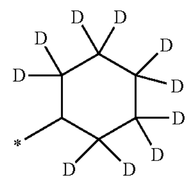
Formula 10-33
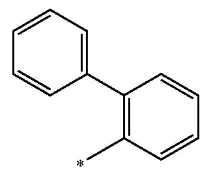
Formula 10-34
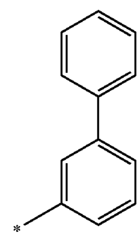
Formula 10-35
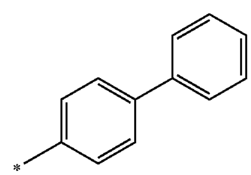
Formula 10-36
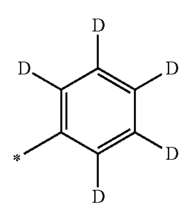
Formula 10-37
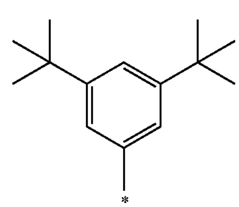

-continued

Formula 10-38

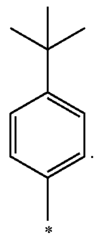

wherein * in Formulae 9-1 to 9-19 and 10-1 to 10-38 indicates a binding site to a neighboring atom.

b1 and b2 in Formula 2 may each independently be an integer selected from 0 to 3, wherein, when b1 is two or more, two or more groups $R_1$ may be identical to or different from each other, and when b2 is two or more, two or more groups $R_2$ may be identical to or different from each other.

Two selected from groups $R_1$ in the number of b1 in Formula 2 may be optionally connected to each other to form a substituted or unsubstituted $C_5$-$C_{30}$ carbocyclic group or a substituted or unsubstituted $C_2$-$C_{30}$ heterocyclic group (for example, a substituted or unsubstituted cyclopentane group, a substituted or unsubstituted cyclohexane group, a substituted or unsubstituted adamantane group, a substituted or unsubstituted bicyclo[2.2.1]heptane group, a substituted or unsubstituted benzene group, a substituted or unsubstituted pyridine group, a substituted or unsubstituted pyrimidine group, a substituted or unsubstituted pyrazine group, a substituted or unsubstituted pyridazine group, a substituted or unsubstituted naphthalene group, and the like). Descriptions for a susbtituent of the substituted $C_5$-$C_{30}$ carbocyclic group and the substituted $C_2$-$C_{30}$ heterocyclic group are same as descriptions for $R_1$ in this disclosure.

Two selected from groups $R_2$ in the number of b2 in Formula 2 may be optionally connected to each other to form a substituted or unsubstituted $C_5$-$C_{30}$ carbocyclic group or a substituted or unsubstituted $C_2$-$C_{30}$ heterocyclic group (for example, a substituted or unsubstituted cyclopentane group, a substituted or unsubstituted cyclohexane group, a substituted or unsubstituted adamantane group, a substituted or unsubstituted bicyclo[2.2.1]heptane group, a substituted or unsubstituted benzene group, a substituted or unsubstituted pyridine group, a substituted or unsubstituted pyrimidine group, a substituted or unsubstituted pyrazine group, a substituted or unsubstituted pyridazine group, a substituted or unsubstituted naphthalene, and the like). Descriptions for a susbtituent of the substituted $C_5$-$C_{30}$ carbocyclic group and the substituted $C_2$-$C_{30}$ heterocyclic group are same as descriptions for $R_1$ in this disclosure.

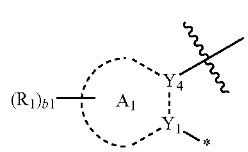

In one or more embodiments, a moiety represented by in Formula 2 may be represented by one selected from Formulae 3-5 to 3-8, 3-23, 3-25, and 3-47 to 3-62, and a moiety represented by

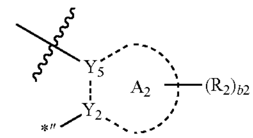

in Formula 2 may be represented by one selected from Formulae 4-5 to 4-8, 4-23, 4-25, and 4-47 to 4-62.

In one or more embodiments, a moiety represented by

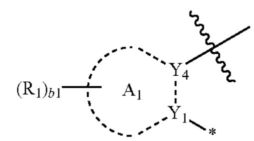

in Formula 2 may be represented by one selected from Formulae 3-1, 3-5, 3-9, 3-13, 3-31 to 3-34, and 3-47 to 3-50, and a moiety represented by

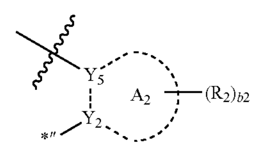

in Formula 2 may be represented by one selected from Formulae 4-1, 4-5, 4-9, 4-13, 4-31 to 4-34, and 4-47 to 4-50.

In one or more embodiments, a moiety represented by

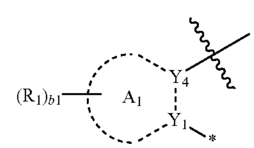

in Formula 2 may be represented by one selected from Formulae 3-1, 3-5, 3-9, 3-13, 3-31 to 3-34, and 3-47 to 3-50, and a moiety represented by

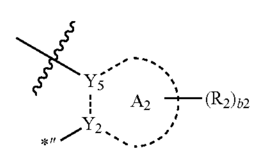

in Formula 2 may be represented by one selected from Formulae 4-2 to 4-4, 4-6 to 4-8, 4-10 to 4-12, 4-14 to 4-30, 4-35 to 4-46, and 4-51 to 4-74.

In one or more embodiments, a moiety represented by

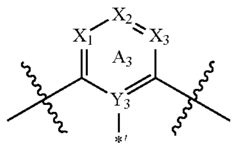

in Formula 2 may be represented by one selected from Formulae 5-1 to 5-28, 5-29, and 5-45.

In one or more embodiments, a moiety represented by

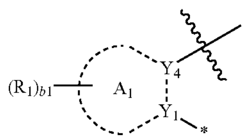

in Formula 2 may be represented by one selected from Formulae 3-5 and 3-47 to 3-50, a moiety represented by

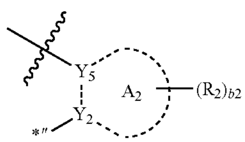

in Formula 2 may be represented by one selected from Formulae 4-1, 4-5, 4-31 to 4-34, and 4-47 to 4-50, and a moiety represented by

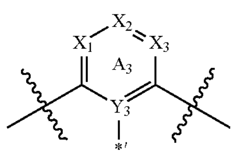

in Formula 2 may be represented by one selected from Formulae 5-1, 5-3 to 5-5, 5-7, 5-8, 5-29, and 5-45, but embodiments are not limited thereto.

For example, $L_1$ in Formula 1 may be selected from ligands represented by Formulae 2A-1 to 2E-1 and 2A-2 to 2E-2, but embodiments of the present disclosure are not limited thereto:

Formula 2A-1

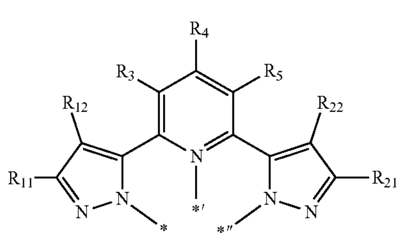

-continued

Formula 2B-1

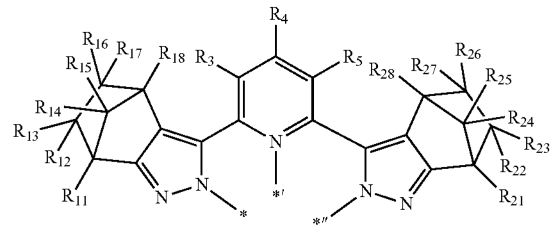

Formula 2C-1

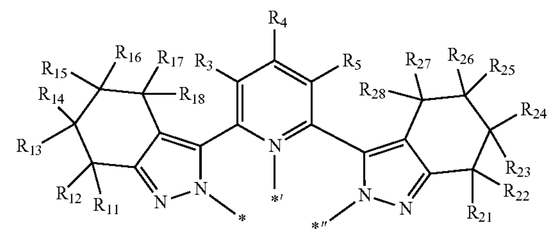

Formula 2D-1

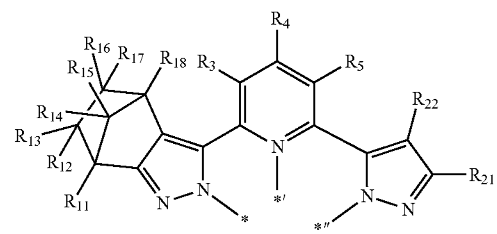

Formula 2E-1

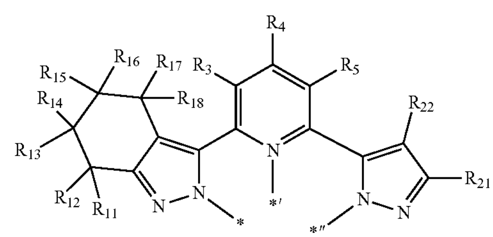

Formula 2A-2

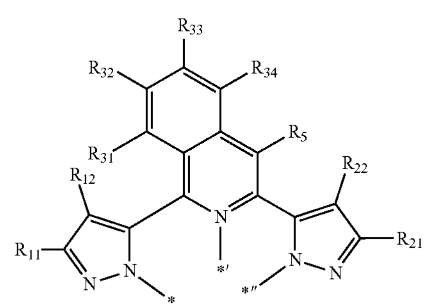

-continued

Formula 2B-2

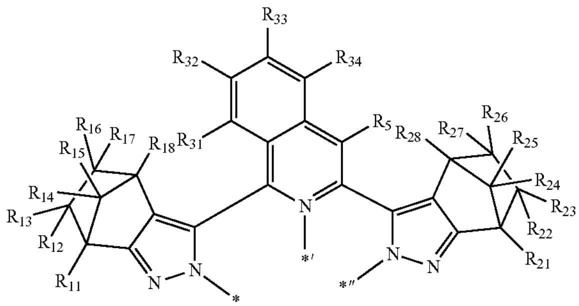

Formula 2C-2

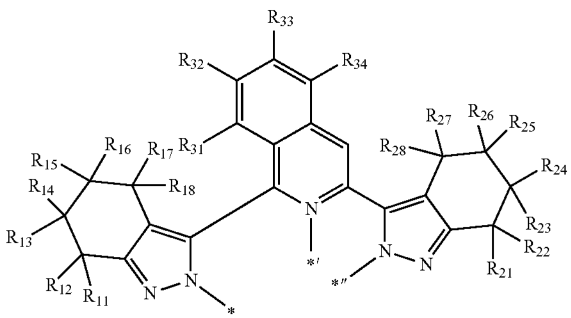

Formula 2D-2

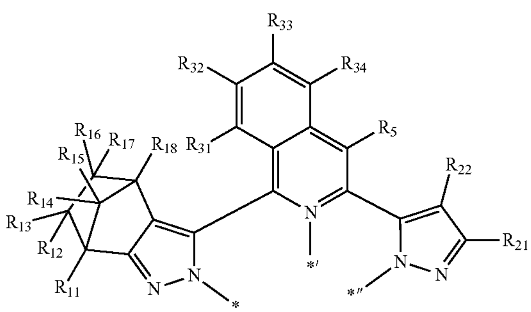

Formula 2E-2

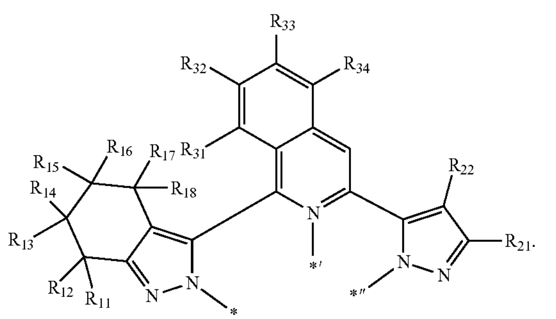

In Formulae 2A-1 to 2E-1 and 2A-2 to 2E-2, $R_3$ to $R_5$, $R_{11}$ to $R_{18}$, $R_{21}$ to $R_{28}$, and $R_{31}$ to $R_{34}$ are the same as described above, and*, *', and *" each indicate a binding site to M in Formula 1.

For example, $R_3$ to $R_5$, $R_{11}$ to $R_{18}$, $R_{21}$ to $R_{28}$, and $R_{31}$ to $R_{34}$ in Formulae 2A-1 to 2E-1 and 2A-2 to 2E-2 may each independently be selected from hydrogen, deuterium, —F, a cyano group, a nitro group, —SF, $—CH_3$, $—CD_3$, $—CD_2H$, $—CDH_2$, $—CF_3$, $—CF_2H$, $—CFH_2$, a group represented by any of Formulae 9-1 to 9-19, a group represented by any of Formulae 10-1 to 10-38, and $—Si(Q_3)(Q_4)(Q_5)$ (descriptions for $Q_3$ to $Q_5$ are the same as described in this disclosure), but embodiments of the present disclosure are not limited thereto.

$L_2$ in Formula 1 may be selected from ligands represented by Formula 6-1:

$$*\text{-}(T_3)_{a3}\text{—}R_{61} \qquad \text{Formula 6-1}$$

In Formula 6-1, $T_3$ may be selected from a single bond, *—O—*', *—S—*', $*—C(R_{62})(R_{83})—*'$, $*—C(R_{62})=*'$, $*=C(R_{62})—*'$, $*—C(R_{62})=C(R_{63})—*'$, *—C(=O)—*', *—C(=S)—*', *—C≡C—*', and $*—N(R_{62})—*'$, a3 may be an integer selected from 1 to 5, $R_{61}$ may each independently be selected from hydrogen, deuterium, —F, —C, —Br, —I, $—SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, $—N(Q_1)(Q_2)$, $—Si(Q_3)(Q_4)(Q_5)$, $—B(Q_6)(Q_7)$, $—P(=O)(Q_8)(Q_9)$, and $P(Q_{41})(Q_{42})(Q_{43})$, $Q_1$ to $Q_9$ and $Q_{41}$ to $Q_{43}$ may each independently be selected from:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, and $—CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group, $R_{62}$ and $R_{63}$ may each independently be selected from:

hydrogen, deuterium, —F, a cyano group, a nitro group, $—SF_5$, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group; and a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group, each substituted with at least one selected from deuterium, —F, $—CD_3$, $—CD_2H$, $—CDH_2$, $—CF_3$, $—CF_2H$, $—CFH_2$, a cyano group, a nitro group, a $C_1$-$C_{60}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group, $R_{62}$ and $R_{63}$ may be optionally connected to each other to form a substituted or unsubstituted $C_5$-$C_{30}$ carbocyclic group or a substituted or unsubstituted $C_2$-$C_{30}$ heterocyclic group, and

* indicates a binding site to M in Formula 1.

For example, $R_{61}$ may be selected from:

hydrogen, deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $—SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —C, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —C, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and $-N(Q_1)(Q_2)$, $-Si(Q_3)(Q_4)(Q_5)$, $-B(Q_6)(Q_7)$, $-P(=O)(Q_8)(Q_9)$, and $P(Q_{41})(Q_{42})(Q_{43})$, wherein $Q_1$ to $Q_9$ and $Q_{41}$ to $Q_{43}$ may each independently be selected from: $-CH_3$, $-CD_3$, $-CD_2H$, $-CDH_2$, $-CH_2CH_3$, $-CH_2CD_3$, $-CH_2CD_2H$, $-CH_2CDH_2$, $-CHDCH_3$, $-CHDCD_2H$, $-CHDCDH_2$, $-CHDCD_3$, $-CD_2CD_3$, $-CD_2CD_2H$, and $-CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments are not limited thereto.

In one or more embodiments, $L_2$ in Formula 1 may be selected from ligands represented by Formulae 12-1 to 12-5, but embodiments of the present disclosure are not limited thereto:

Formula 12-1

$$*-(T_3)_{a3}-P(Q_{41})(Q_{42})(Q_{43})$$

Formula 12-2

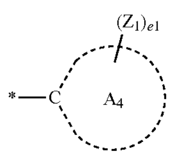

Formula 12-3

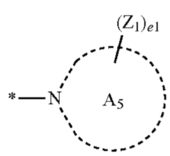

Formula 12-4

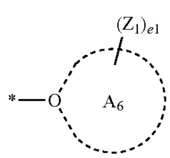

Formula 12-5

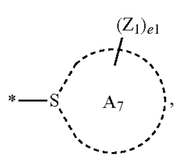

wherein, in Formulae 12-1 to 12-5, $T_3$ may be selected from a single bond, *—O—*', *—S—*', *—C($R_{62}$)($R_{63}$)—*', *—C($R_{62}$)=*, *=C($R_{62}$)—*', *—C($R_{62}$)=C($R_{63}$)—*', *—C(=O)—*', *—C(=S)—*', *—C≡C—*', and *—N($R_{62}$)—*', $R_{62}$ and $R_{63}$ may each independently be selected from hydrogen, deuterium, —F, —C, —Br, —I, $-SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, and a naphthyl group, a3 may be an integer selected from 1 to 5, ring $A_4$ is selected from a cyclopentene ring, a cyclohexene ring, cycloheptene ring, a benzene ring, an indene ring, a naphthalene ring, an azulene ring, a heptalene ring, an indacene ring, an acenaphthylene ring, a fluorene ring, a spiro-bifluorene ring, a benzofluorene ring, a dibenzofluorene ring, a phenalene ring, a phenanthrene ring, an anthracene ring, a fluoranthene ring, a triphenylene ring, a pyrene ring, a chrysene ring, a naphthacene ring, a picene ring, a perylene ring, a pentacene ring, a hexacene ring, a rubicene ring, a coronene ring, an ovalene ring, a pyrrole ring, a thiophene ring, a furan ring, an imidazole ring, a pyrazole ring, a thiazole ring, an isothiazole ring, an oxazole ring, an isoxazole ring, a pyridine ring, a pyrazine ring, a pyrimidine ring, a pyridazine ring, an iso-indole ring, an indole ring, an indazole ring, a purine ring, a quinoline ring, an isoquinoline ring, a benzoquinoline ring, a quinoxaline ring, a quinazoline ring, a cinnoline ring, a naphthyridine ring, a carbazole ring, a phenanthroline ring, a benzimidazole ring, a benzofuran ring, a benzothiophene ring, a benzothiazole ring, an iso-benzothiazole ring, a benzoxazole ring, an isobenzoxazole ring, a triazole ring, a tetrazole ring, an oxadiazole ring, a thiadiazol ring, a triazine ring, a dibenzofuran ring, a dibenzothiophene ring, a benzocarbazole ring, a dibenzocarbazole ring, an imidazopyridine ring, and an imidazopyrimidine ring, ring $A_5$ is selected from a pyrrole ring, an imidazole ring, a pyrazole ring, a thiazole ring, an isothiazole ring, an oxazole ring, an isoxazole ring, a pyridine ring, a pyrazine ring, a pyrimidine ring, a pyridazine ring, an iso-indole ring, an indole ring, an indazole ring, a purine ring, a quinoline ring, an isoquinoline ring, a benzoquinoline ring, a quinoxaline ring, a quinazoline ring, a cinnoline ring, a naphthyridine ring, a carbazole ring, a phenanthroline ring, a benzimidazole ring, a benzofuran ring, a benzothiazole ring, an iso-benzothiazole ring, a benzoxazole ring, an isobenzoxazole ring, a triazole ring, a tetrazole ring, an oxadiazole ring, a thiadiazol ring, a triazine ring, a benzocarbazole ring, a dibenzocarbazole ring, an imidazopyridine ring, and an imidazopyrimidine ring, ring $A_6$ is selected from a furan ring, an oxazole ring, an isoxazole ring, a benzofuran ring, a benzoxazole ring, an isobenzoxazole ring, an oxadiazole ring, and a dibenzofuran ring, ring $A_7$ is selected from a thiophene ring, a thiazole ring, an isothiazole ring, a benzothiophene ring, a benzothiazole ring, an iso-benzothiazole ring, a thiadiazol ring, and a dibenzothiophene ring, $Z_1$ may each independently be selected from:

hydrogen, deuterium, —F, a cyano group, a nitro group, $-SF_5$, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group;

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group, each substituted with at least one selected from deuterium, —F, $—CD_3$, $—CD_2H$, $—CDH_2$, $—CF_3$, $—CF_2H$, $—CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group; and $—N(Q_{31})(Q_{32})$, $—Si(Q_{33})(Q_{34})(Q_{35})$, $—B(Q_{36})(Q_{37})$, and $—P(=O)(Q_{38})(Q_{39})$, wherein $Q_{31}$ to $Q_{39}$ may each independently be selected from:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, and $—CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group, neighboring two or more selected from a plurality of groups $Z_1$ may be optionally connected to form a substituted or unsubstituted $C_5$-$C_{30}$ carbocyclic group or a substituted or unsubstituted $C_2$-$C_{30}$ heterocyclic group, e1 may be an integer selected from 0 to 8, and

* indicates a binding site to M in Formula 1.

For example, $L_2$ in Formula 1 may be selected from ligands represented by Formulae 13-1 to 13-47 and 14-1 to 14-28, but embodiments of the present disclosure are not limited thereto:

Formula 13-1

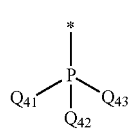

-continued

Formula 13-2

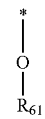

Formula 13-3

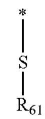

Formula 13-4

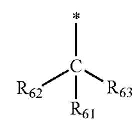

Formula 13-5

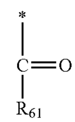

Formula 13-6

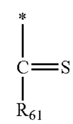

Formula 13-7

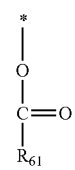

Formula 13-8

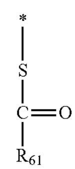

Formula 13-9

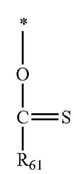

Formula 13-10

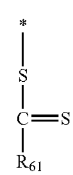

Formula 13-11

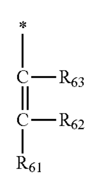

-continued
Formula 13-12
Formula 13-13
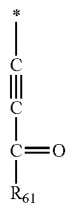
Formula 13-14
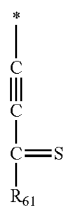
Formula 13-15
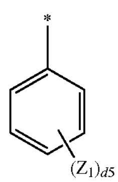
Formula 13-16
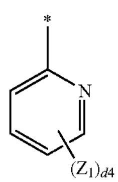
Formula 13-17
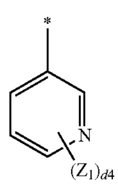
Formula 13-18
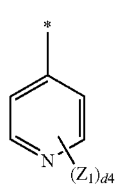
Formula 13-19
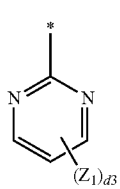
-continued
Formula 13-20
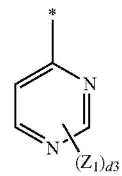
Formula 13-21
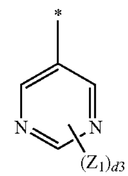
Formula 13-22
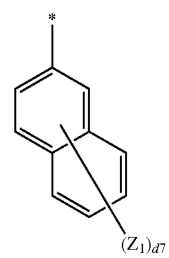
Formula 13-23
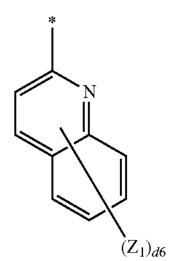
Formula 13-24
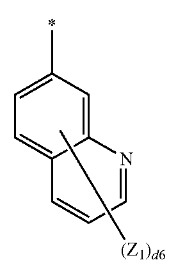
Formula 13-25
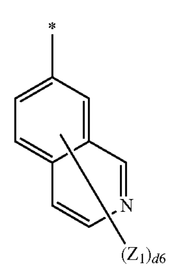

-continued
Formula 13-26
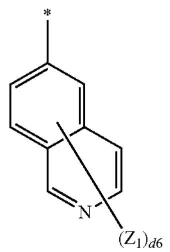
Formula 13-27
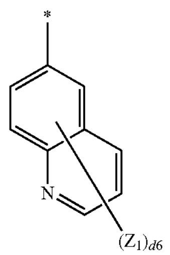
Formula 13-28
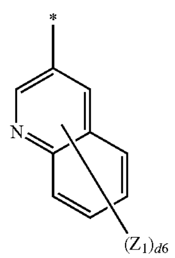
Formula 13-29
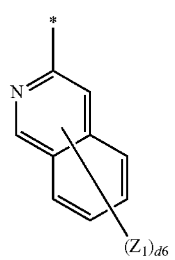
Formula 13-30
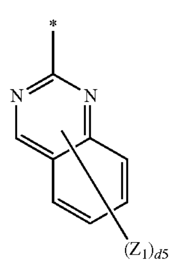
Formula 13-31
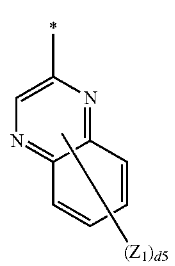
-continued
Formula 13-32
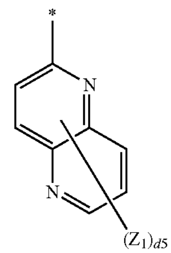
Formula 13-33
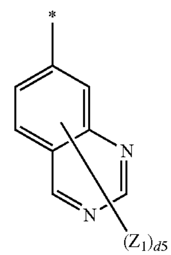
Formula 13-34
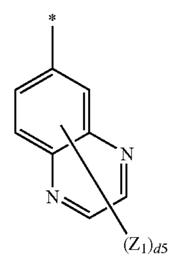
Formula 13-35
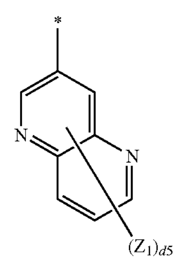
Formula 13-36
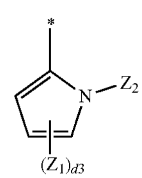
Formula 13-37
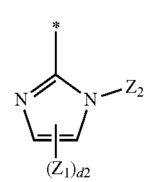
Formula 13-38
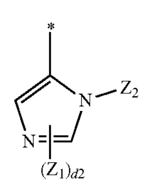

Formula 13-39
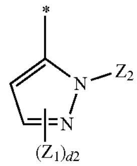
Formula 13-40
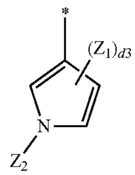
Formula 13-41
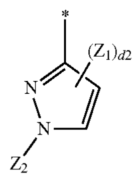
Formula 13-42
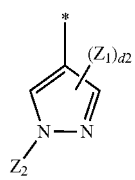
Formula 13-43
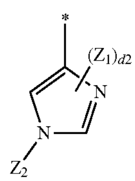
Formula 13-44
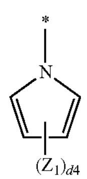
Formula 13-45
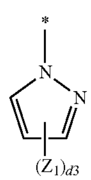
Formula 13-46
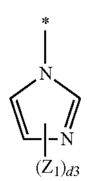
Formula 13-47
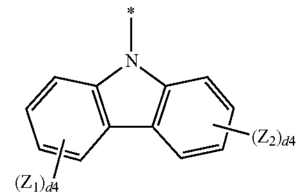
Formula 14-1
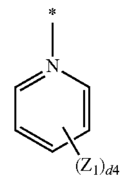
Formula 14-2
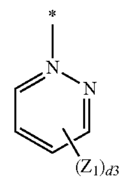
Formula 14-3
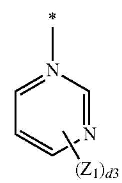
Formula 14-4
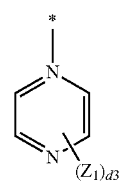
Formula 14-5
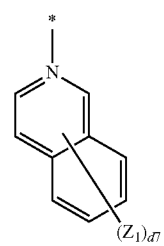
Formula 14-6
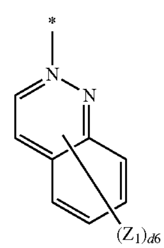

-continued
Formula 14-7
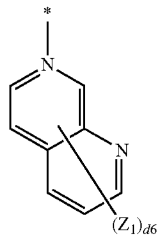
Formula 14-8
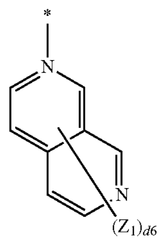
Formula 14-9
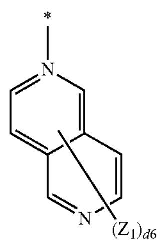
Formula 14-10
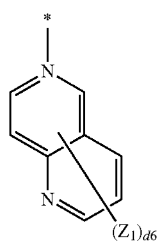
Formula 14-11
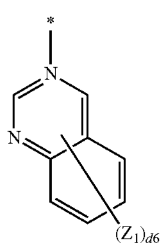
Formula 14-12
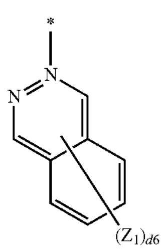
-continued
Formula 14-13
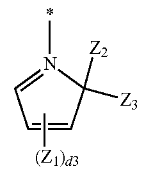
Formula 14-14
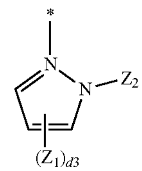
Formula 14-15
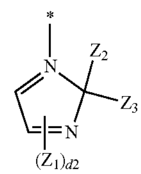
Formula 14-16
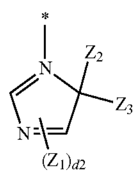
Formula 14-17
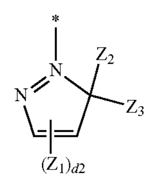
Formula 14-18
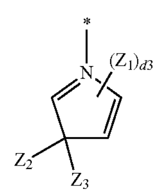
Formula 14-19
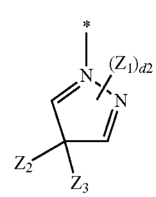
Formula 14-20
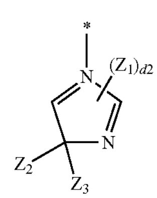

-continued

Formula 14-21

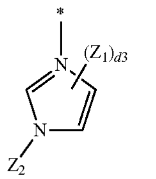

Formula 14-22

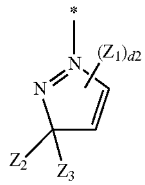

Formula 14-23

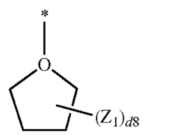

Formula 14-24

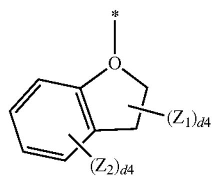

Formula 14-25

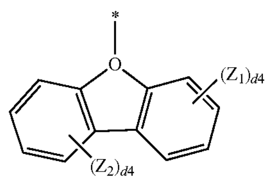

Formula 14-26

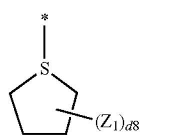

Formula 14-27

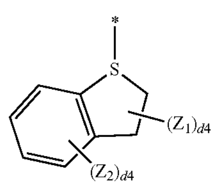

Formula 14-28

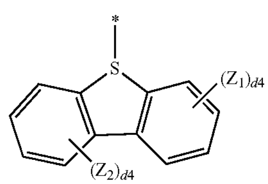

In Formulae 13-1 to 13-47 and 14-1 to 14-28, $R_{61}$ may be selected from:

hydrogen, deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —C, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —C, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —N($Q_1$)($Q_2$), —Si($Q_3$)($Q_4$)($Q_5$), —B($Q_6$)($Q_7$), —P(═O)($Q_8$)($Q_9$), and P($Q_{41}$)($Q_{42}$)($Q_{43}$), $Z_1$ to $Z_3$ may each independently be selected from:

hydrogen, deuterium, —F, a cyano group, a nitro group, —$SF_5$, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group;

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group, each substituted with at least one selected from deuterium, —F, —$CD_3$, —$CD_2H$, —$CDH_2$, —$CF_3$, —$CF_2H$, —$CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group; and —N($Q_{31}$)($Q_{32}$), —Si($Q_{33}$)($Q_{34}$)($Q_{35}$), —B($Q_{36}$)($Q_{37}$), and —P(═O)($Q_{38}$)($Q_{39}$), wherein $Q_1$ to $Q_9$, $Q_{31}$ to $Q_{39}$, and $Q_{41}$ to $Q_{43}$ may each independently be selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group, d2 may be 1 or 2, d3 may be an integer selected from 1 to 3, d4 may be an integer selected from 1 to 4, d5 may be an integer selected from 1 to 5, d6 may be an integer selected from 1 to 6, d7 may be an integer selected from 1 to 7, d8 may be an integer selected from 1 to 8, and

* indicates a binding site to M in Formula 1.

The organometallic compound represented by Formula 1 may be one selected from Compounds 1 to 142, but embodiments of the present disclosure are not limited thereto:

1

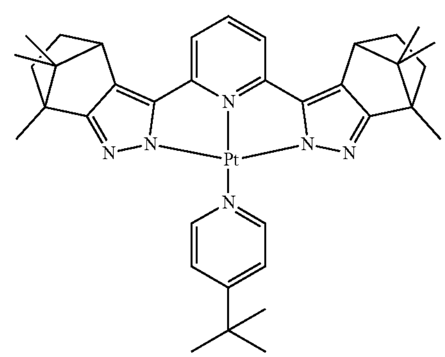

2

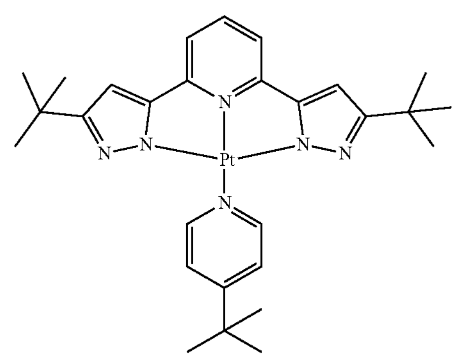

-continued
3
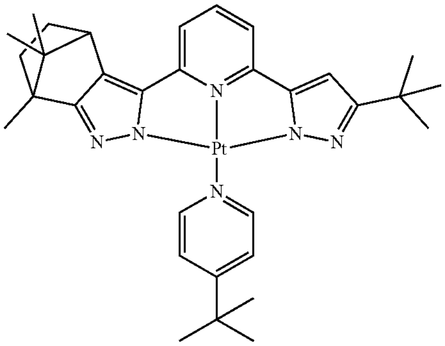
4
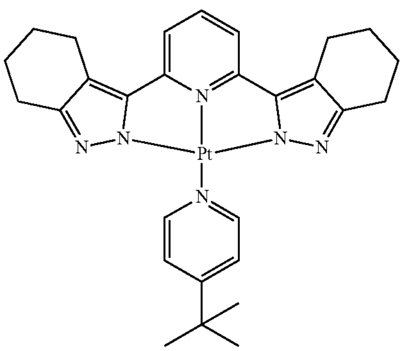
5
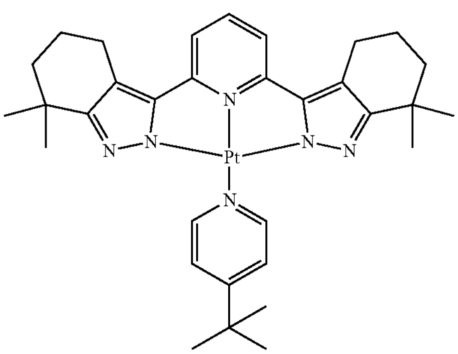
6
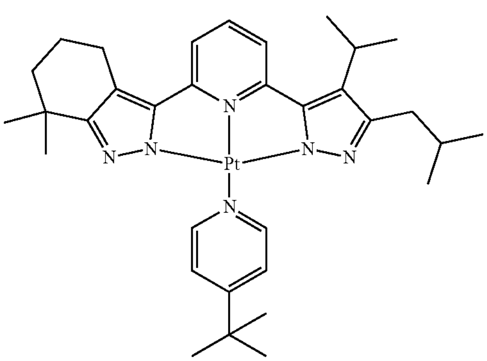
-continued
7
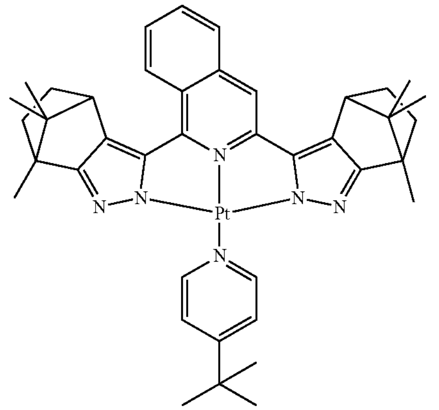
8
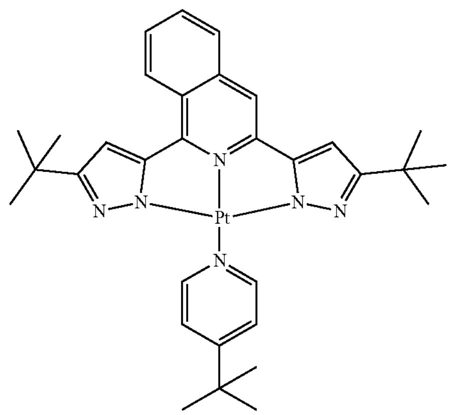
10
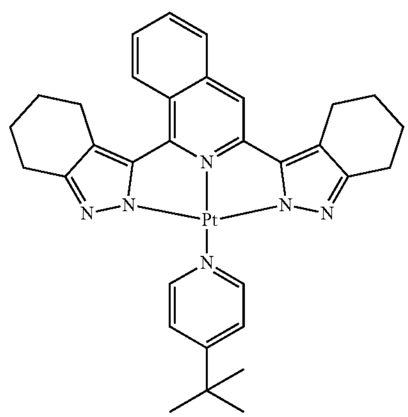
11
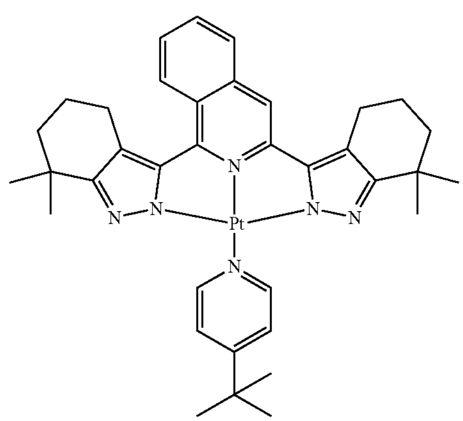

-continued
12
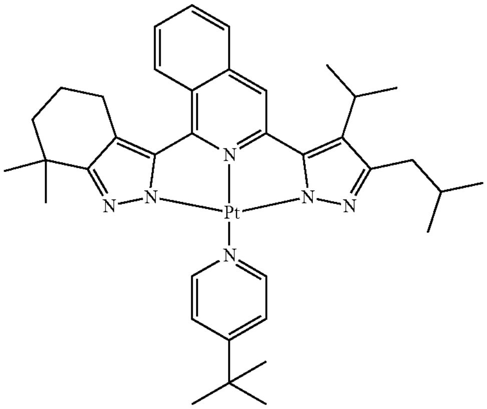
13
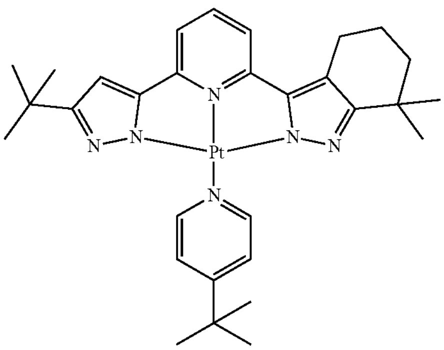
14
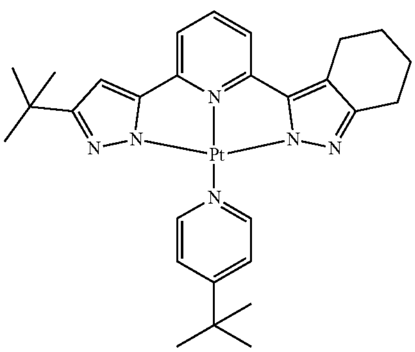
15
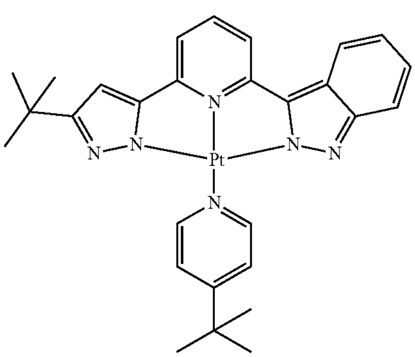
-continued
16
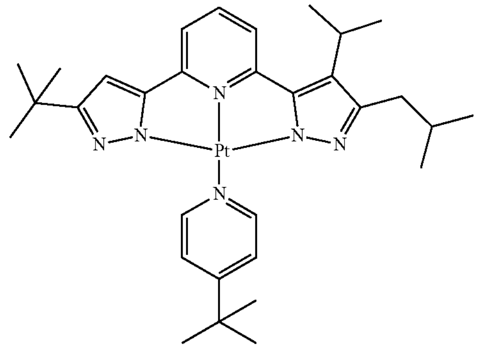
17
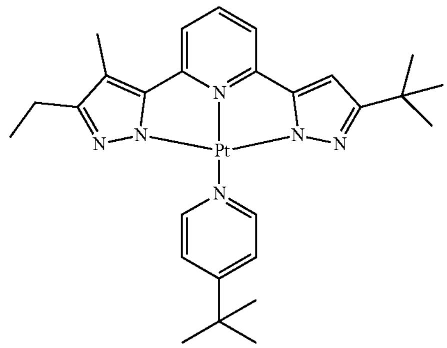
18
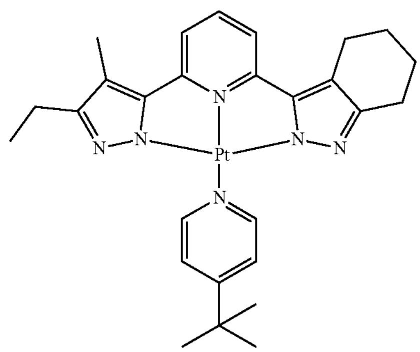
19
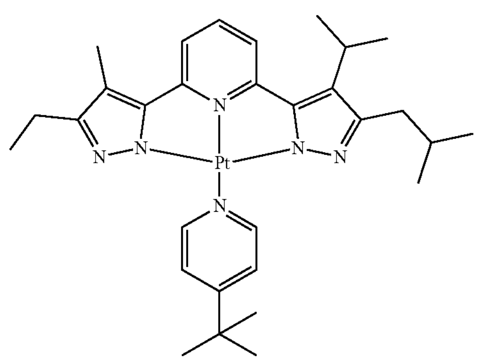

20
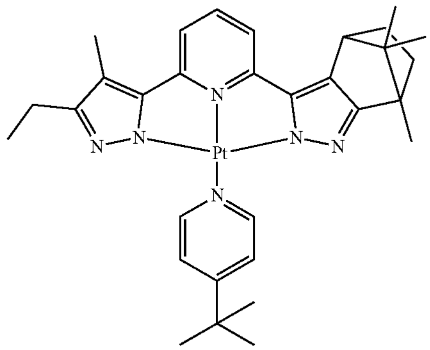
21
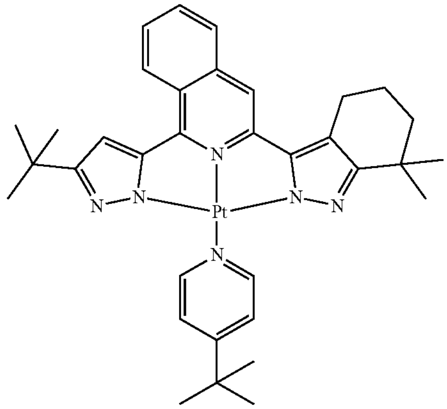
22
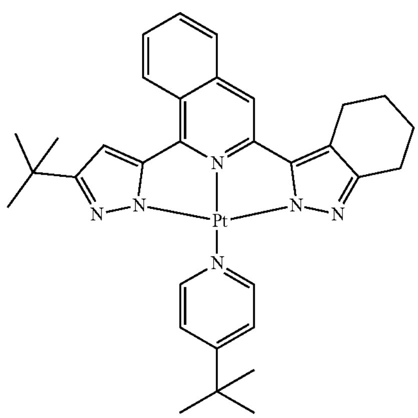
23
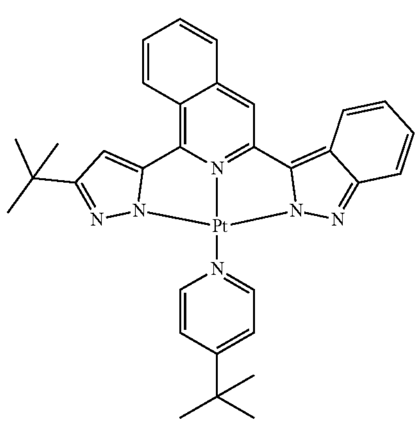
24
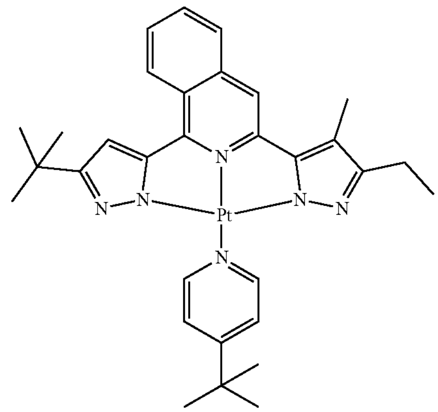
25
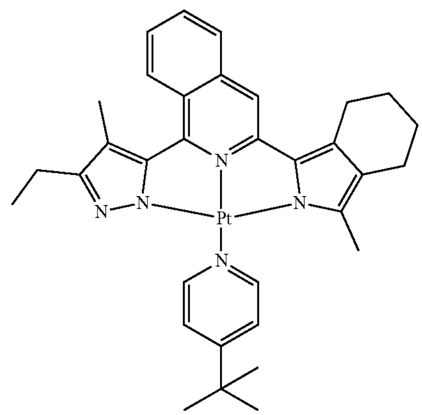
26
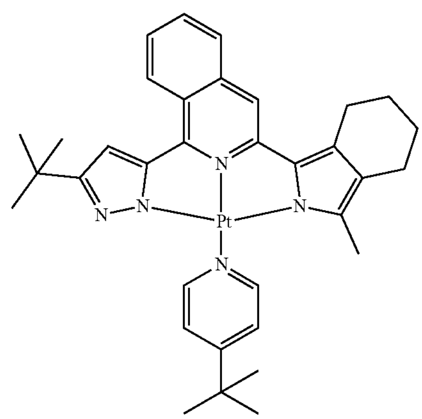
27
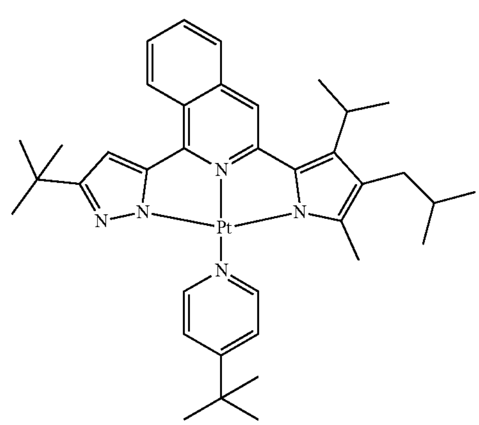

-continued
28
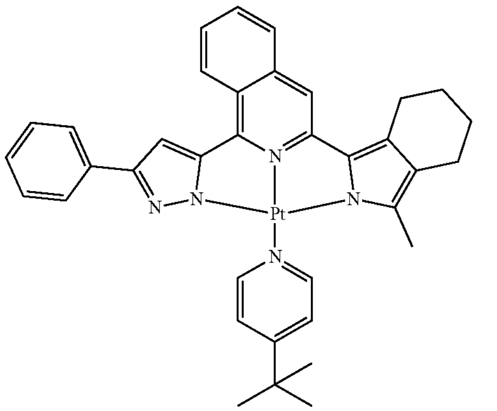
29
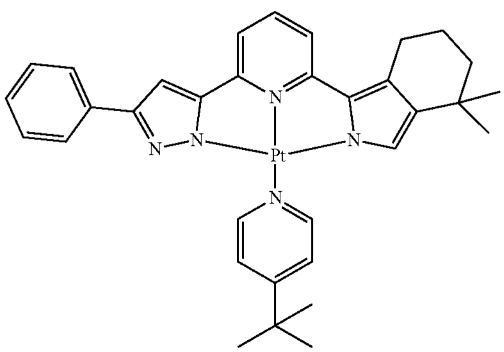
30
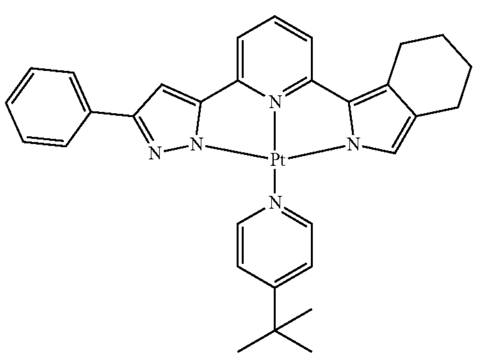
31
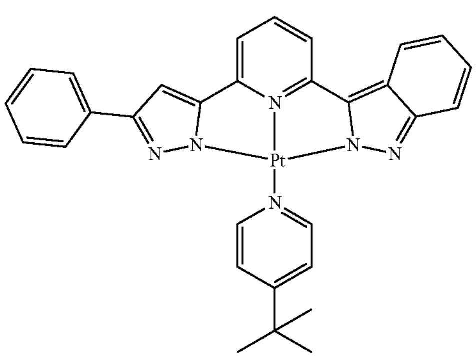
-continued
32
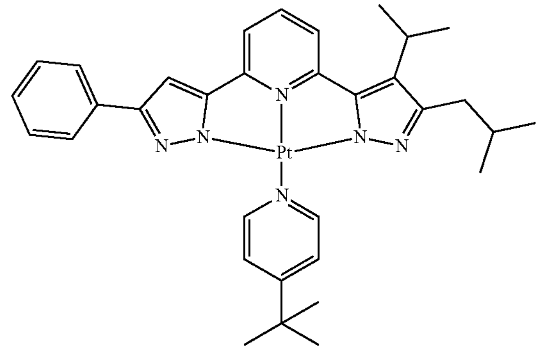
33
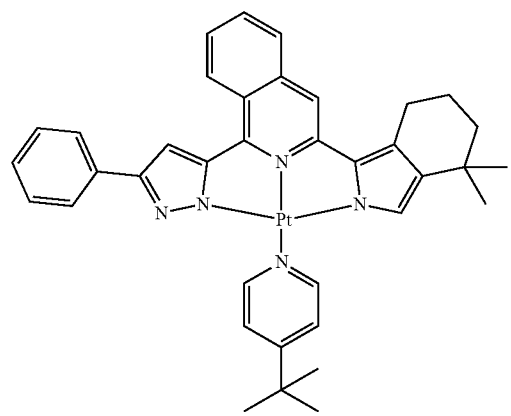
34
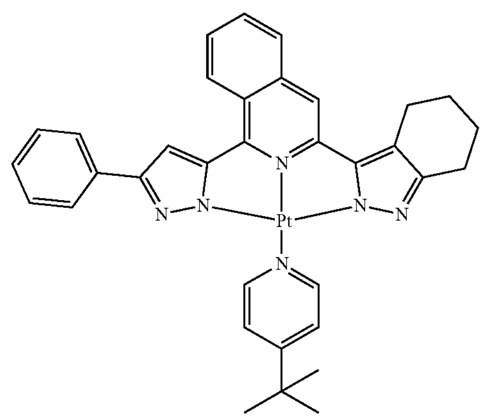
35
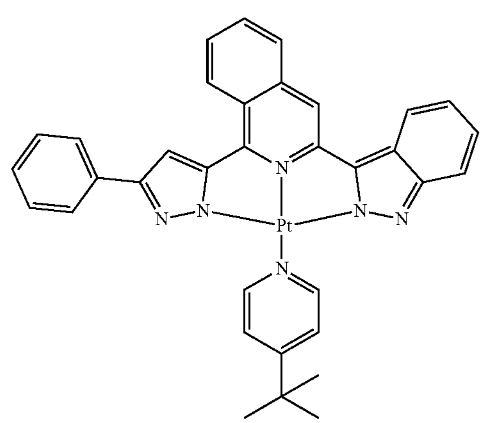

80
-continued
36
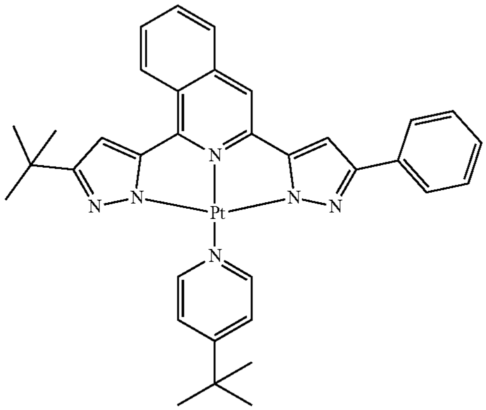
37
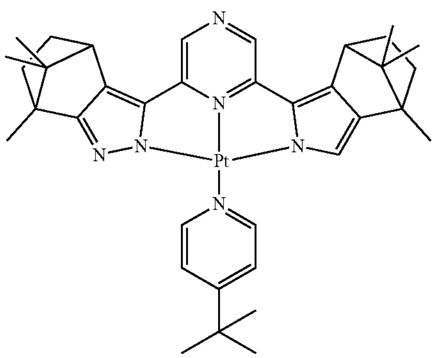
38
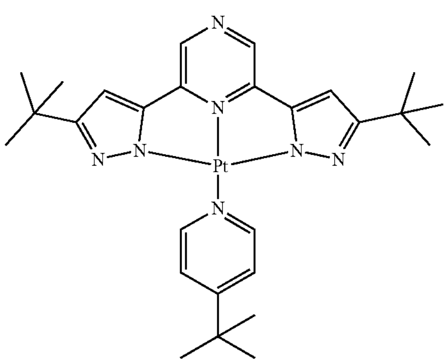
39
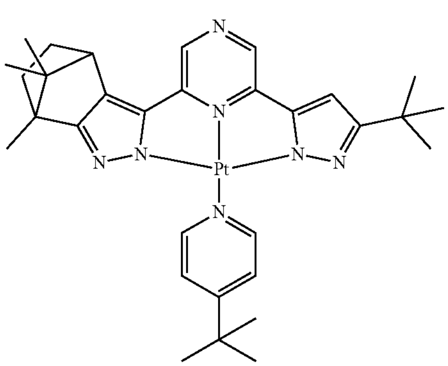
40
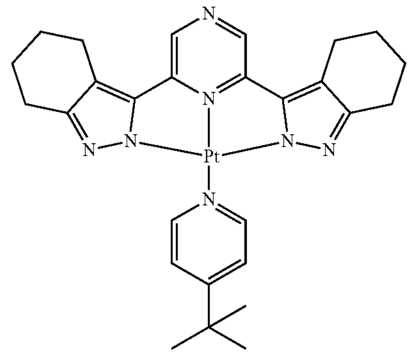
41
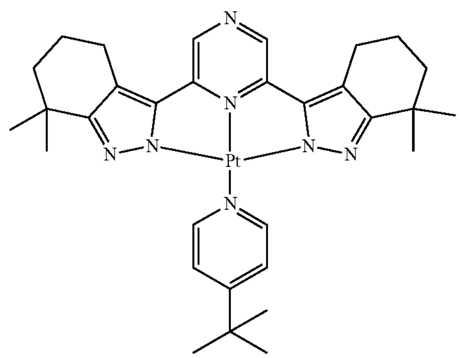
42
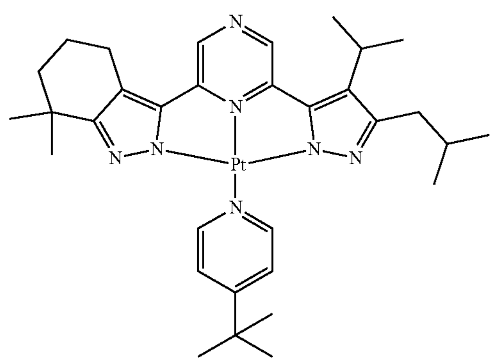
43
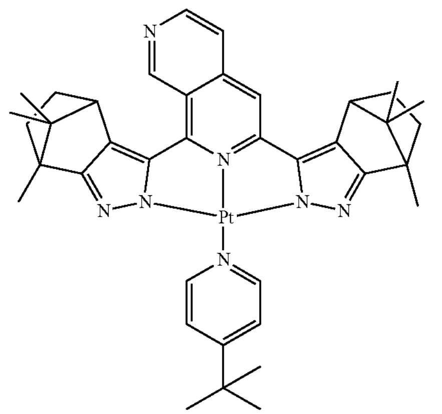

-continued
44
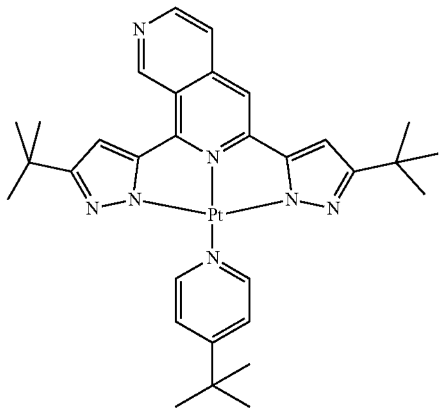
45
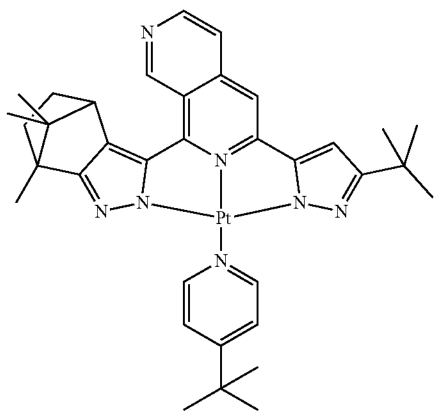
46
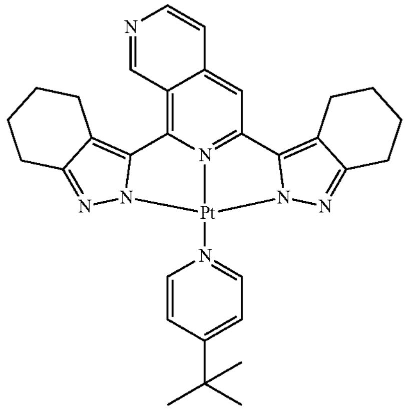
47
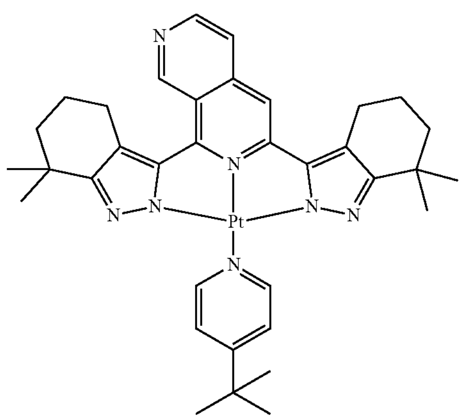
-continued
48
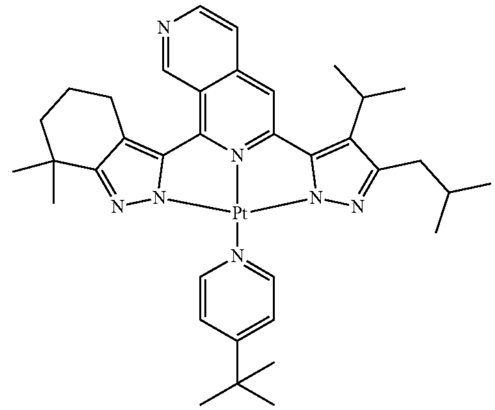
49
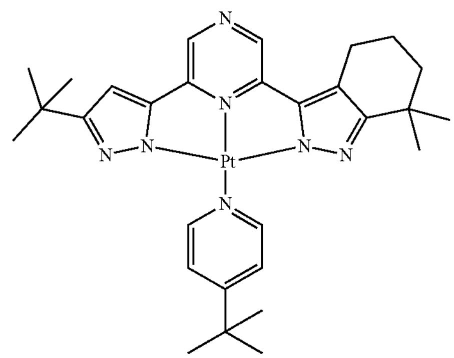
50
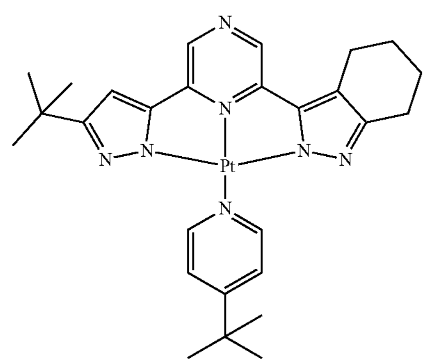
51
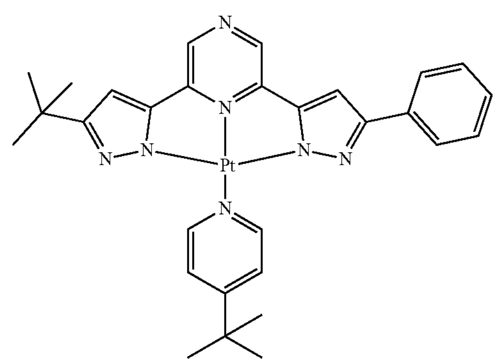

-continued
52
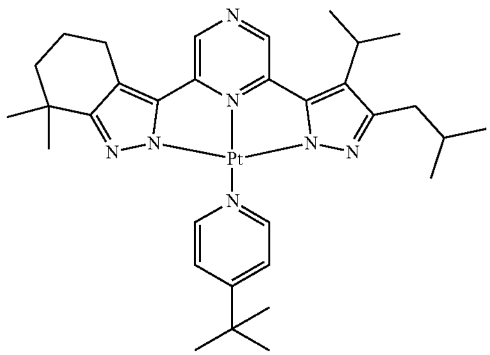
53
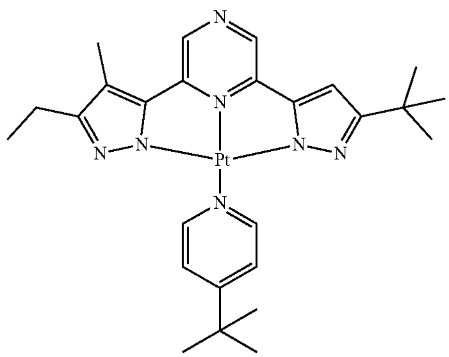
54
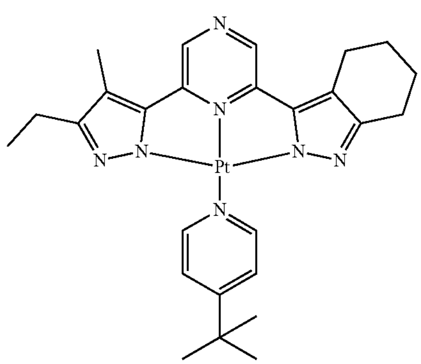
55
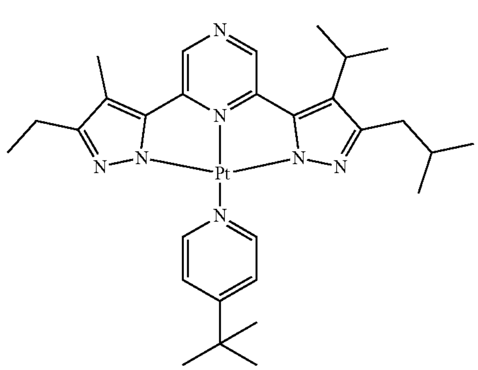
-continued
56
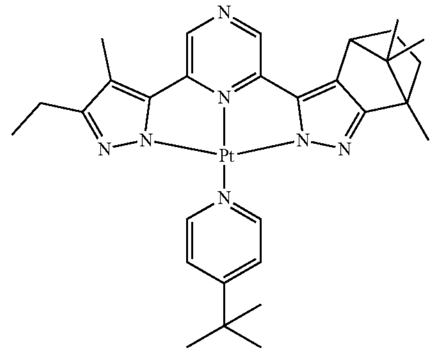
57
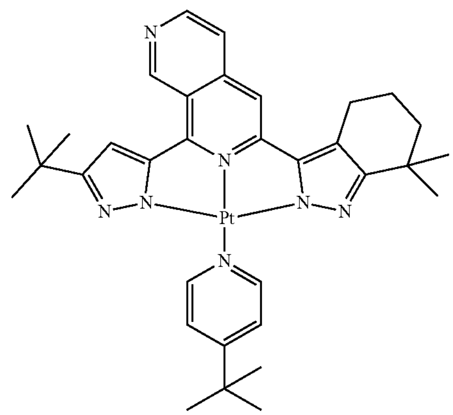
58
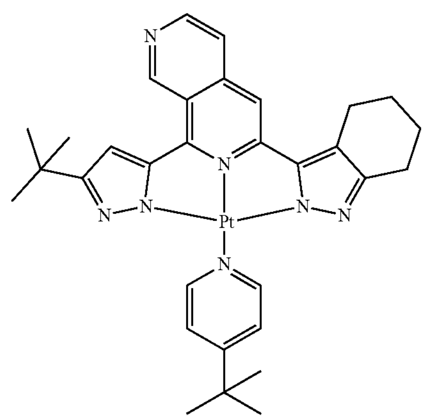
59
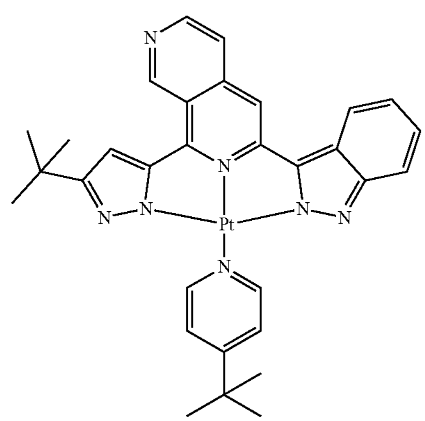

-continued
60
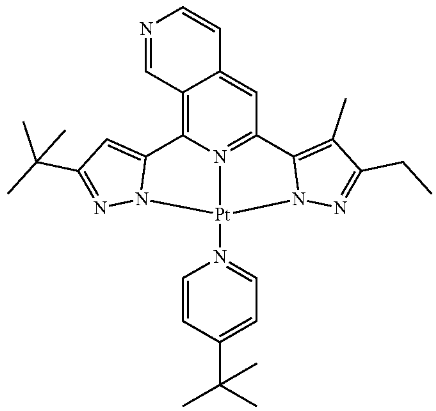
61
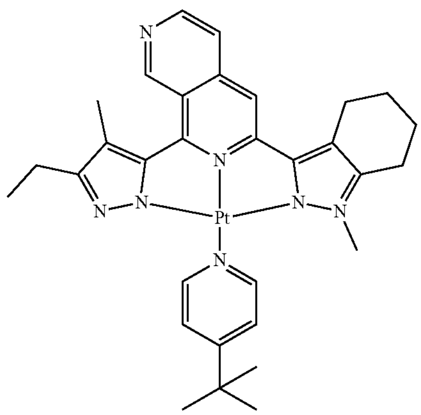
62
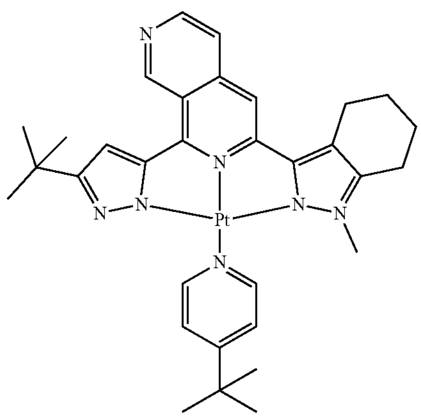
63
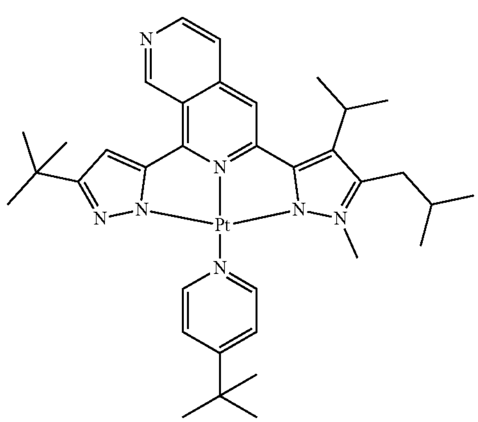
-continued
64
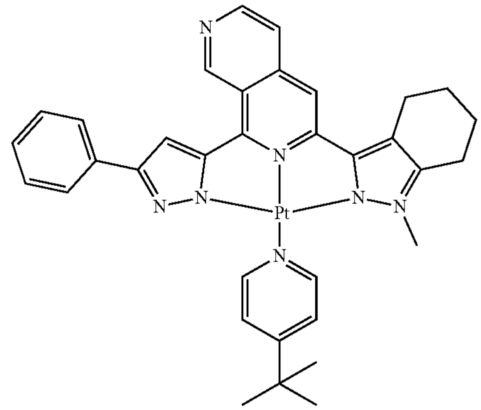
65
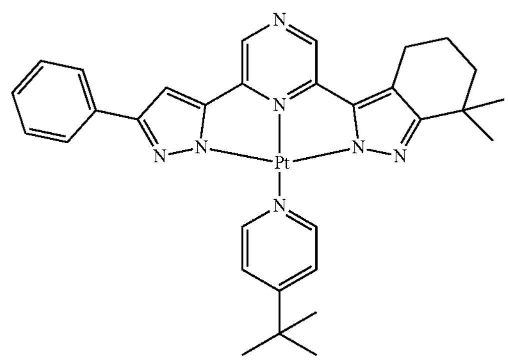
66
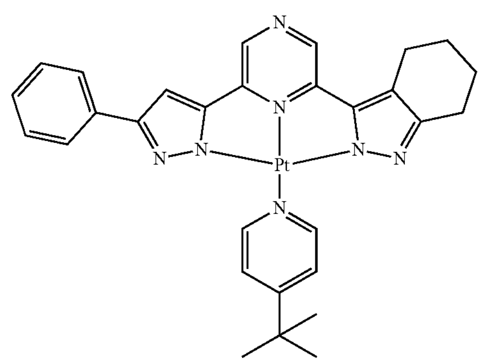
67
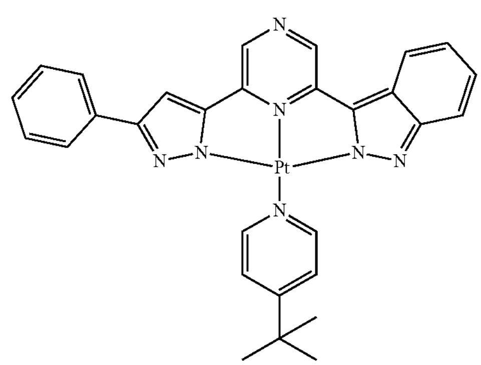

-continued
68
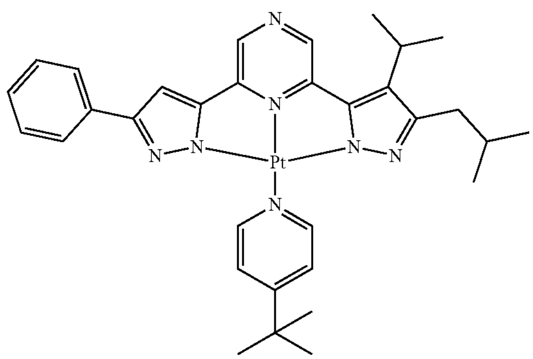
69
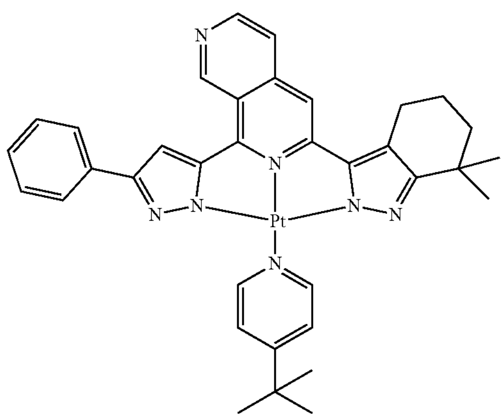
70
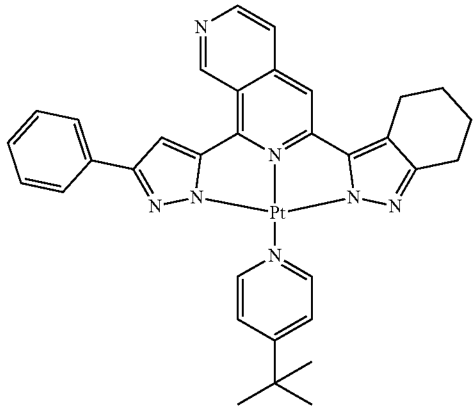
71
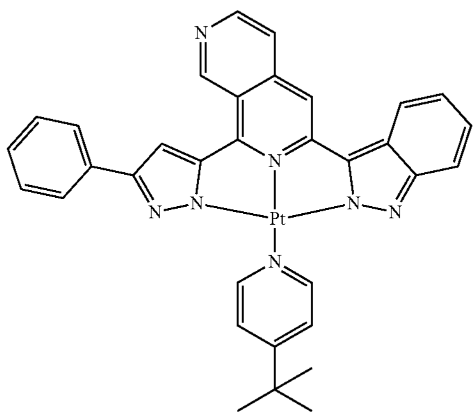
-continued
72
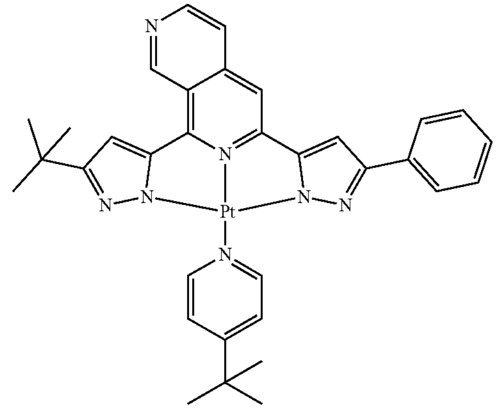
73
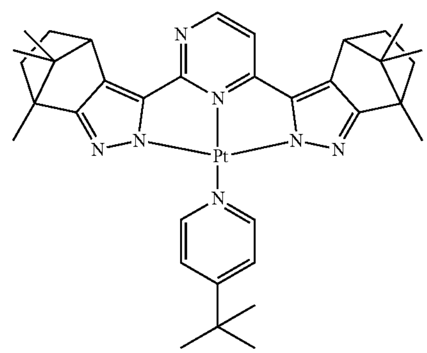
74
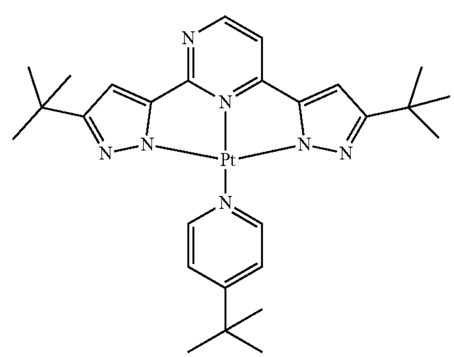
75
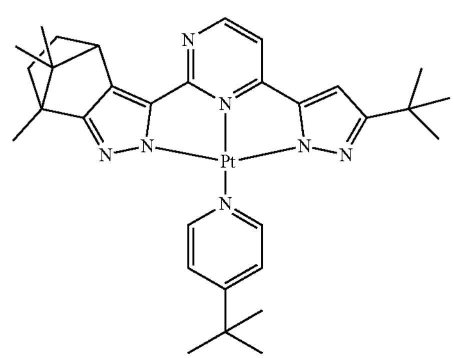

-continued
76
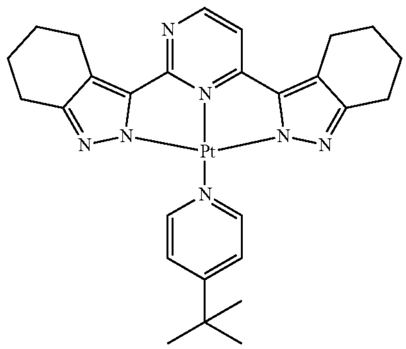
77
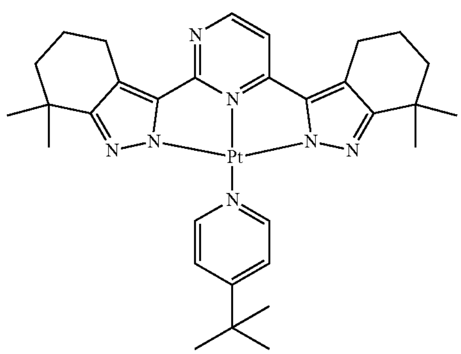
78
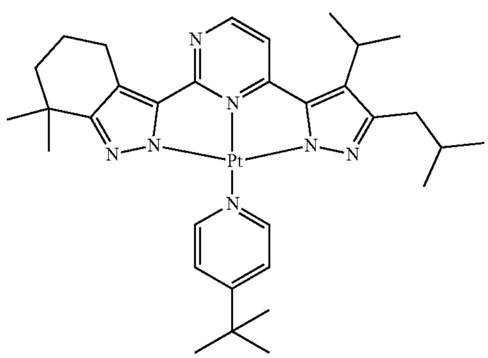
79
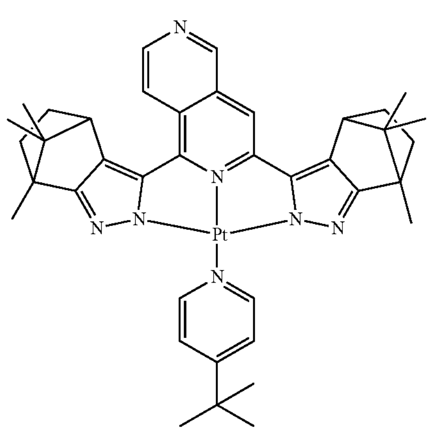
-continued
80
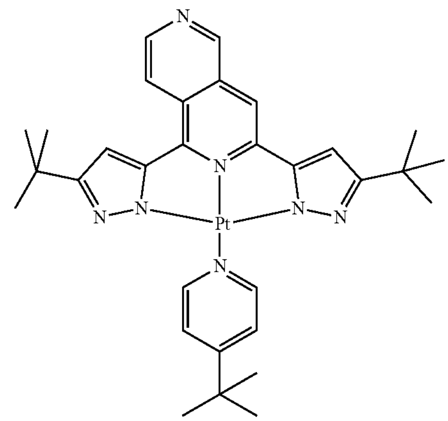
81
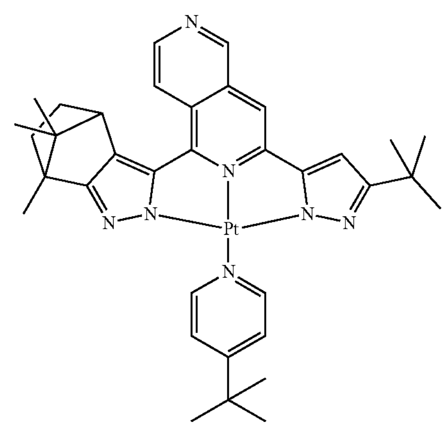
82
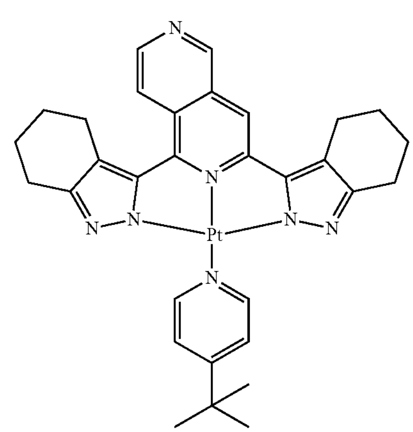

-continued
83
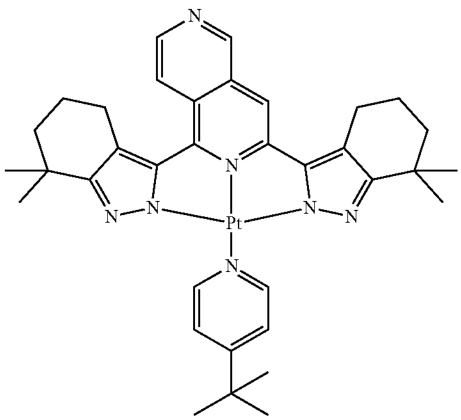
84
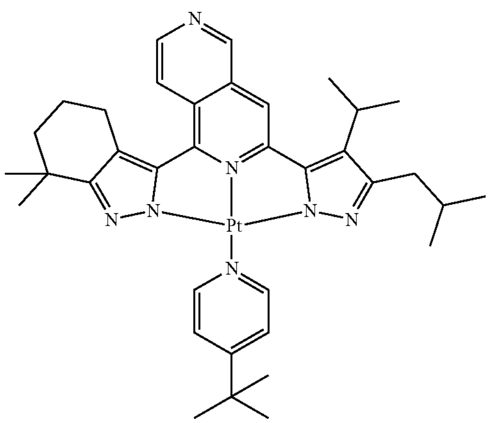
85
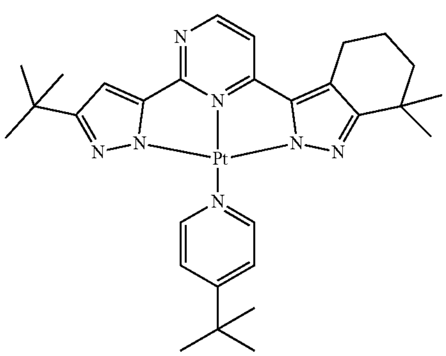
86
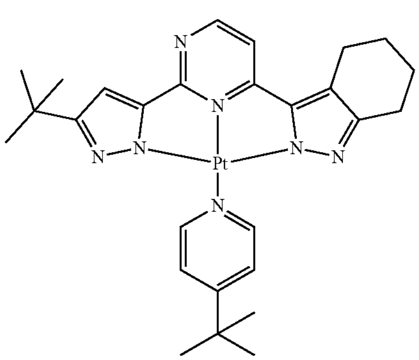
-continued
87
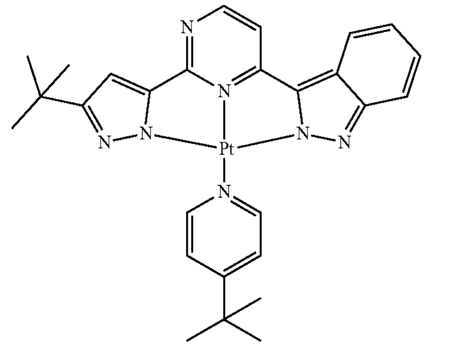
88
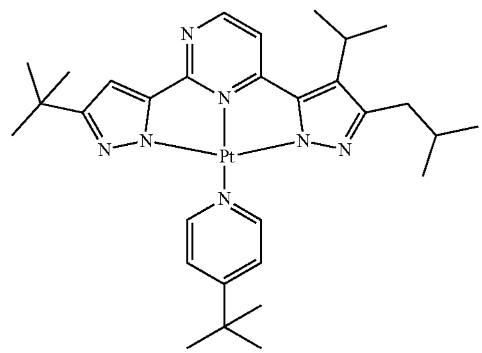
89
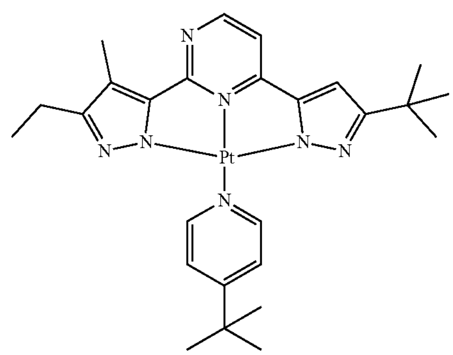
90
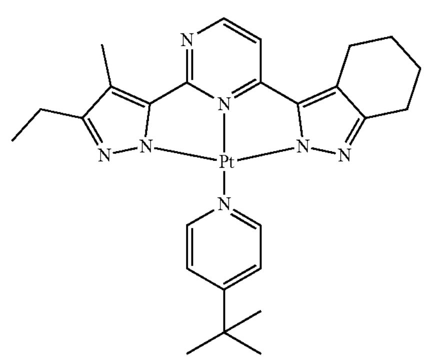

-continued
91
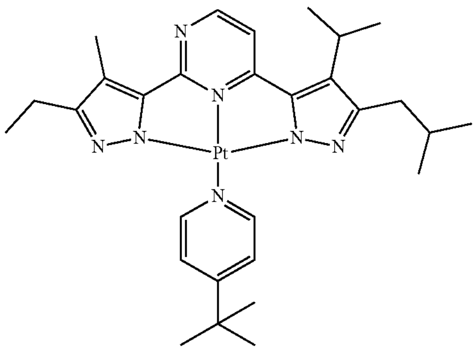
92
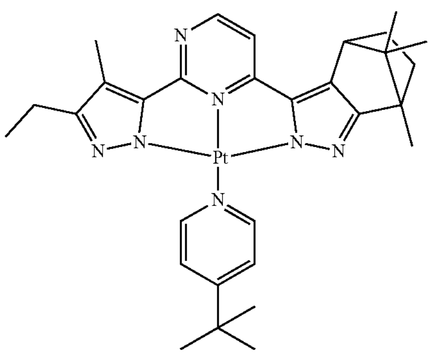
93
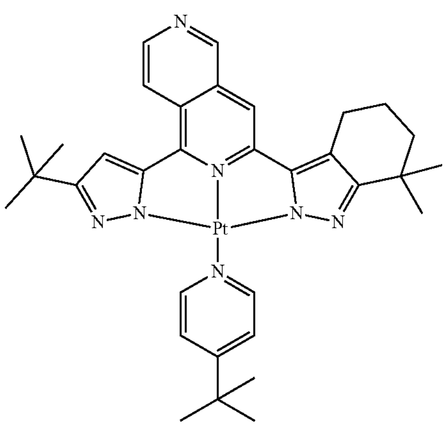
94
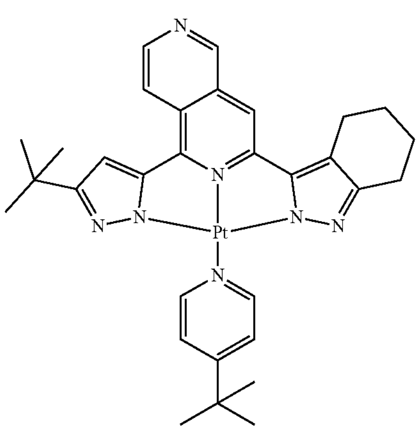
-continued
95
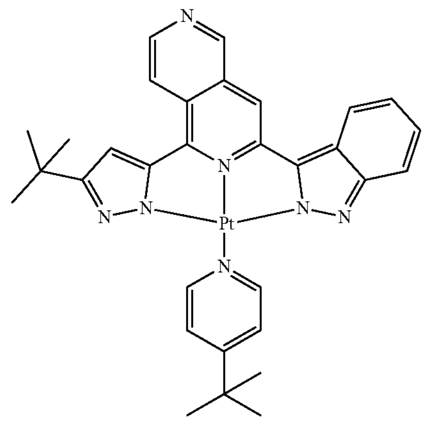
96
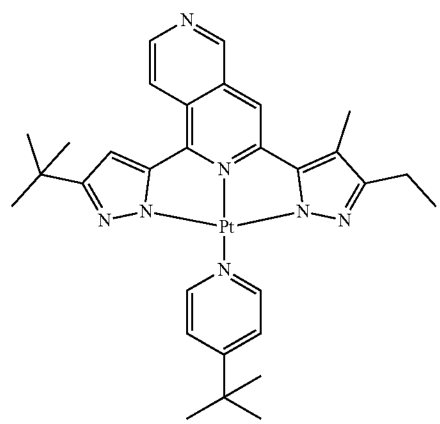
97
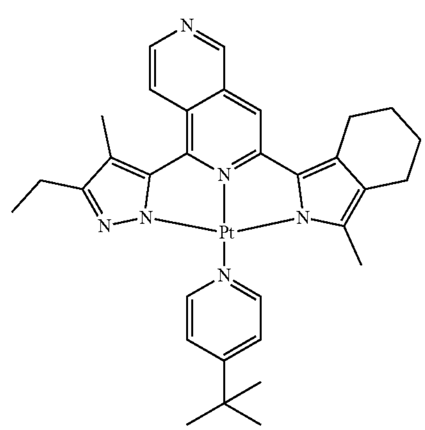

98
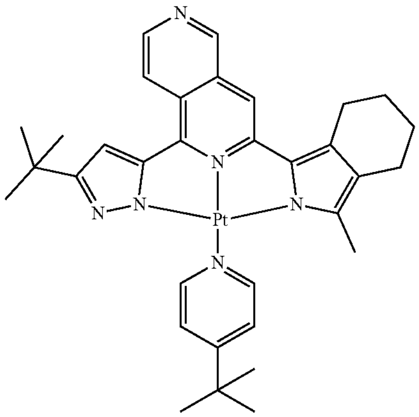
99
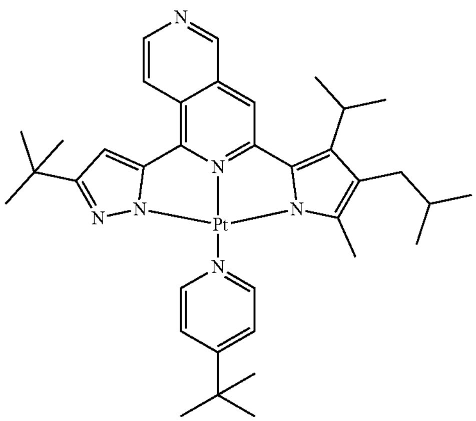
100
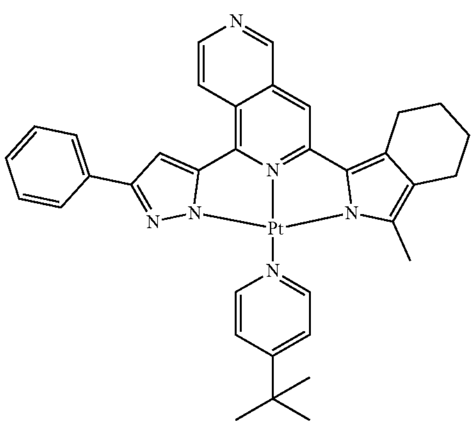
101
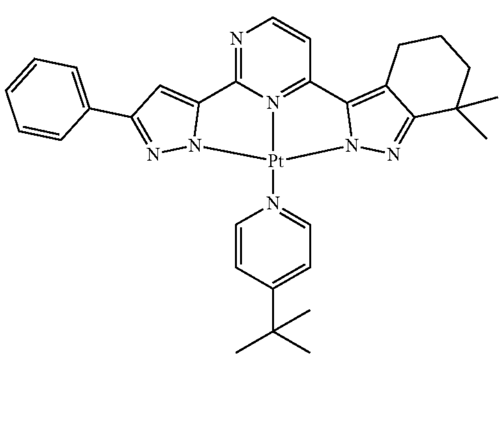
102
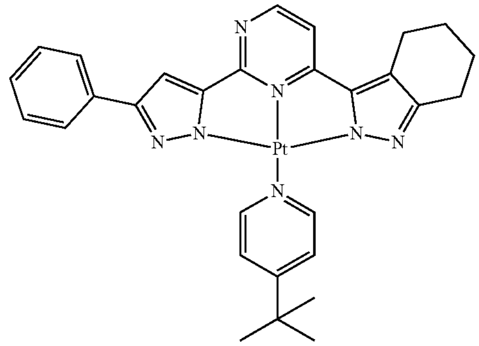
103
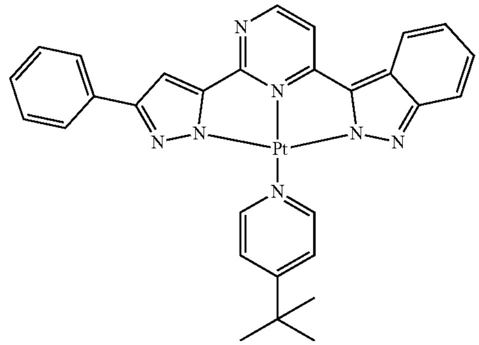
104
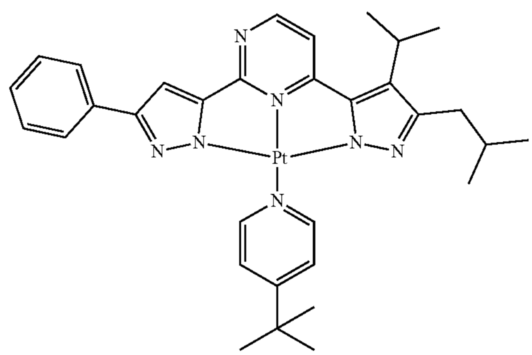
105
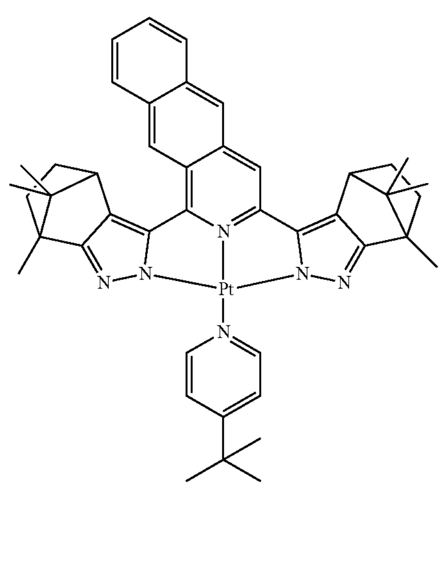

-continued
106
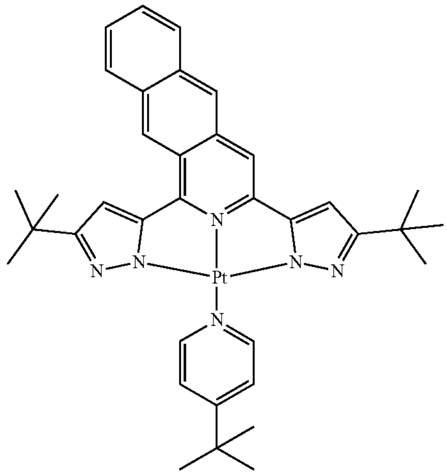
107
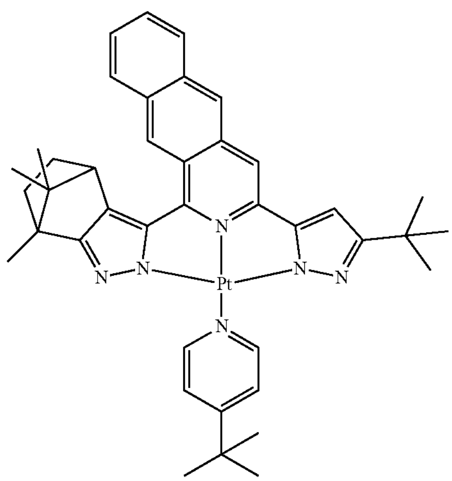
108
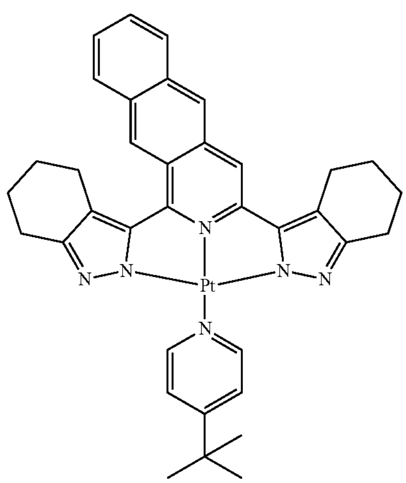
-continued
109
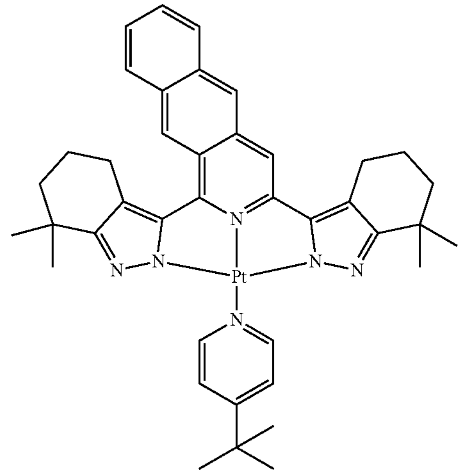
110
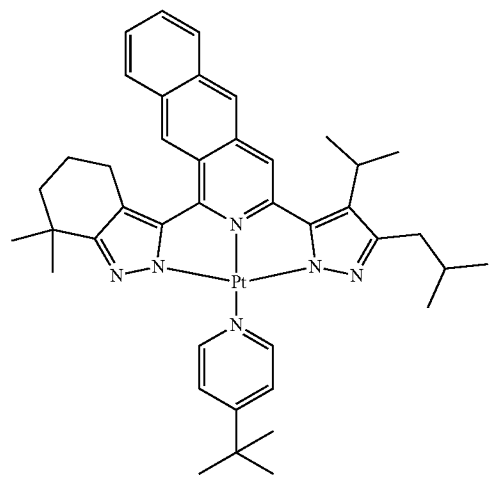
111
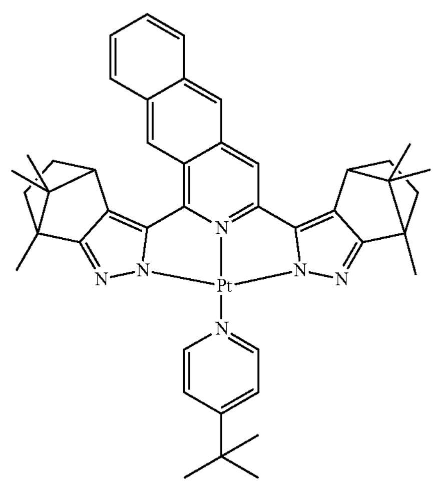

-continued
112
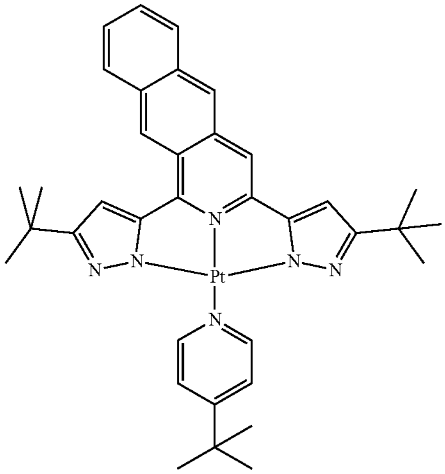
113
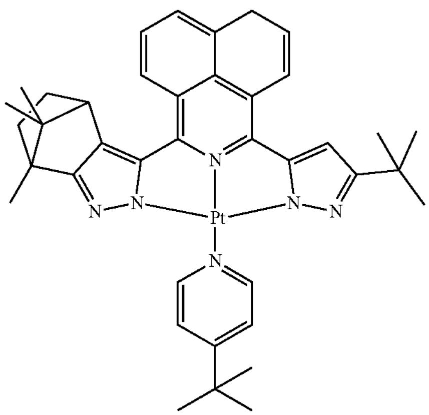
114
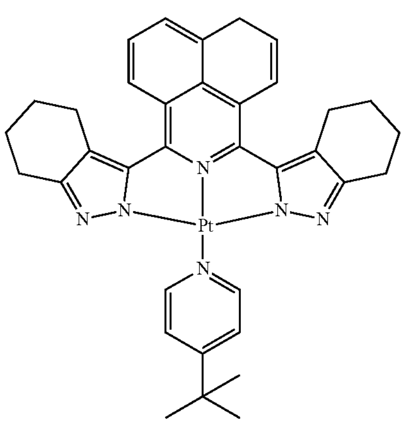
-continued
115
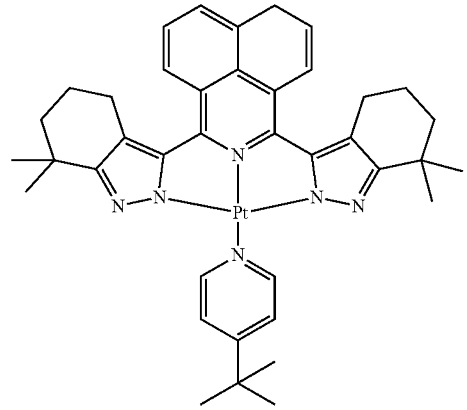
116
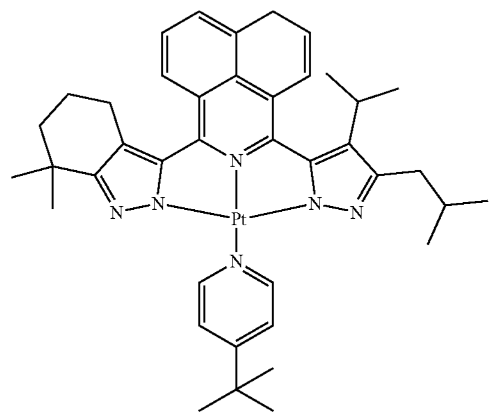
117
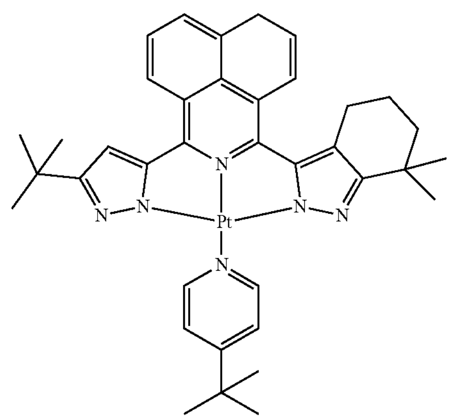
118
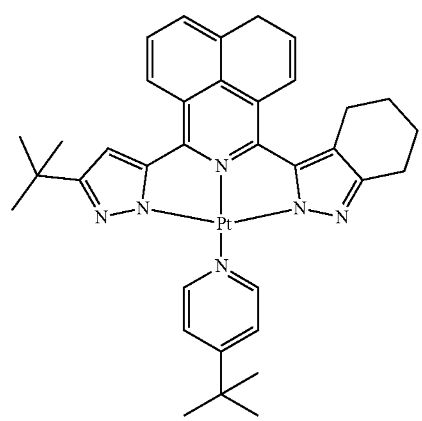

-continued
119
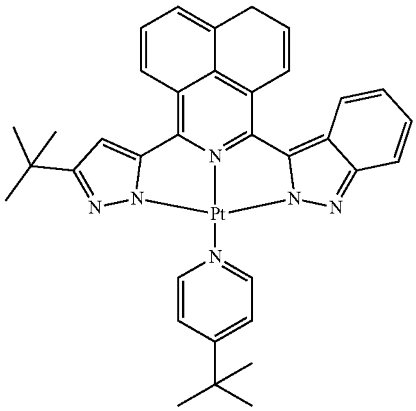
120
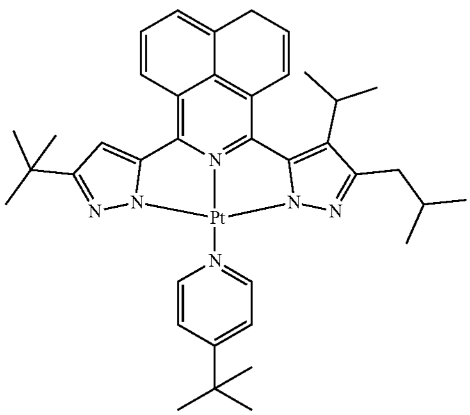
121
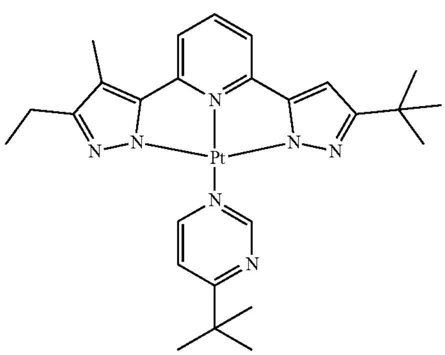
122
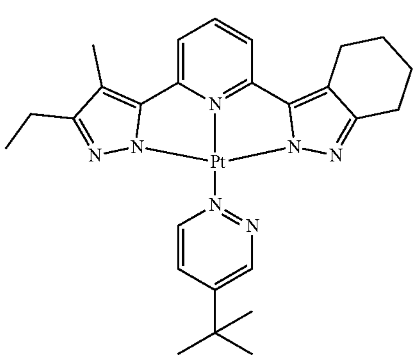
123
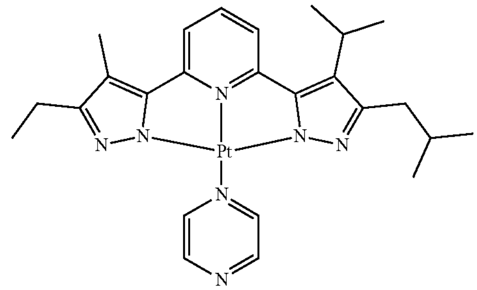
124
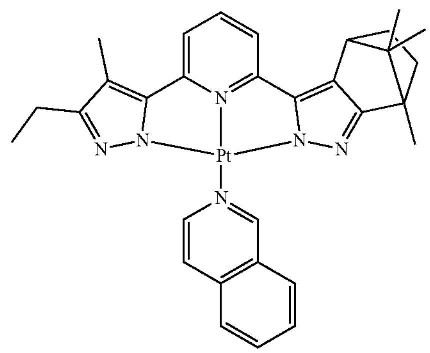
125
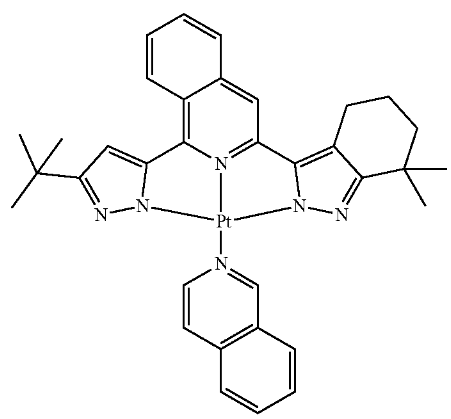
126
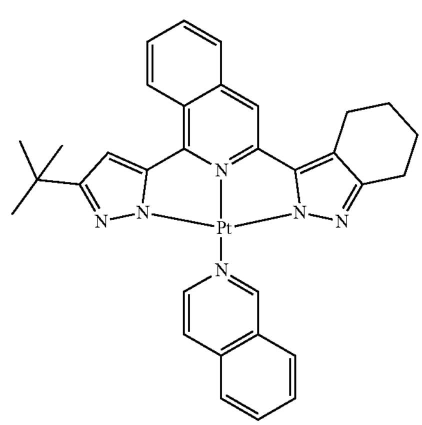

-continued
127
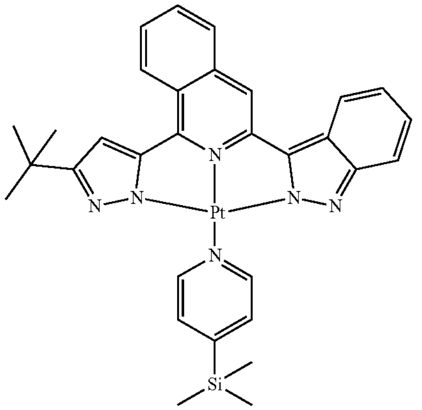
128
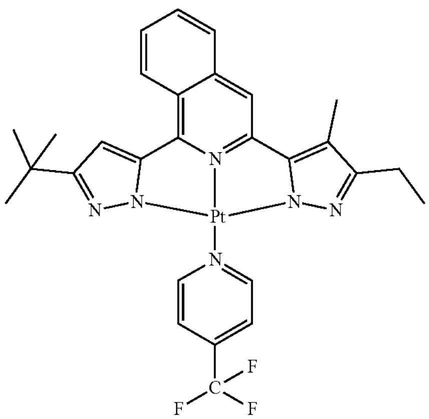
129
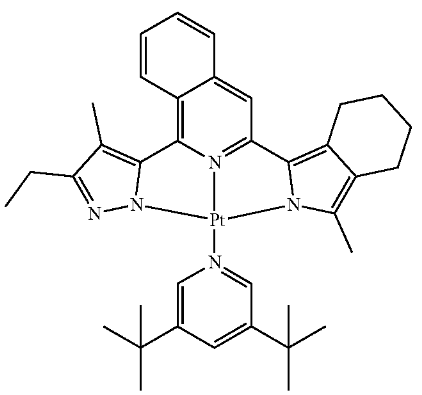
130
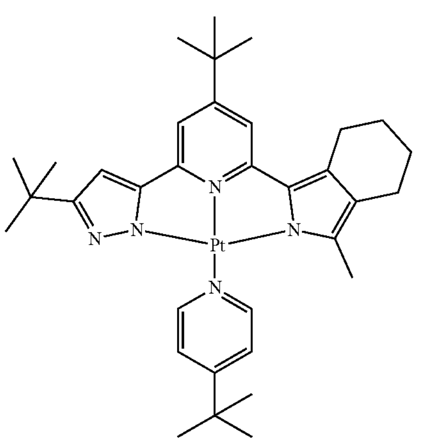
-continued
131
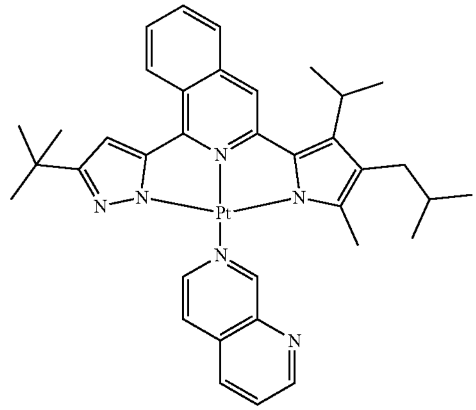
132
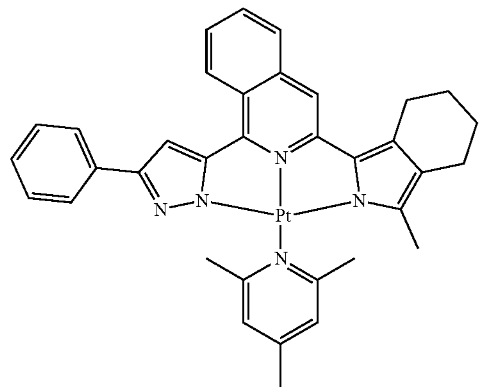
133
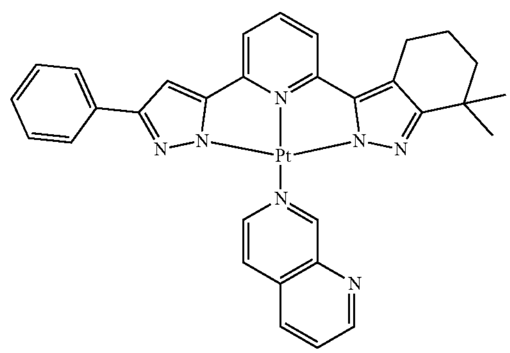
134
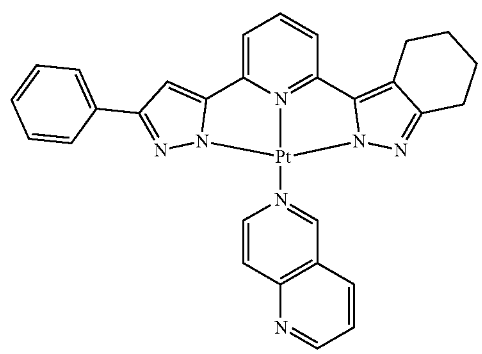

-continued
135
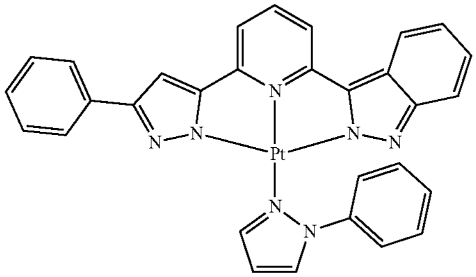
136
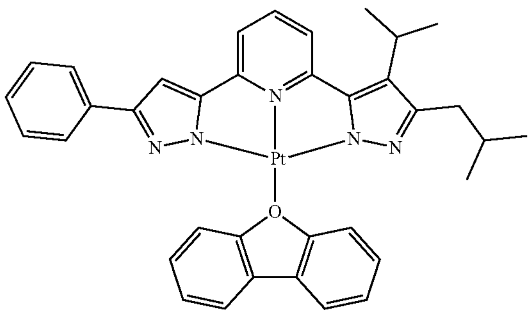
137
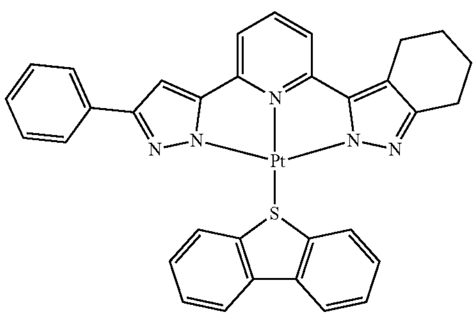
138
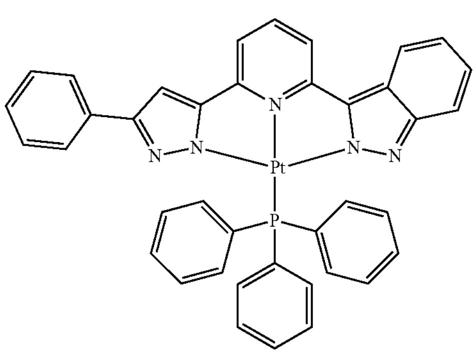
-continued
139
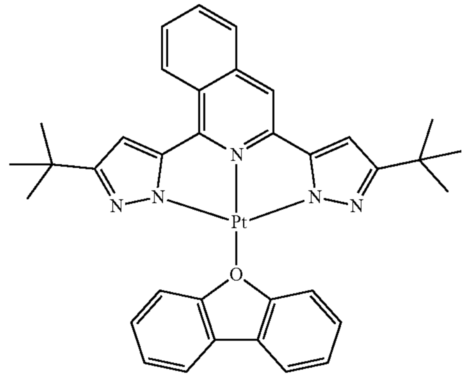
140
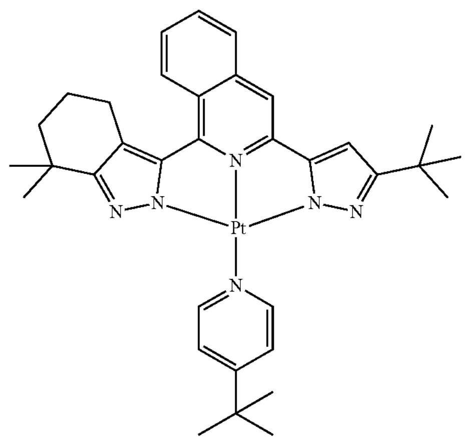
141
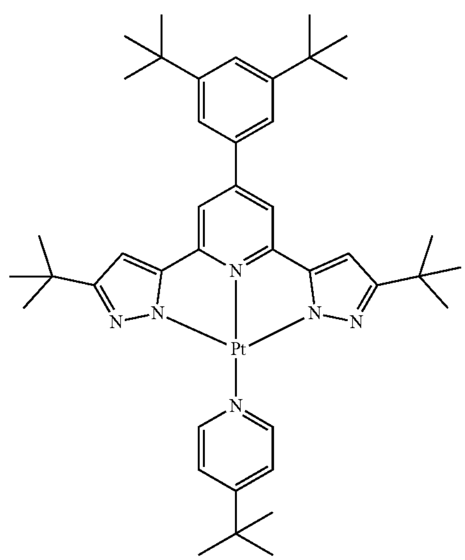

-continued

142

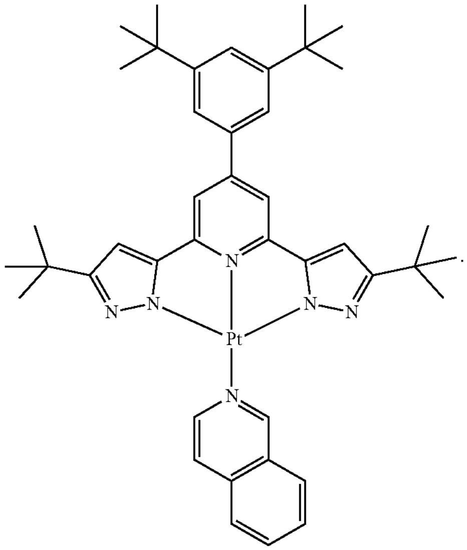

Ligand $L_1$ in the organometallic compound represented by Formula 1 may be selected from ligands represented by Formula 2, and rings $A_1$, $A_2$, and $A_3$ in Formula 2 may have one or two nitrogen atoms as a ring-forming atom. The organometallic compound represented by Formula 1 is easy in terms of energy transfer from a host, as compared with a compound (for example, see Compound A) that has the same structure as the organometallic compound represented by Formula 1, provided that rings $A_1$, $A_2$, and $A_3$ in Formula 2 have three or more nitrogen atoms. Therefore, an electronic device, for example, an organic light-emitting device, which includes the organometallic compound represented by Formula 1, may have high efficiency.

Also, $Y_3$ in Formula 2 may be nitrogen, and a bond between $Y_3$ in Formula 2 and M in Formula 1 may be a coordinate bond. Therefore, an electronic device, for example, an organic light-emitting device, which includes the organometallic compound represented by Formula 1, may have high luminescent efficiency, high power efficiency, high quantum efficiency, and a long lifespan.

For example, the highest occupied molecular orbital (HOMO), the lowest unoccupied molecular orbital (LUMO), singlet (S) energy level, and triplet (Ti) energy level of Compounds 1, 2, 7, 8, 9, 10, 11, and 12 and Compounds A to C were evaluated by using a density functional theory (DFT) method of a Gaussian program (the structure was optimized at B3LYP, 6-31G(d,p) level). Results thereof are shown in Table 1.

TABLE 1

| Compound No. | HOMO (eV) | LUMO (eV) | $S_1$ energy level (eV) | $T_1$ energy level (eV) |
|---|---|---|---|---|
| 1 | −4.942 | −1.563 | 2.628 | 1.452 |
| 2 | −5.212 | −1.675 | 2.759 | 2.518 |
| 7 | −4.899 | −1.836 | 2.399 | 2.046 |
| 8 | −5.1 | −1.94 | 2.516 | 2.044 |
| 9 | −5.007 | −1.881 | 2.46 | 2.059 |
| 10 | −4.978 | −1.831 | 2.481 | 2.051 |
| 11 | −5.019 | −1.862 | 2.493 | 2.057 |
| 12 | −5.033 | −1.882 | 2.480 | 2.063 |
| A | −6.486 | −2.629 | 3.028 | 2.742 |
| B | −5.666 | −2.11 | 2.768 | 2.515 |
| C | −4.862 | −1.300 | 3.008 | 2.809 |

Compound A

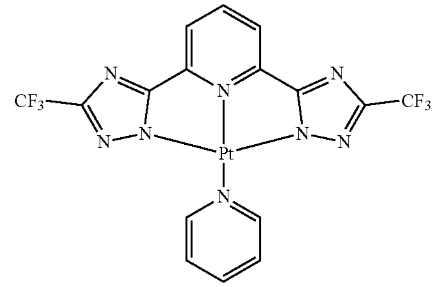

Compound B

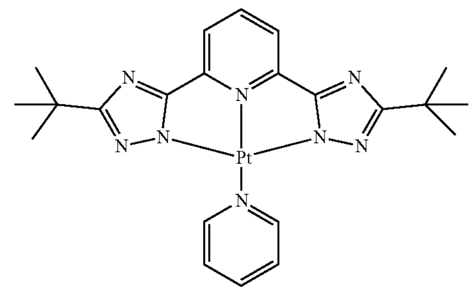

Compound C

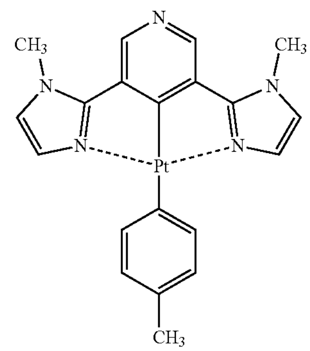

From Table 1, it is determined that the organometallic compound represented by Formula 1 has electric characteristics suitable for use in an electronic device, for example, a dopant of an organic light-emitting device. Although not limited by a specific theory, it is expected from Table 1 that, since the LUMO values of Compounds A and B are lower than the LUMO values of Compounds 1, 2, 7, 8, 9, 10, 11, and 12 (that is, the LUMO absolute values of Compounds A and B are greater than the LUMO absolute values of Compounds 1, 2, 7, 8, 9, 10, 11, and 12), the luminescent efficiency and lifespan of an electronic device, for example, an organic light-emitting device, which includes Compound A or B, is poorer than the luminescent efficiency and lifespan of an electronic device, for example, an organic light-emitting device, which includes one selected from Compounds 1, 2, 7, 8, 9, 10, 11, and 12. In addition, since the HOMO values of Compounds A and B are lower than the HOMO values of Compounds 1, 2, 7, 8, 9, 10, 11, and 12 (that is, the HOMO absolute values of Compounds A and B are greater than the HOMO absolute values of Compounds 1, 2, 7, 8, 9, 10, 11, and 12), it is expected that the energy transfer efficiency of Compound A and B, is poorer than the energy transfer efficiency of Compounds 1, 2, 7, 8, 9, 10, 11, and 12

Synthesis methods of the organometallic compound represented by Formula 1 may be recognizable by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes:

a first electrode;

a second electrode; and an organic layer disposed between the first electrode and the second electrode, wherein the organic layer includes an emission layer and at least one of the organometallic compound represented by Formula 1.

The organic light-emitting device may have, due to the inclusion of an organic layer including the organometallic compound represented by Formula 1, low driving voltage, high luminescent efficiency, high power efficiency, high quantum efficiency, long lifespan, and excellent color.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host).

The expression that "(an organic layer) includes at least one of organometallic compounds" as used herein may include an embodiment in which "(an organic layer) includes identical organometallic compounds represented by Formula 1" and an embodiment in which "(an organic layer) includes two or more different organometallic compounds represented by Formula 1".

For example, the organic layer may include only Compound 1 as the organometallic compound. In this regard, Compound 1 may be included only in the emission layer of the organic light-emitting device. In one or more embodiments, the organic layer may include, as the organometallic compound, Compound 1 and Compound 2. In this regard, Compound 1 and Compound 2 may be included in an identical layer (for example, Compound 1 and Compound 2 all may be included in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In one or more embodiments, in the organic light-emitting device, the first electrode may be an anode, and the second electrode may be a cathode, and the organic layer may include a hole transport region disposed between the first electrode and the emission layer and an electron transport region disposed between the emission layer and the second electrode, wherein the hole transport region may include at least one selected from a hole injection layer, a hole transport layer, and an electron blocking layer, and wherein the electron transport region may include at least one selected from a hole blocking layer, an electron transport layer, and an electron injection layer.

The term "organic layer" as used herein refers to a single layer and/or a plurality of layers disposed between the first electrode and the second electrode of the organic light-emitting device. The "organic layer" may include, in addition to an organic compound, an organometallic complex including metal.

The FIGURE is a schematic view of an organic light-emitting device 10 according to an embodiment. Hereinafter, the structure of an organic light-emitting device according to an embodiment and a method of manufacturing an organic light-emitting device according to an embodiment will be described in connection with FIG. 1. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water-resistance.

The first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode 11 may be, for example, indium tin oxide (ITO), indium zinc oxide (IZO), tin oxide ($SnO_2$), and zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag) may be used as the material for forming the first electrode 11.

The first electrode 11 may have a single-layered structure or a multi-layered structure including two or more layers. For example, the first electrode 11 may have a three-layered structure of ITO/Ag/ITO, but the structure of the first electrode 11 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include at least one selected from a hole injection layer, a hole transport layer, an electron blocking layer, and a buffer layer.

The hole transport region may include only either a hole injection layer or a hole transport layer. In one or more embodiments, the hole transport region may have a structure of hole injection layer/hole transport layer or hole injection layer/hole transport layer/electron blocking layer, which are sequentially stacked in this stated order from the first electrode 11.

A hole injection layer may be formed on the first electrode 11 by using one or more suitable methods selected from vacuum deposition, spin coating, casting, or Langmuir-Blodgett (LB) deposition.

When a hole injection layer is formed by vacuum deposition, the deposition conditions may vary depending on a material that is used to form the hole injection layer, and the structure and thermal characteristics of the hole injection layer. For example, the deposition conditions may include a deposition temperature of about 100 to about 500° C., a vacuum pressure of about $10^{-8}$ to about $10^{-3}$ torr, and a deposition rate of about 0.01 to about 100 Angstroms per second (A/sec). However, the deposition conditions are not limited thereto.

When the hole injection layer is formed using spin coating, coating conditions may vary depending on the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (Pani/DBSA), poly(3,4-ethylenedioxythiophene)/poly(4-styrenesulfonate) (PEDOT/PSS), polyaniline/camphor sulfonic acid (Pani/CSA), polyaniline/poly(4-styrenesulfonate) (Pani/PSS), a compound represented by Formula 201 below, and a compound represented by Formula 202:

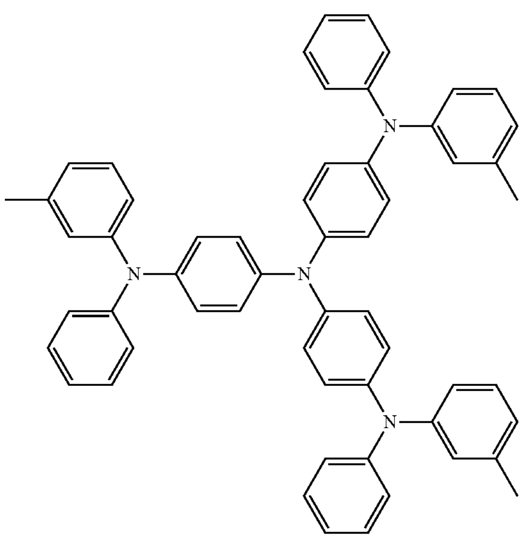

m-MTDATA

-continued

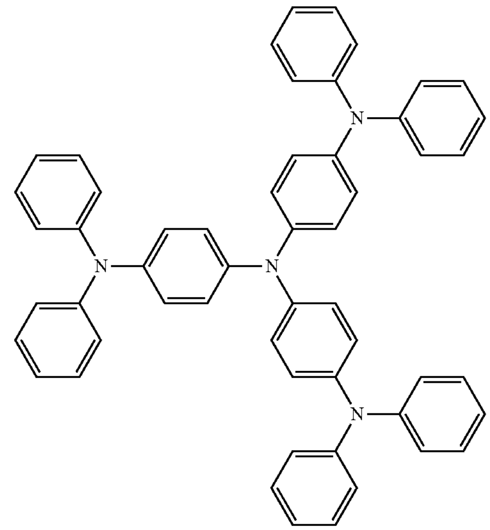

TDATA

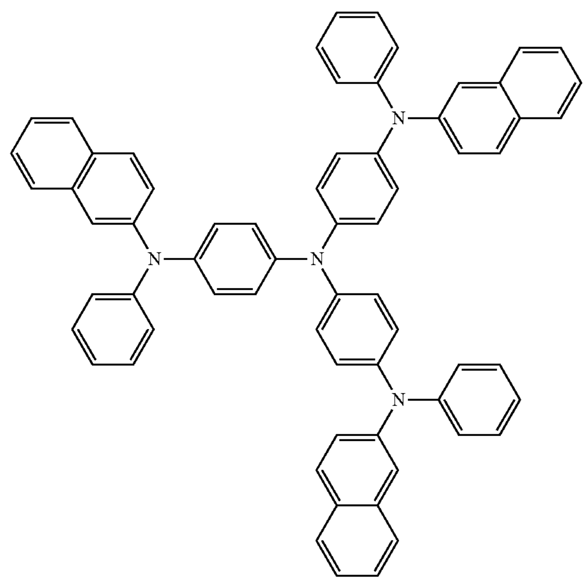

2-TNATA

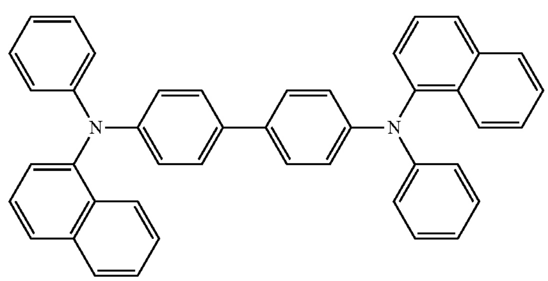

NPB

-continued

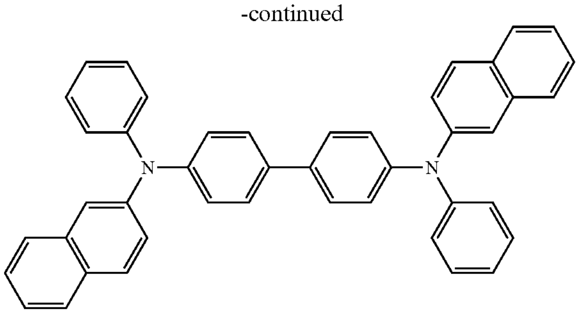

β-NPB

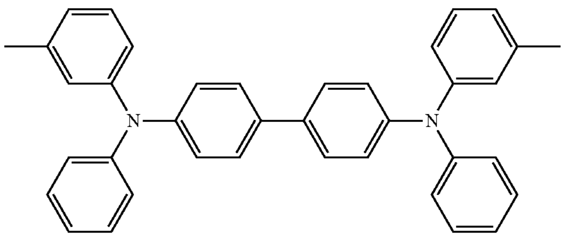

TPD

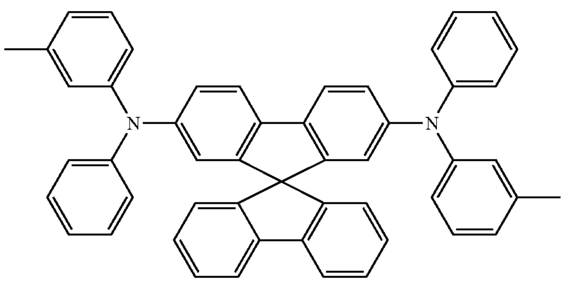

Spiro-TPD

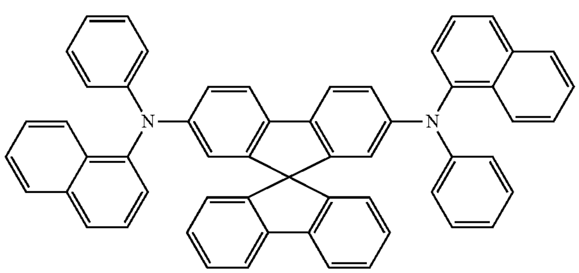

Spiro-NPB

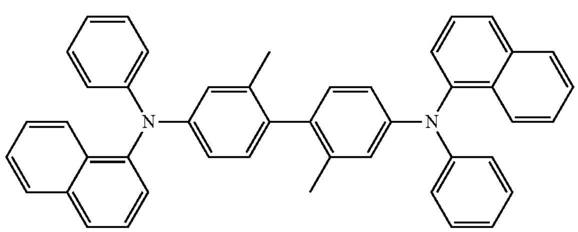

methylated NPB

-continued

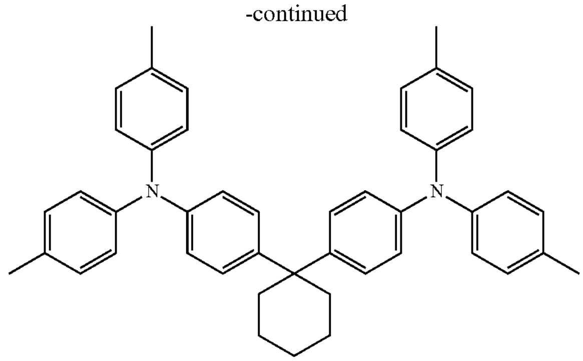

TAPC

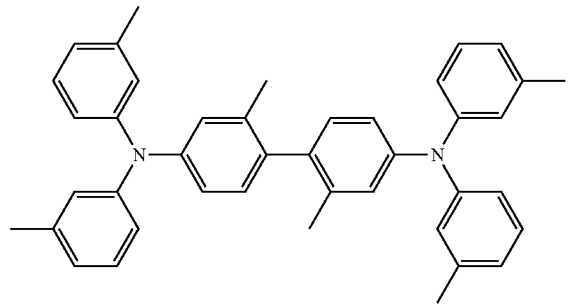

HMTPD

Formula 201

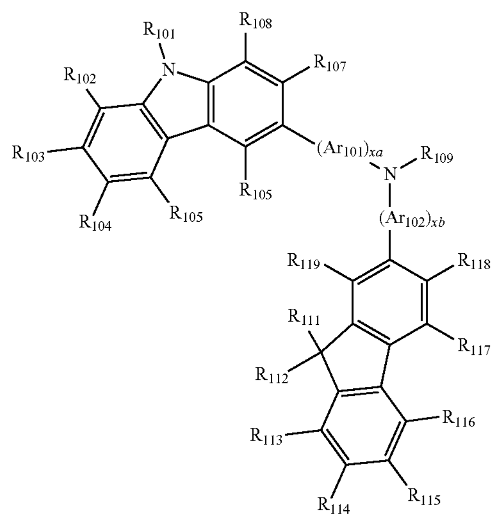

Formula 202

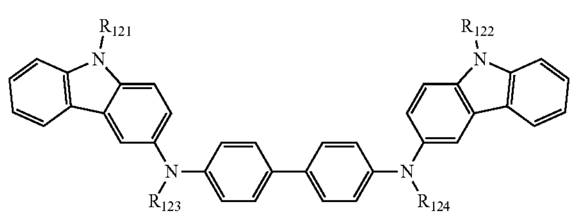

$Ar_{101}$ and $Ar_{102}$ in Formula 201 may each independently be selected from: a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

In Formula 201, xa and xb may each independently be an integer selected from 0 to 5, or 0, 1, or 2. For example, xa is 1 and xb is 0, but xa and xb are not limited thereto.

$R_{101}$ to $R_{108}$, $R_{111}$ to $R_{119}$, and $R_{121}$ to $R_{124}$ in Formulae 201 and 202 may each independently be selected from:

hydrogen, deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and so on), or a $C_1$-$C_{10}$ alkoxy group (for example, a methoxy group, an ethoxy group, a propoxy group, a butoxy group, a pentoxy group, and so on);

a $C_1$-$C_{10}$ alkyl group or a $C_1$-$C_{10}$ alkoxy group, each substituted with at least one selected from deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with at least one selected from deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but they are not limited thereto.

$R_{109}$ in Formula 201 may be selected from:

a phenyl group, a naphthyl group, an anthracenyl group, and a pyridinyl group; and a phenyl group, a naphthyl group, an anthracenyl group and a pyridinyl group, each substituted with at least one selected from deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

In one or more embodiments, the compound represented by Formula 201 may be represented by Formula 201A, but embodiments of the present disclosure are not limited thereto:

Formula 201A

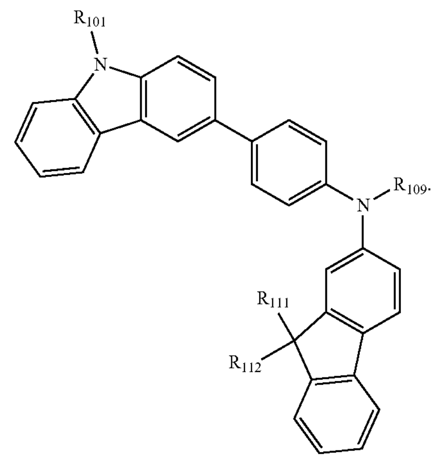

$R_{101}$, $R_{111}$, $R_{112}$, and $R_{109}$ in Formula 201A may be understood by referring to the description provided herein.

For example, the compound represented by Formula 201 and the compound represented by Formula 202 may include compounds HT1 to HT20 illustrated below, but embodiments of the present disclosure are not limited thereto.

HT1

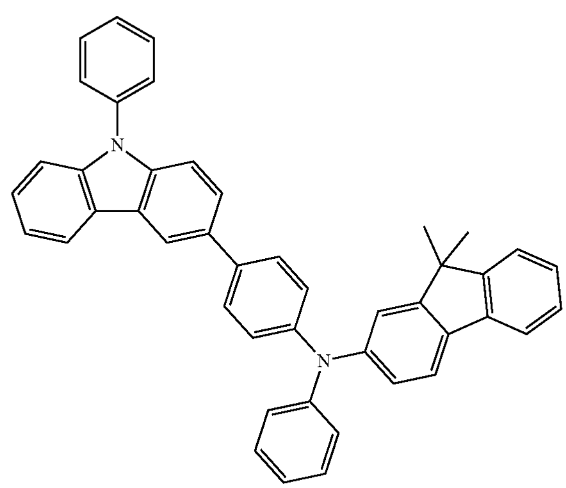

-continued
HT2
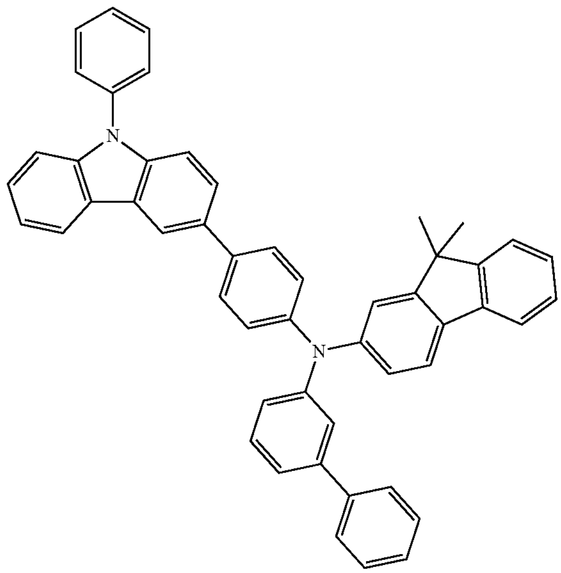
HT3
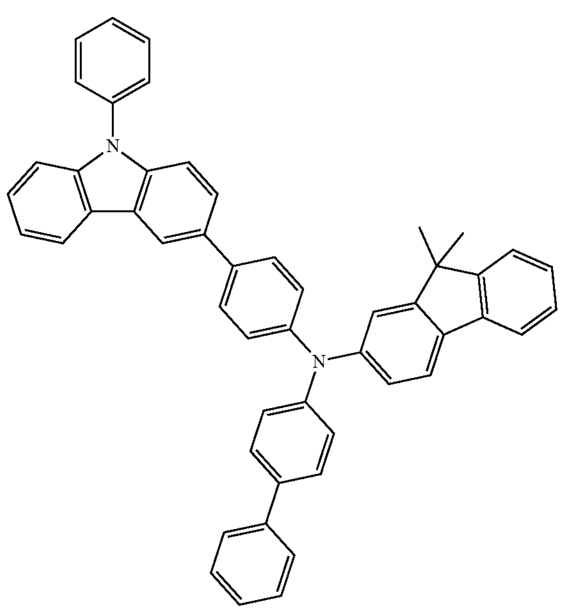
-continued
HT4
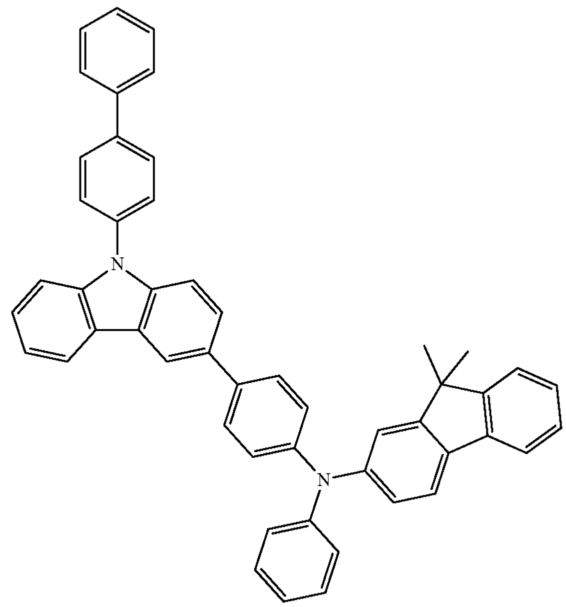
HT5
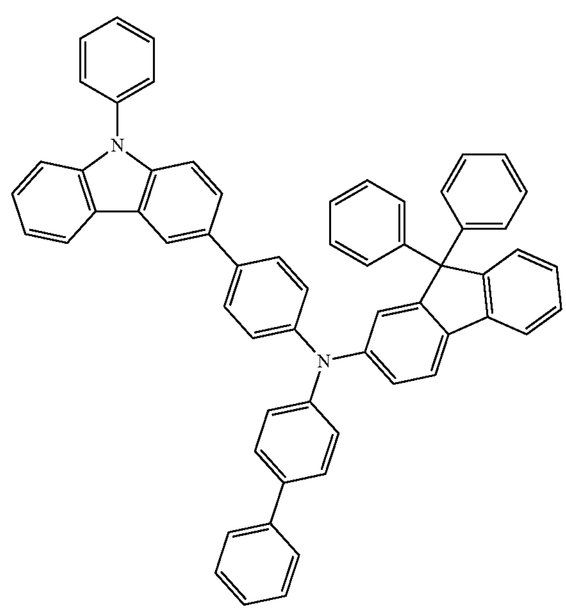

-continued
HT6
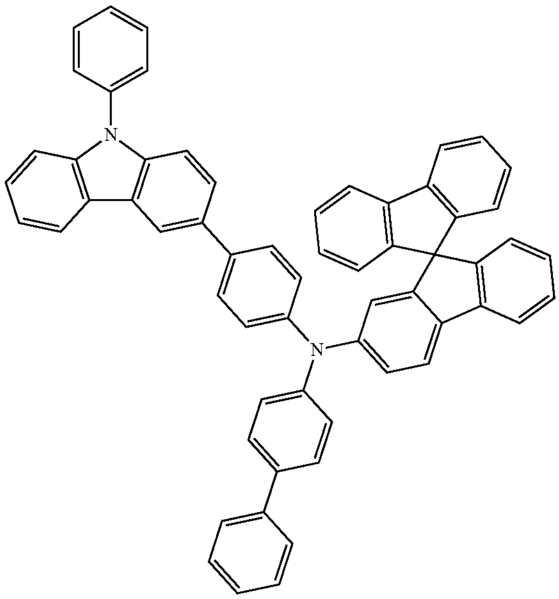
-continued
HT8
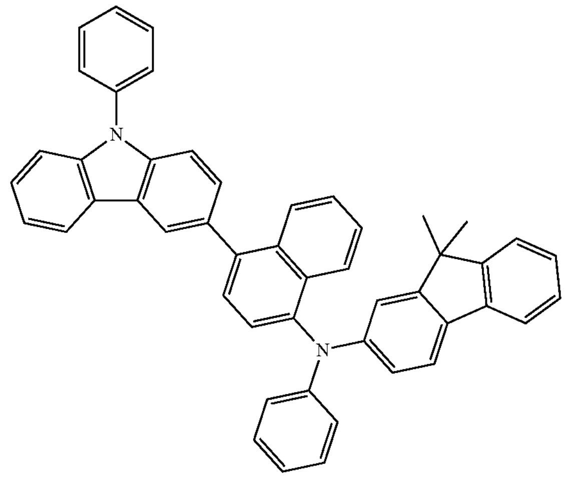
HT9
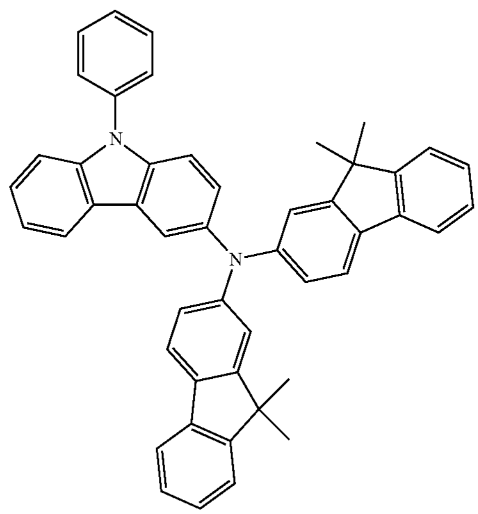
HT7
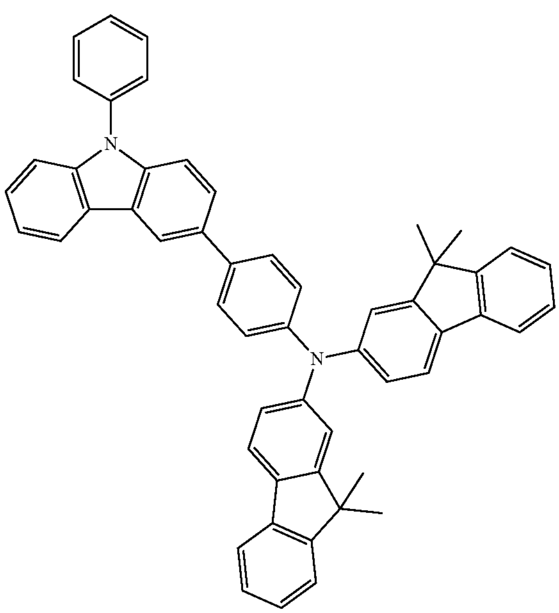
HT10
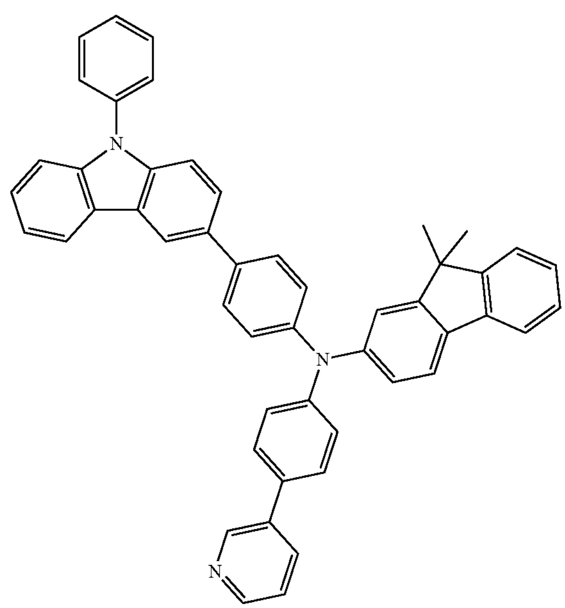

HT11
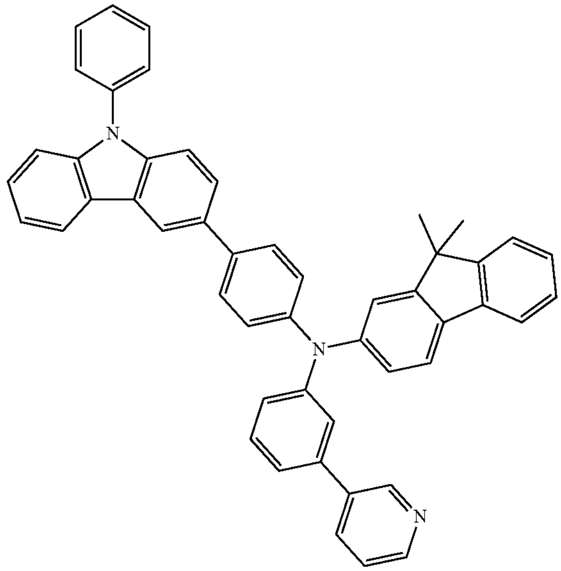
HT12
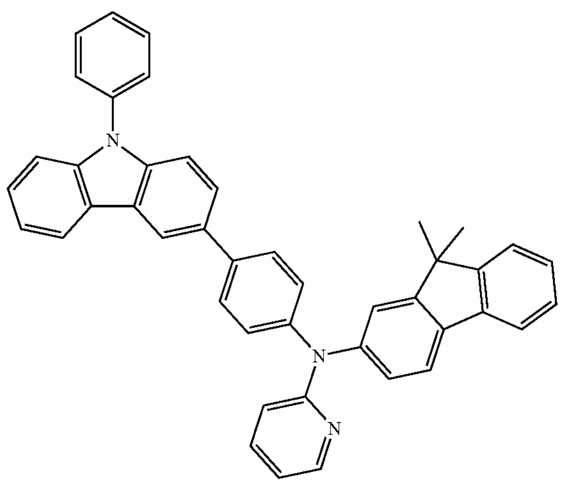
HT13
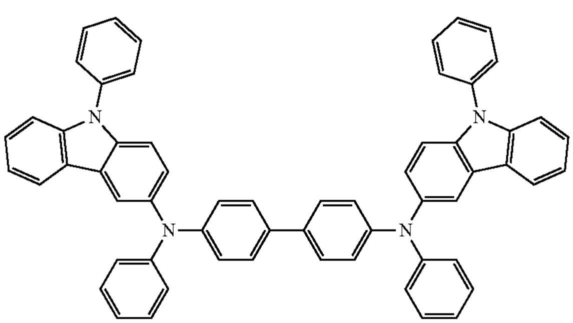
HT14
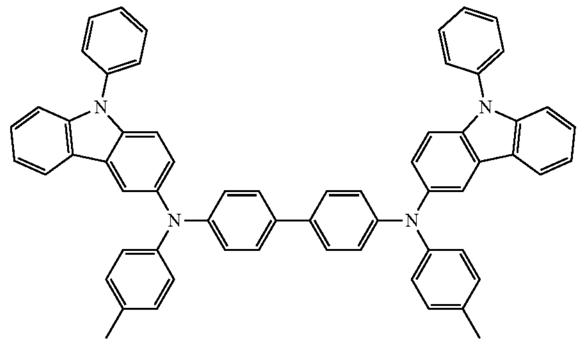
HT15
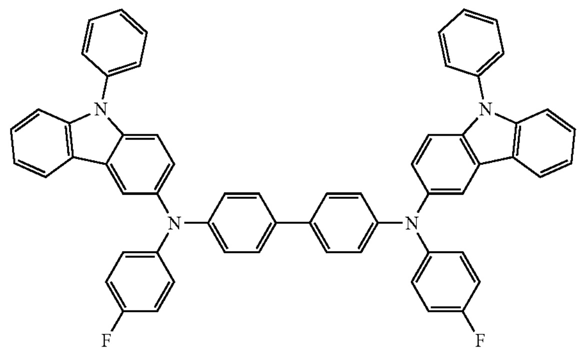
HT16
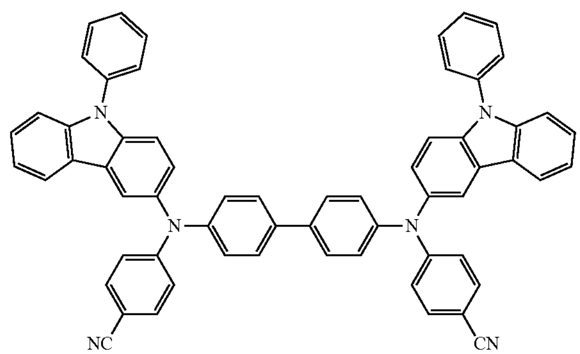
HT17
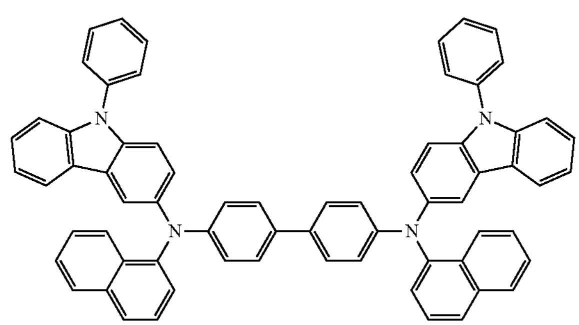

-continued

HT18

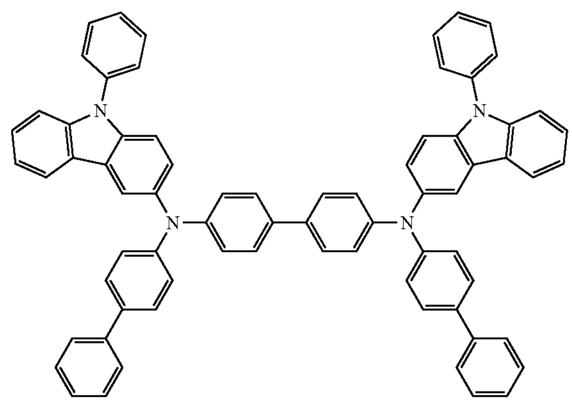

HT19

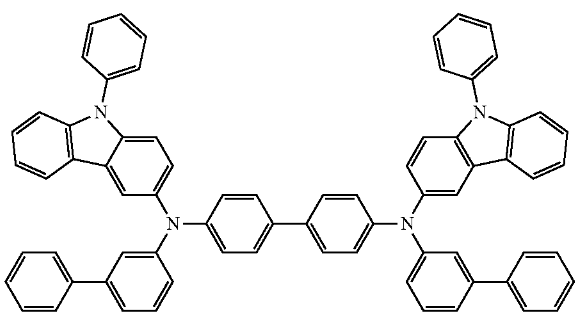

HT20

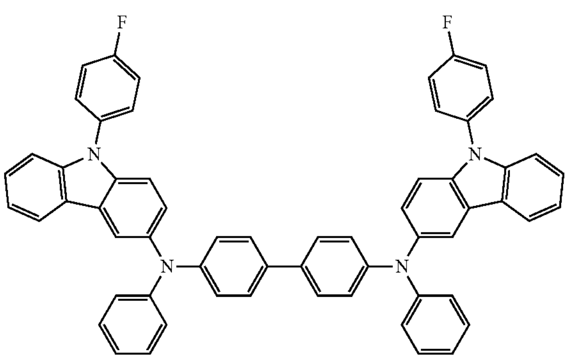

A thickness of the hole transport region may be in a range of about 100 Angstroms (Å) to about 10,000 Å, for example, about 100 Å to about 1,000 Å. When the hole transport region includes a hole injection layer and a hole transport layer, the thickness of the hole injection layer may be in a range of about 100 Å to about 10,000 Å, for example, about 100 Å to about 1,000 Å, and the thickness of the hole transport layer may be in a range of about 50 Å to about 2,000 Å, for example, about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1 below, but embodiments of the present disclosure are not limited thereto.

Compound HT-D1

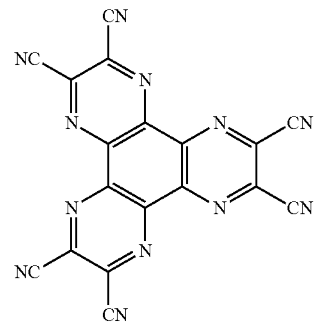

F4-TCNQ

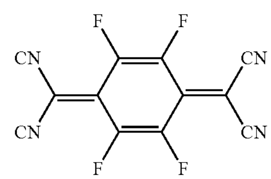

The hole transport region may include a buffer layer.

Also, the buffer layer may compensate for an optical resonance distance depending on a wavelength of light emitted from the emission layer, and thus, the efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied to form the hole injection layer although the deposition or coating conditions may vary according to the material that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one selected from TPBi, TBADN, ADN (also referred to as "DNA"), CBP, CDBP, TCP, mCP, Compound H50, and Compound H51:

-continued
TPBi
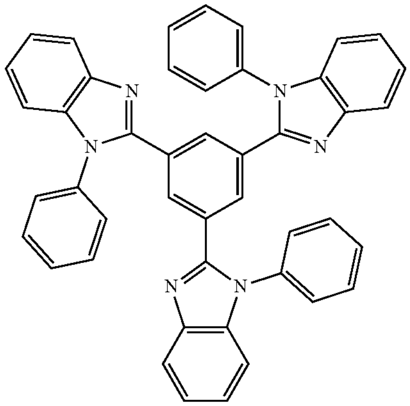
TBADN
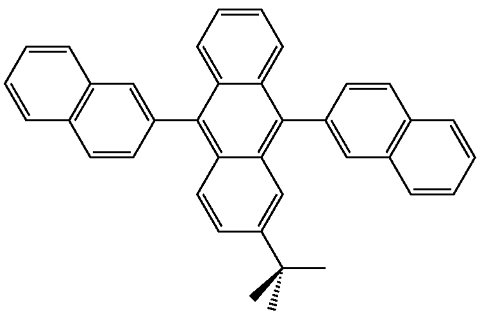
ADN
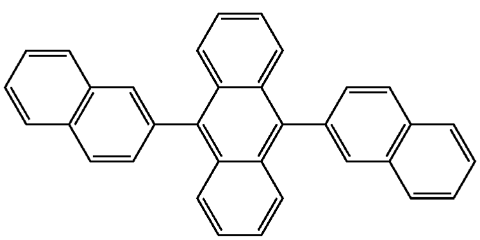
CBP
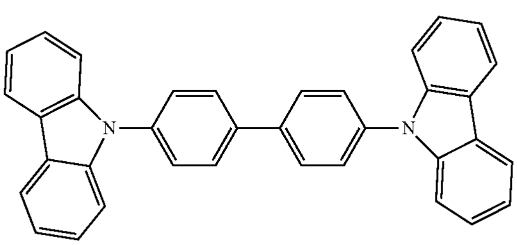
CDBP
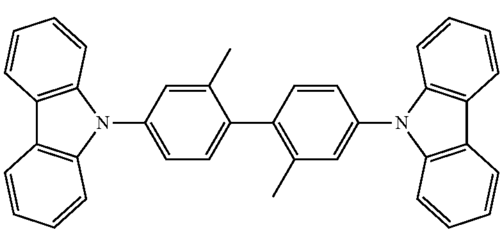
TCP
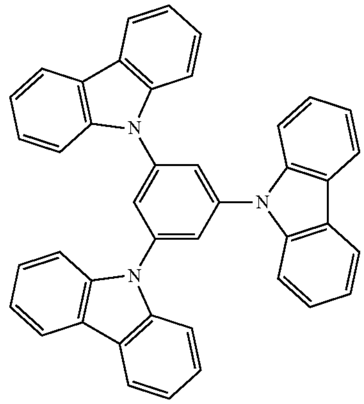
mCP
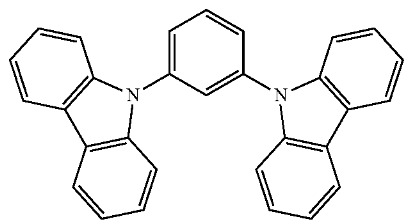
Compound H50
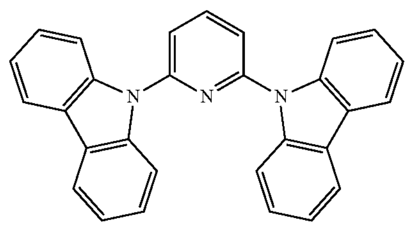
Compound H51
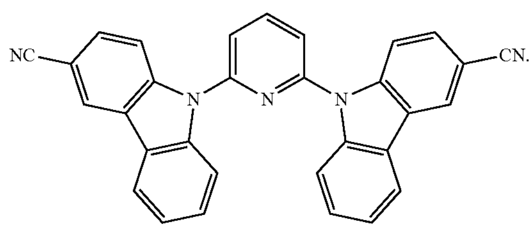
In one or more embodiments, the host may further include a compound represented by Formula 301.
Formula 301
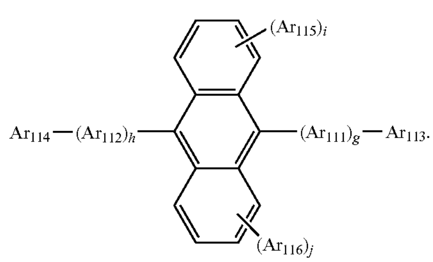
$Ar_{111}$ and $Ar_{112}$ in Formula 301 may each independently be selected from:
a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

$Ar_{113}$ to $Ar_{116}$ in Formula 301 may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

g, h, i, and j in Formula 301 may each independently be an integer selected from 0 to 4, and may be, for example, 0, 1, or 2.

$Ar_{113}$ to $Ar_{116}$ in Formula 301 may each independently be selected from: a $C_1$-$C_{10}$ alkyl group, substituted with at least one selected from a phenyl group, a naphthyl group, and an anthracenyl group;

a phenyl group, a naphthyl group, an anthracenyl group, a pyrenyl, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

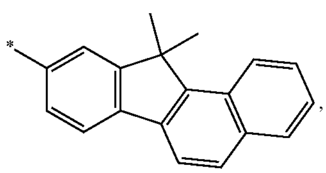 [SMILES: *c1ccc2c(c1)C(C)(C)c1c-2ccc2ccccc12]

but embodiments are not limited thereto.

In one or more embodiments, the host may include a compound represented by Formula 302:

Formula 302

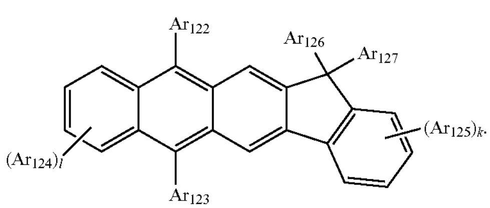

$Ar_{122}$ to $Ar_{125}$ in Formula 302 are the same as described in detail in connection with $Ar_{113}$ in Formula 301.

$Ar_{125}$ and $Ar_{127}$ in Formula 302 may each independently be a $C_1$-$C_{10}$ alkyl group (for example, a methyl group, an ethyl group, or a propyl group).

k and l in Formula 302 may each independently be an integer selected from 0 to 4. For example, k and l may be 0, 1, or 2.

The compound represented by Formula 301 and the compound represented by Formula 302 may include Compounds H1 to H42 illustrated below, but embodiments of the present disclosure are not limited thereto:

H1

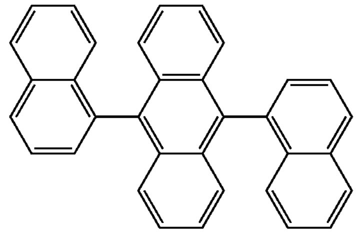

H2

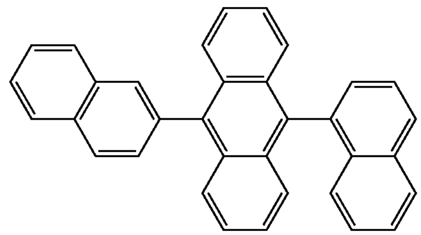

H3

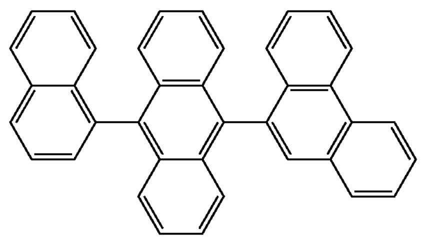

H4

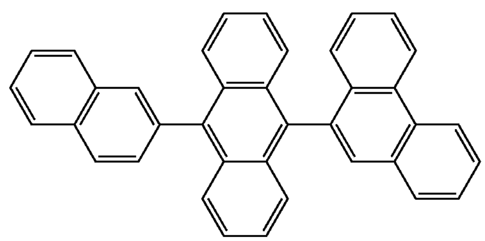

H5

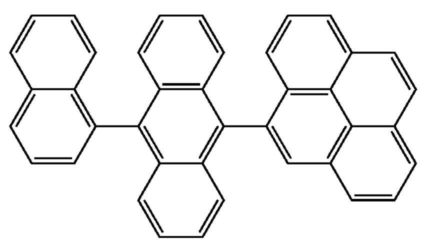

H6

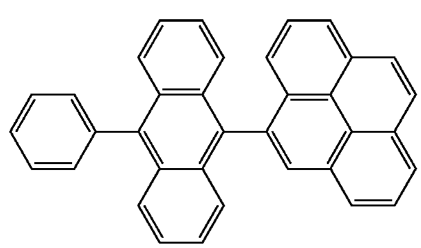

-continued
H7
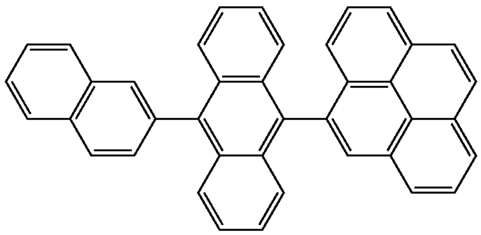
H8
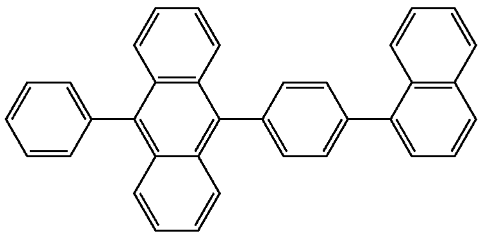
H9
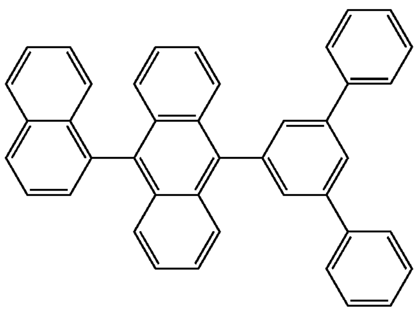
H10
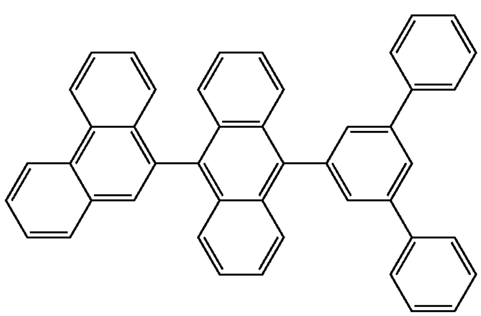
H11
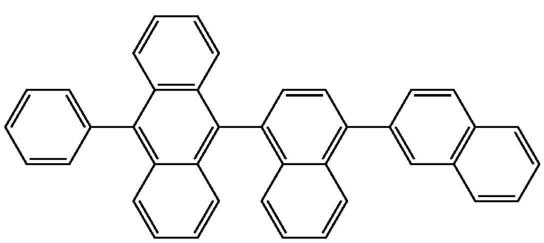
H12
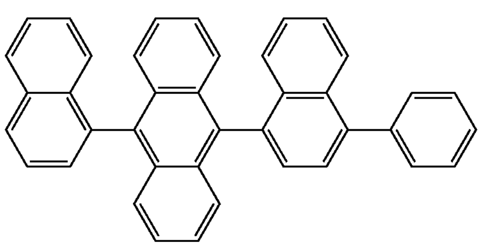
-continued
H13
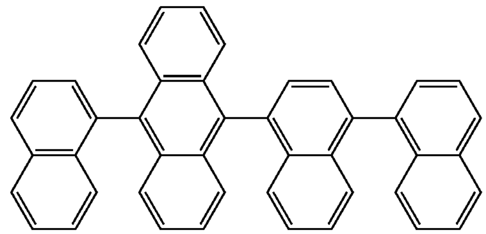
H14
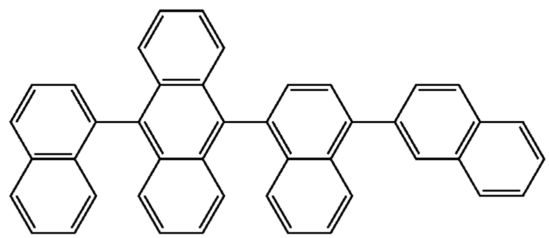
H15
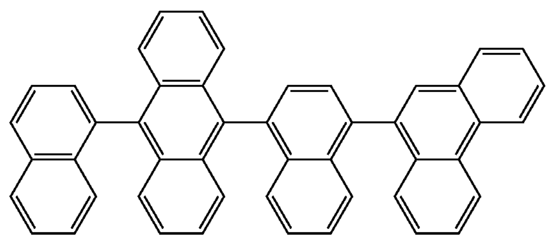
H16
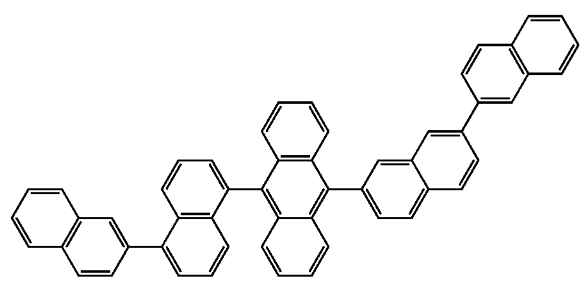
H17
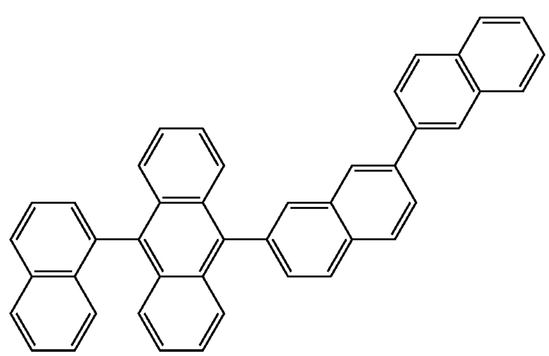

-continued
H18
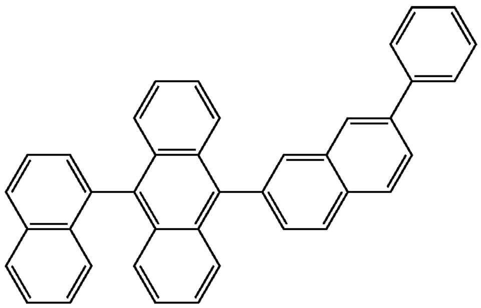
H19
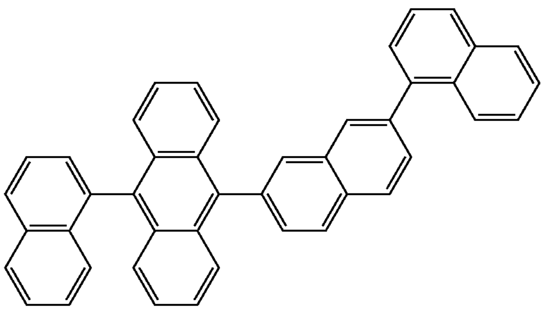
H20
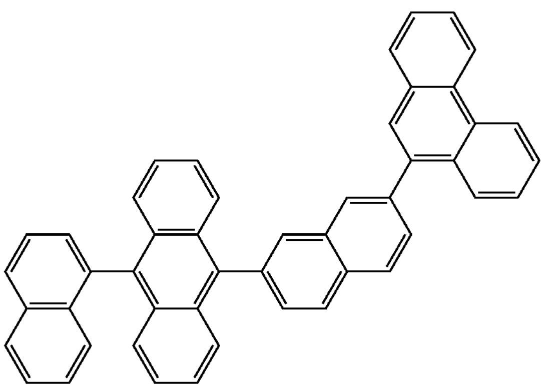
H21
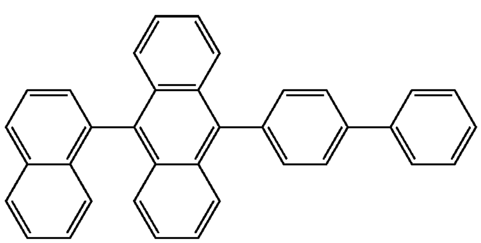
H22
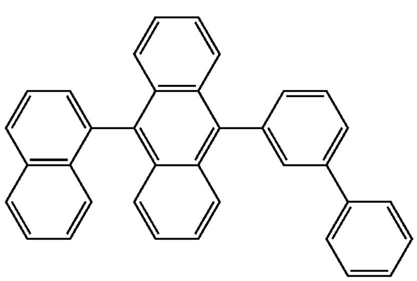
-continued
H23
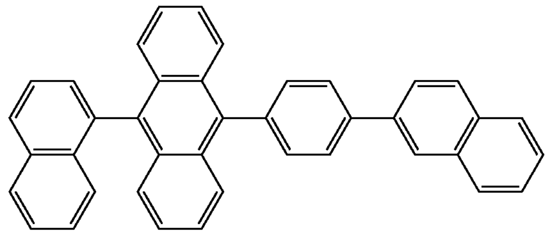
H24
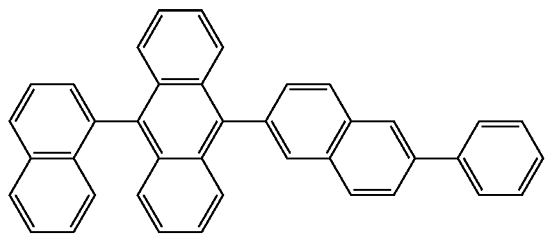
H25
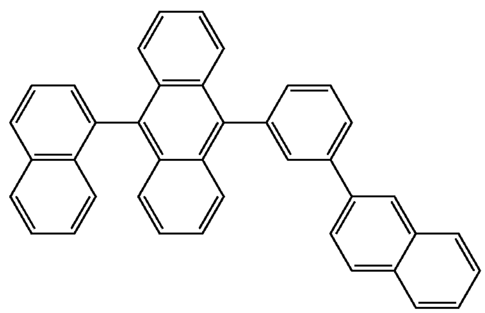
H26
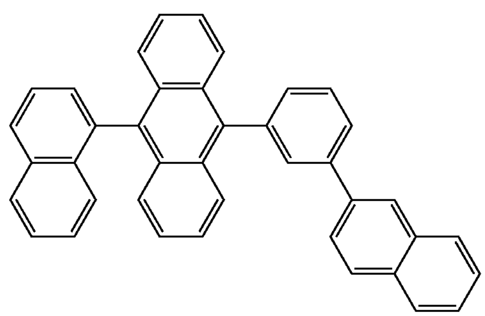
H27
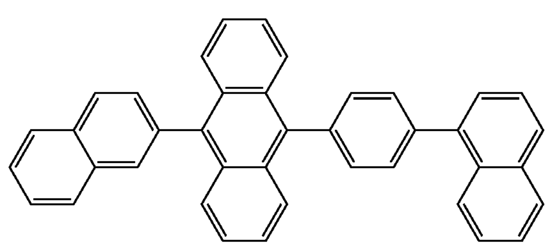

-continued
H28
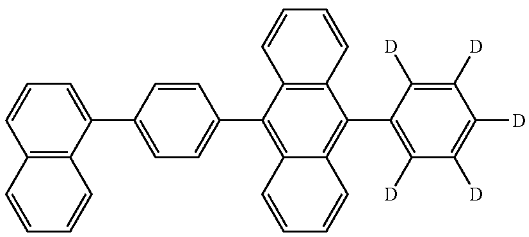
H29
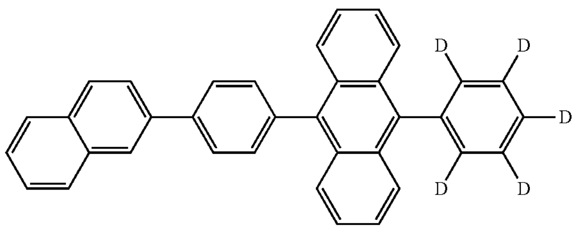
H30
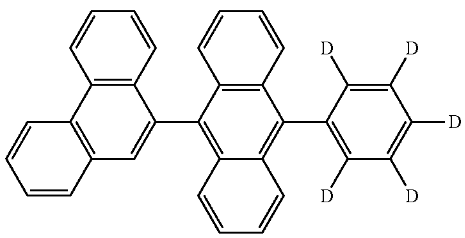
H31
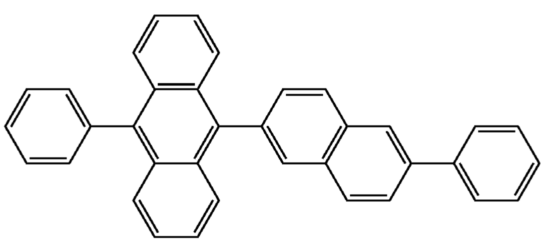
H32
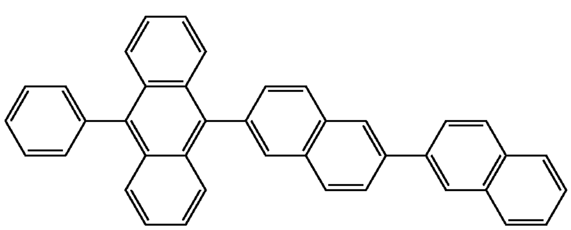
H33
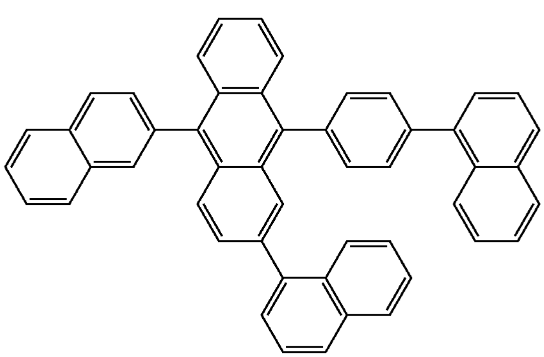
-continued
H34
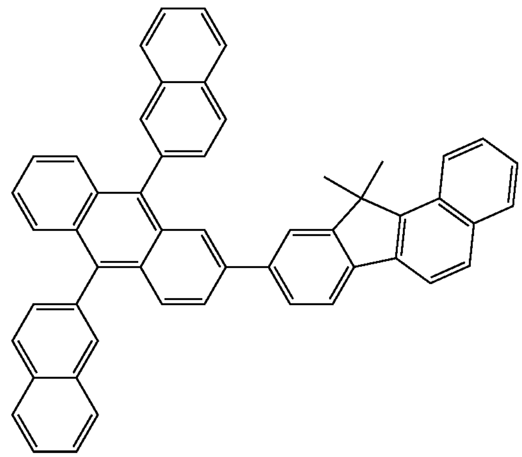
H35
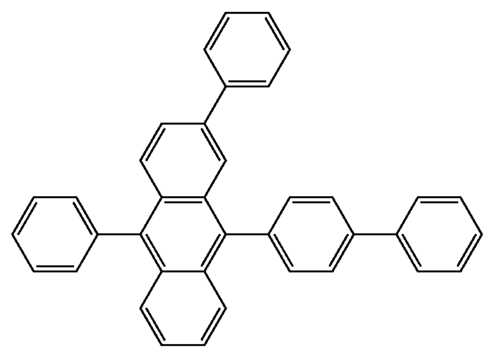
H36
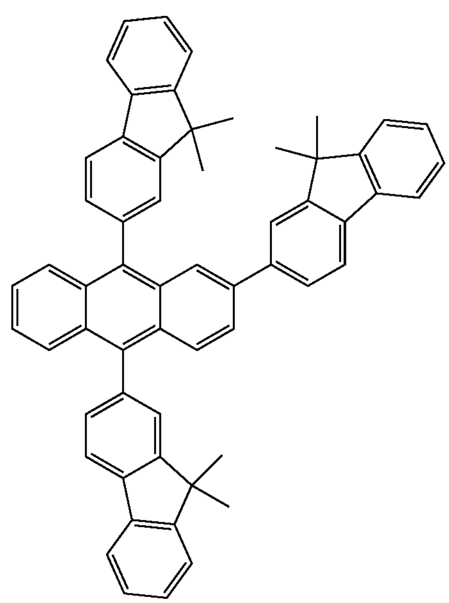

-continued

H37

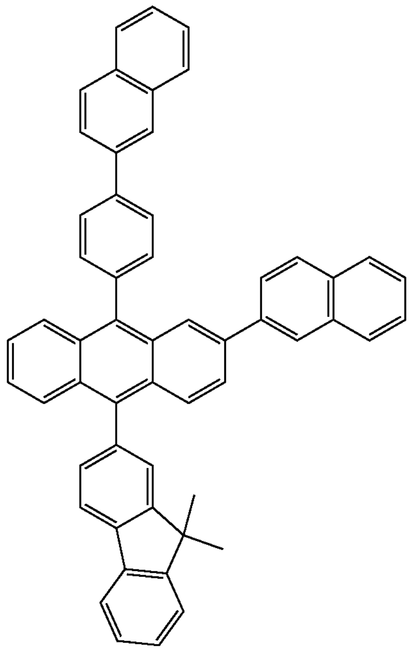

H38

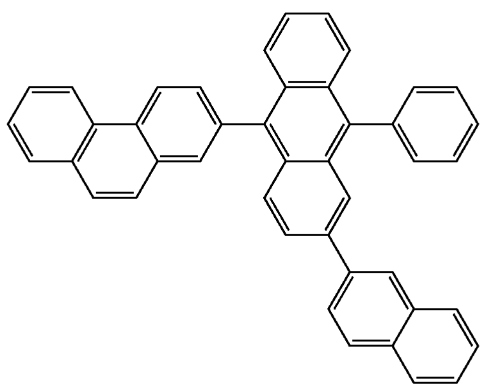

H39

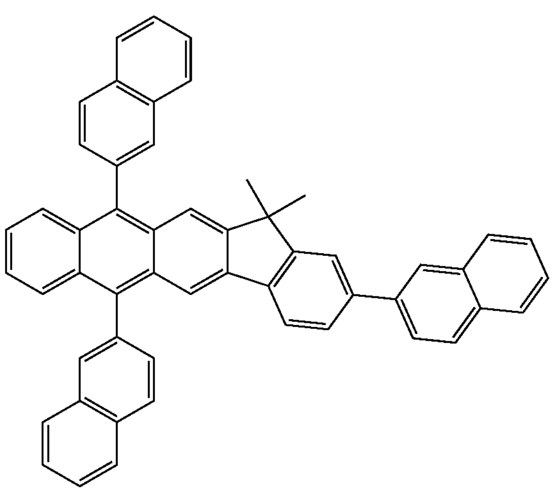

-continued

H40

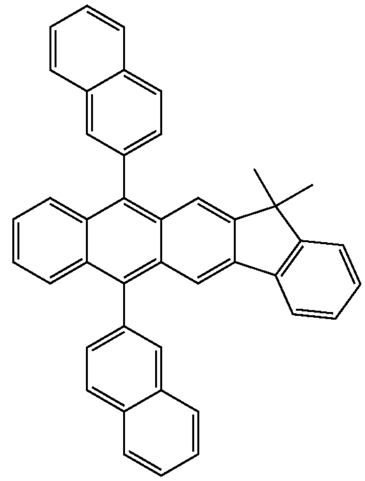

H41

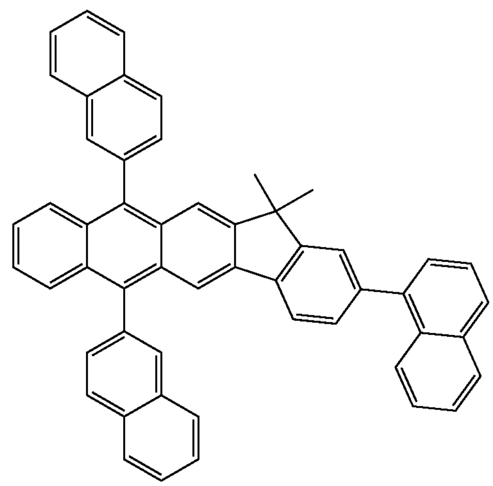

H42

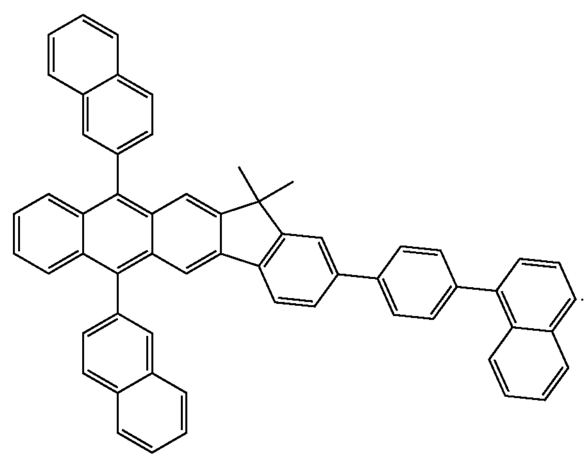

When the organic light-emitting device is a full-color organic light-emitting device, the emission layer may be patterned into a red emission layer, a green emission layer, and a blue emission layer. In one or more embodiments, due to a stack structure including a red emission layer, a green emission layer, and/or a blue emission layer, the emission layer may emit white light.

When the emission layer includes a host and a dopant, an amount of the dopant may be in a range of about 0.01 to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include at least one selected from a hole blocking layer, an electron transport layer, and an electron injection layer.

For example, the electron transport region may have a structure of hole blocking layer/electron transport layer/electron injection layer or a structure of electron transport layer/electron injection layer, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto.

BCP

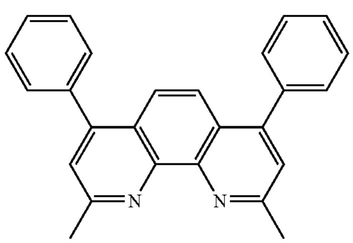

Bphen

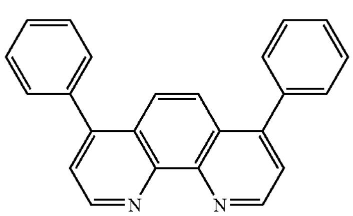

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have improved hole blocking ability without a substantial increase in driving voltage.

The electron transport layer may further include at least one selected from BCP, Bphen $Alq_3$, BAlq, TA, an NTAZ.

$Alq_3$

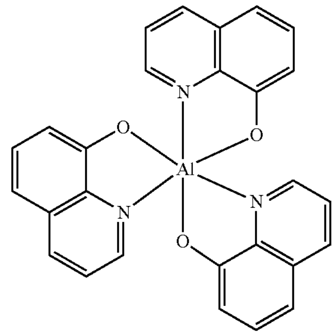

BAlq

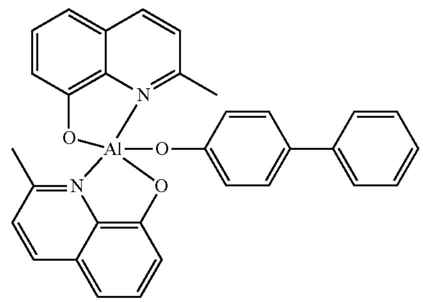

TAZ

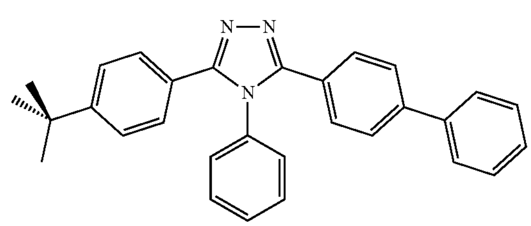

NTAZ

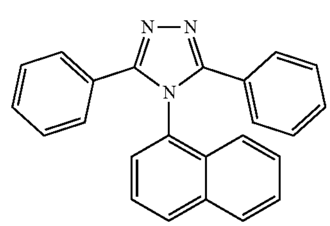

In one or more embodiments, the electron transport layer may include at least one of ET1 and ET2, but embodiments of the present disclosure are not limited thereto:

ET1

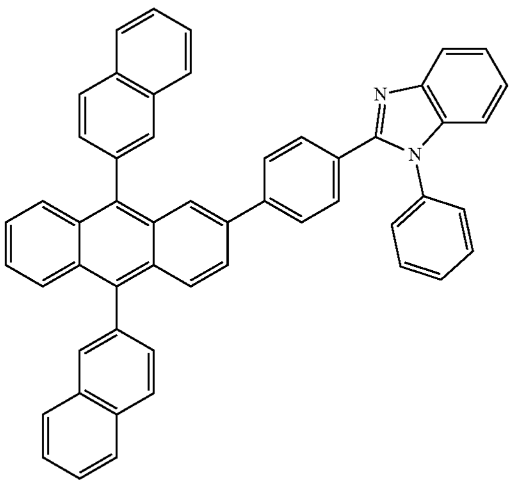

ET2

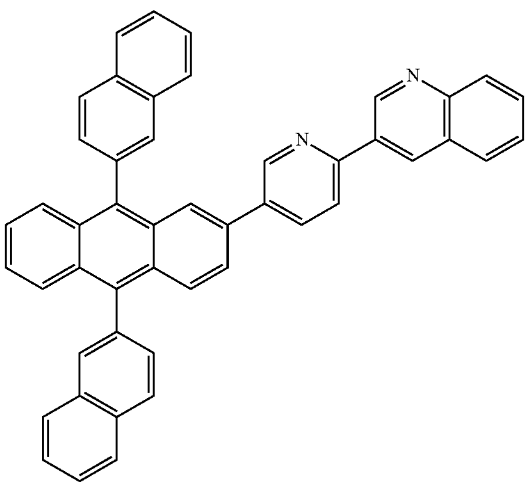

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2:

ET-D1

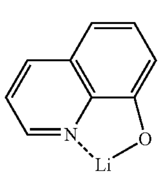

-continued

ET-D2

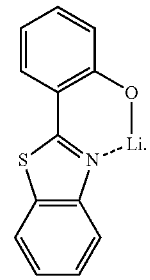

The electron transport region may include an electron injection layer (EIL) that promotes flow of electrons from the second electrode 19 thereinto.

The electron injection layer may include at least one selected from, LiF, NaCl, CsF, $Li_2O$, BaO, and LiQ.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In one or more embodiments, to manufacture a top emission type light-emitting device, a transmissive electrode formed using ITO or IZO may be used as the second electrode 19.

Hereinbefore, the organic light-emitting device has been described with reference to FIG. 1, but embodiments of the present disclosure are not limited thereto.

Another aspect of the present disclosure provides a diagnosis composition including at least one organometallic compound represented by Formula 1.

The organometallic compound represented by Formula 1 provides high luminescent efficiency. Accordingly, a diagnosis composition including the organometallic compound may have high diagnosis efficiency.

The diagnosis composition may be used in, for example, various diagnosis kits, diagnosis reagents, bio-sensors, or bio-markers The term $C_1$-$C_{60}$ alkyl group as used herein refers to a linear or branched aliphatic saturated hydrocarbon monovalent group having 1 to 60 carbon atoms, and examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an iso-propyloxy group.

The term "$C_2$-$C_{60}$ alkenyl group" as used herein refers to a hydrocarbon group formed by including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by including at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{60}$ heterocycloalkyl group" as used herein refers to a monovalent saturated monocyclic group having at least one heteroatom selected from N, O, P, and S as a ring-forming atom and 1 to 10 carbon atoms, and examples thereof include a tetrahydrofuranyl group and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof, and which is not aromatic. Non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, and S as a ring-forming atom, 1 to 10 carbon atoms, and at least one carbon-carbon double bond in its ring. Non-limiting examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and a $C_6$-$C_{60}$ arylene group as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a heterocyclic aromatic system that has at least one heteroatom selected from N, O, P, and S as a ring-forming atom, and 1 to 60 carbon atoms. A $C_1$-$C_{60}$ heteroarylene group as used herein refers to a divalent group having a heterocyclic aromatic system that has at least one heteroatom selected from N, O, P, and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group", as used herein indicates —$OA_{102}$ (wherein $A_{102}$ is the $C_6$-$C_{60}$ aryl group), and a $C_6$-$C_{60}$ arylthio group as used herein indicates —$SA_{103}$ (wherein $A_{103}$ is the $C_6$-$C_{60}$ aryl group), and the term "$C_7$-$C_{60}$ arylalkyl group" as used herein indicates -$A_{104}A_{105}$ (wherein $A_{107}$ is the $C_6$-$C_{59}$ aryl group and $A_{105}$ is the $C_1$-$C_{53}$ alkyl group).

The term "$C_2$-$C_{60}$ heteroaryloxy group" as used herein indicates —$OA_{106}$ (wherein $A_{106}$ is the $C_2$-$C_{60}$ heteroaryl group), the term "$C_2$-$C_{60}$ heteroarylthio group" as used herein indicates -$SA_{107}$ (wherein $A_{107}$ is the $C_2$-$C_{60}$ heteroaryl group), and the term "$C_3$-$C_{60}$ heteroarylalkyl group" as used herein indicates -$A_{108}A_{109}$ (wherein $A_{108}$ is the $C_2$-$C_{59}$ heteroaryl group and $A_{109}$ is the $C_1$-$C_{58}$ alkyl group).

The term "monovalent non-aromatic condensed polycyclic group" as used herein refers to a monovalent group (for example, having 8 to 60 carbon atoms) that has two or more rings condensed to each other, only carbon atoms as a ring-forming atom, and which is non-aromatic in the entire molecular structure. Examples of the monovalent non-aromatic condensed polycyclic group include a fluorenyl group. The term "divalent non-aromatic condensed polycyclic group", as used herein, refers to a divalent group having the same structure as the monovalent non-aromatic condensed polycyclic group.

The term "monovalent non-aromatic condensed heteropolycyclic group", as used herein refers to a monovalent group (for example, having 2 to 60 carbon atoms) that has two or more rings condensed to each other, has a heteroatom selected from N, O, P, and S, other than carbon atoms, as a ring-forming atom, and which is non-aromatic in the entire molecular structure. Non-limiting examples of the monovalent non-aromatic condensed heteropolycyclic group include a carbazolyl group. The term "divalent non-aromatic condensed heteropolycyclic group", as used herein, refers to a divalent group having the same structure as the monovalent non-aromatic condensed heteropolycyclic group.

At least one of substituents of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be selected from:

deuterium, —F, —C, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —C, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group, each substituted with at least one selected from deuterium, —F, —$C_1$, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$, wherein $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —$C_1$, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group that is substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group.

When a group containing a specified number of carbon atoms is substituted with any of the groups listed in the preceding paragraphs, the number of carbon atoms in the resulting "substituted" group is defined as the sum of the carbon atoms contained in the original (unsubstituted) group and the carbon atoms (if any) contained in the substituent. For example, when the term "substituted $C_1$-$C_{60}$ alkyl" refers to a $C_1$-$C_{60}$ alkyl group substituted with $C_6$-$C_{60}$ aryl group, the total number of carbon atoms in the resulting aryl substituted alkyl group is $C_7$-$C_{120}$.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples refers to that an identical molar equivalent of B was used in place of A.

EXAMPLES

Synthesis Example 1: Synthesis of Compound 11

Synthesis of Intermediate A2

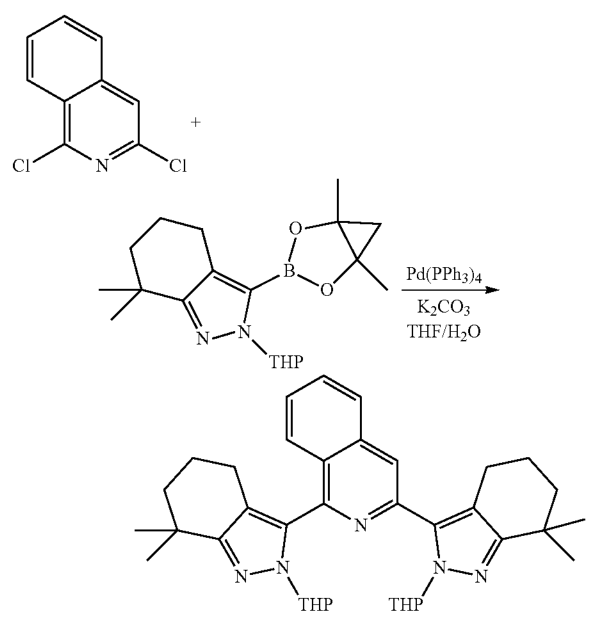

Intermediate A2

5 grams (g) (25.2 millimoles, mmol) of 1,3-dichloroisoquinoline, 19.12 g (55.5 mmol) of 3-(1,5-dimethyl-2,4-dioxa-3-borabicyclo[3.1.0]hexan-3-yl)-7,7-dimethyl-2-(tetrahydro-2H-pyran-2-yl)-4,5,6,7-tetrahydro-2H-indazole, 2.042 g (1.8 mmol) of $Pd(PPh_3)_4$, and 6.979 g (50.5 mmol) of $K_2CO_3$ were mixed together in 60 milliliters (mL) of tetrahydrofuran (THF) and 30 mL of water ($H_2O$), and the mixed solution was stirred at a temperature of 75° C. for 18 hours. The obtained solution was cooled to room temperature and filtered. The organic layer was extracted from the obtained solution by using methylene chloride (MC). The extracted layer was dried with anhydrous magnesium sulfate ($MgSO_4$) and filtered to obtain a filtrate. The residue obtained by concentration of the filtrate was purified by column chromatography with ethyl acetate (EA): hexane=10:90, thereby completing the preparation of 11.4 g (76%) of Intermediate A2.

Synthesis of Intermediate A1

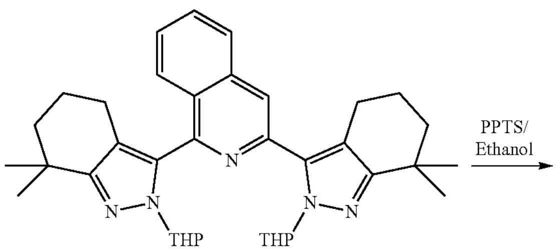

Intermediate A2

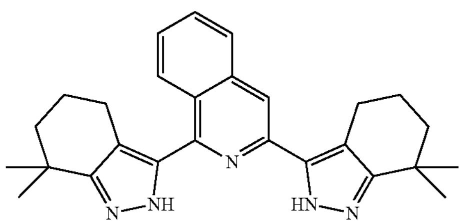

Intermediate A2

11.4 g (19.2 mmol) of Intermediate A2 and 0.48 g (1.92 mmol) of pyridinium p-toluenesulfonate (PPTS) were mixed together in 100 mL of ethyl alcohol (ethanol), and the mixed solution was stirred at a temperature of 78° C. for 12 hours. The obtained solution was cooled to room temperature and filtered. The organic layer was extracted from the obtained solution by using MC. The extracted layer was dried with anhydrous magnesium sulfate ($MgSO_4$) and filtered to obtain a filtrate. The residue obtained by concentrating the filtrate was purified by column chromatography with EA:hexane:methanol=24:75:1, thereby completing the preparation of 5.72 g (70%) of Intermediate A1.

Synthesis of Compound 11

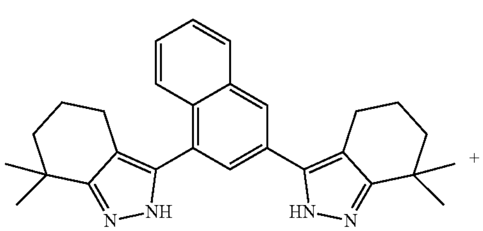

Intermediate A1

-continued

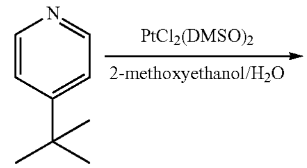

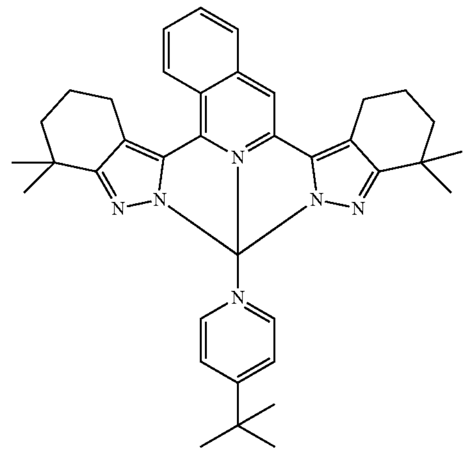

Compound 11

2 g (4.7 mmol) of Intermediate A1, 0.723 ml (4.9 mmol) of tert-butyl pyridine, and 1.98 g (4.7 mmol) of $PtCl_2(DMSO)_2$ were mixed together in 40 ml of 2-methoxyethanol and 20 ml of water, and the mixed solution was stirred at a temperature of 85° C. for 24 hours. Once the reaction was completed, the obtained solution was cooled. A resulting mixture was filtered to obtain a solid. The solid was thoroughly washed with ethanol. Column chromatography was performed with ethanol:hexane=20:80, thereby completing the preparation of 1.59 g (40%) of Compound 11. The prepared compound was confirmed by Mass and HPLC analysis.

HRMS(MALDI) calcd for $C_{36}H_{42}N_6Pt$: m/z 753.3119, Found: 753.3121.

Synthesis Example 2: Synthesis of Compound 8

Synthesis of Intermediate B2

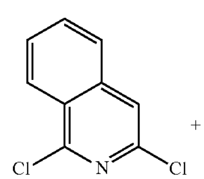

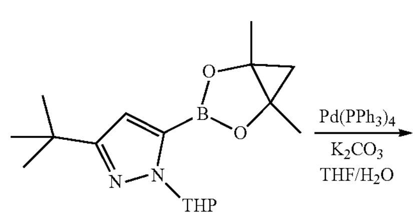

-continued

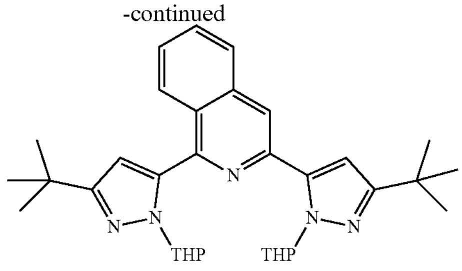

Intermediate B2

5 g (25.2 mmol) of 1,3-dichloroisoquinoline, 17.67 g (55.5 mmol) of 3-(tert-butyl)-5-(1,5-dimethyl-2,4-dioxa-3-borabicyclo[3.1.0]hexan-3-yl)-1-(tetrahydro-2H-pyran-2-yl)-1H-pyrazole, 2.042 g (1.8 mmol) of $Pd(PPh_3)_4$, and 6.979 g (50.5 mmol) of $K_2CO_3$ were mixed together in 60 mL of THE and 30 mL of water ($H_2O$), and the mixed solution was stirred at a temperature of 75° C. for 18 hours. The obtained solution was cooled to room temperature and filtered. The organic layer was extracted from the obtained solution by using MC. The extracted layer was dried with anhydrous magnesium sulfate ($MgSO_4$) and filtered to obtain a filtrate. The residue obtained by concentrating the filtrate was purified by column chromatography with EA:hexane=10:90, thereby completing the preparation of 9.7 g (71%) of Intermediate B2.

Synthesis of Intermediate B1

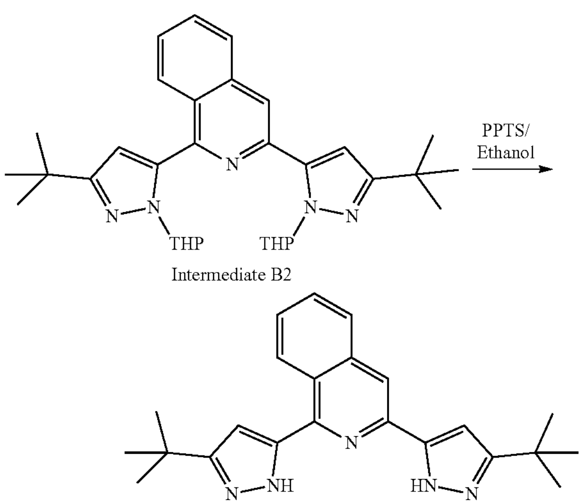

Intermediate B2

Intermediate B1

9.7 g (17.9 mmol) of Intermediate B2 and 0.45 g (1.79 mmol) of PPTS were mixed together in 100 mL of ethyl alcohol (ethanol), and the mixed solution was stirred at a temperature of 78° C. for 12 hours. The obtained solution was cooled to room temperature and filtered. The organic layer was extracted from the obtained solution by using MC. The extracted layer was dried with anhydrous magnesium sulfate ($MgSO_4$) and filtered to obtain a filtrate. The residue obtained by concentrating the filtrate was purified by column chromatography with EA:hexane:methanol=24:75:1, thereby completing the preparation of 4.55 g (68%) of Intermediate B1.

Synthesis of Compound 8

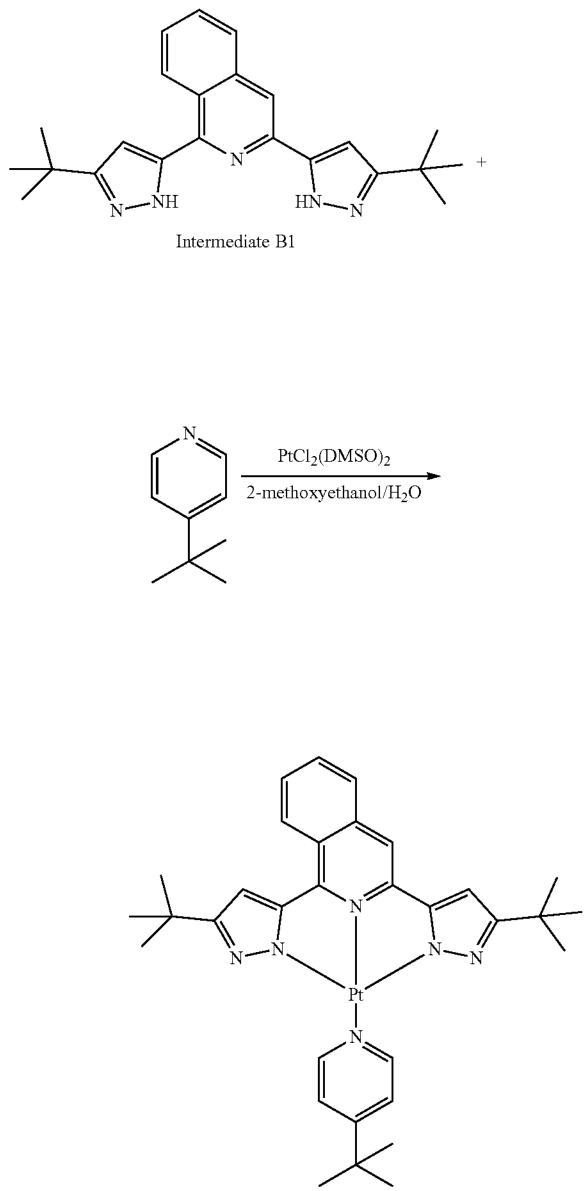

Intermediate B1

Compound 8

2 g (5.35 mmol) of Intermediate B1, 0.824 ml (5.6 mmol) of tert-butyl pyridine, and 2.26 g (5.35 mmol) of $PtCl_2(DMSO)_2$ were mixed together in 40 ml of 2-methoxyethanol and 20 ml of water, and the mixed solution was stirred at a temperature of 85° C. for 24 hours. Once the reaction was completed, the obtained solution was cooled. A resulting mixture was filtered to obtain a solid. The solid was thoroughly washed with ethanol. Column chromatography was performed under a condition of ethanol:hexane=20:80, thereby completing the preparation of 1.58 g (42%) of Compound 8. The obtained compound was confirmed by Mass and HPLC analysis.

HRMS(MALDI) calcd for $C_{32}H_{38}N_6Pt$: m/z 701.2806, Found: 701.2807.

Synthesis Example 3: Synthesis of Compound 139

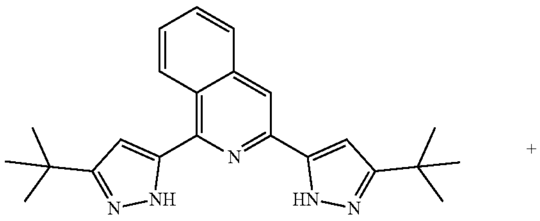

Intermediate B1

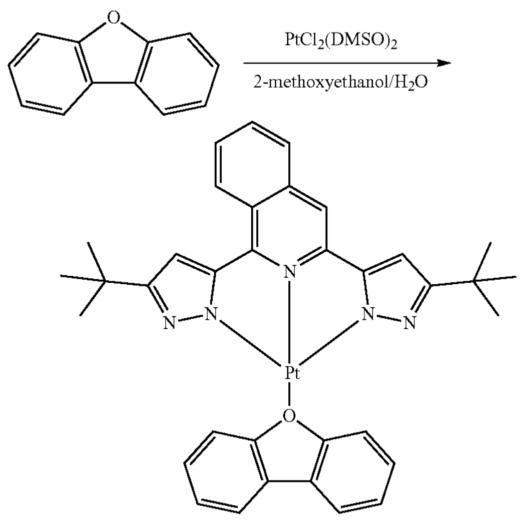

Compound 139

1.38 g (35%) of Compound 139 was obtained in the same manner as in Synthesis of Compound 11 of Synthesis Example 1, except that 2 g (5.35 mmol) of Intermediate B1 and 0.95 g (5.62 mmol) of dibenzofuran were used instead of Intermediate A1 and tert-butyl pyridine in synthesizing Compound 11. The obtained compound was confirmed by Mass and HPLC analysis.

HRMS(MALDI) calcd for $C_{35}H_{33}N_5OPt$: m/z 734.2333, Found: 734.2335.

Synthesis Example 4: Synthesis of Compound 140

Synthesis of Intermediate $C_3$

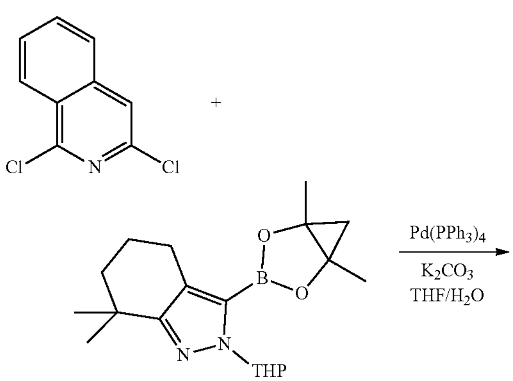

-continued

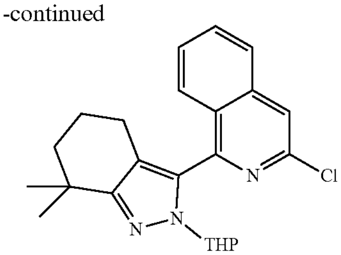

Intermediate C3

5 g (25.2 mmol) of 1,3-dichloroisoquinoline, 9.560 g (27.8 mmol) of 3-(1,5-dimethyl-2,4-dioxa-3-borabicyclo [3.1.0]hexan-3-yl)-7,7-dimethyl-2-(tetrahydro-2H-pyran-2-yl)-4,5,6,7-tetrahydro-2H-indazole, 2.042 g (1.8 mmol) of $Pd(PPh_3)_4$, and 6.979 g (50.5 mmol) of $K_2CO_3$ were mixed together in 60 mL of THF and 30 mL of water ($H_2O$), and the mixed solution was stirred at a temperature of 75° C. for 18 hours. The obtained solution was cooled to room temperature and filtered. The organic layer was extracted from the obtained solution by using MC. The extracted layer was dried with anhydrous magnesium sulfate ($MgSO_4$) and filtered to obtain a filtrate. The residue obtained by concentrating the filtrate was purified by column chromatography with EA:hexane=10:90, thereby completing the preparation of 6.3 g (63%) of Intermediate $C_3$.

Synthesis of Intermediate $C_2$

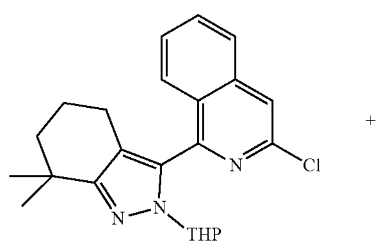

Intermediate C3

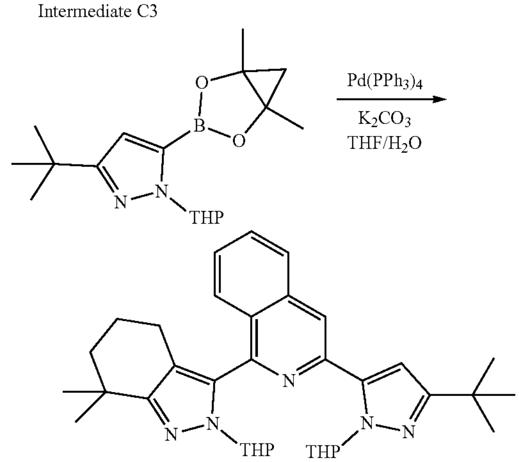

Intermediate C2

6.3 g (15.9 mmol) of Intermediate $C_3$, 5.57 g (17.5 mmol) of 3-(tert-butyl)-5-(1,5-dimethyl-2,4-dioxa-3-borabicyclo [3.1.0]hexan-3-yl)-1-(tetrahydro-2H-pyran-2-yl)-1H-pyrazole, 1.29 g (1.11 mol) of $Pd(PPh_3)_4$, and 4.40 g (31.8 mmol) of $K_2CO_3$ were mixed together in 60 mL of THF and 30 mL of water ($H_2O$), and the mixed solution was stirred at a temperature of 75° C. for 18 hours. The obtained solution was cooled to room temperature and filtered. The organic layer was extracted from the obtained solution by using MC. The extracted layer was dried with anhydrous magnesium sulfate ($MgSO_4$) and filtered to obtain a filtrate. The residue obtained by concentrating the filtrate was purified by column chromatography with EA:hexane=10:90, thereby completing the preparation of 7.2 g (80%) of Intermediate $C_2$.

Synthesis of Intermediate $C_1$

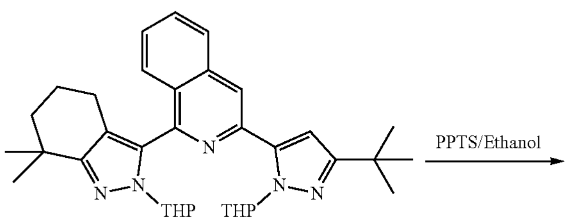

Intermediate C2

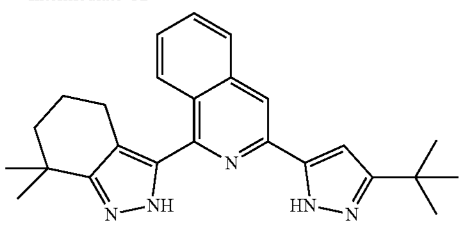

Intermediate C1

7.2 g (12.7 mmol) of Intermediate C2 and 0.32 g (1.27 mmol) of PPTS were mixed together in 100 mL of ethyl alcohol (ethanol), and the mixed solution was stirred at a temperature of 78° C. for 12 hours. The obtained solution was cooled to room temperature and filtered. The organic layer was extracted from the obtained solution by using MC. The extracted layer was dried with anhydrous magnesium sulfate ($MgSO_4$) and filtered to obtain a filtrate. The residue obtained by concentrating the filtrate was purified by column chromatography with EA:hexane:methanol=24:75:1, thereby completing the preparation of 3.69 g (73%) of Intermediate $C_1$.

Synthesis of Compound 140

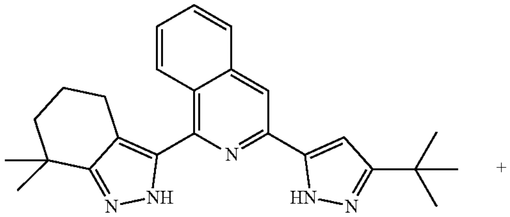

Intermediate C1

-continued

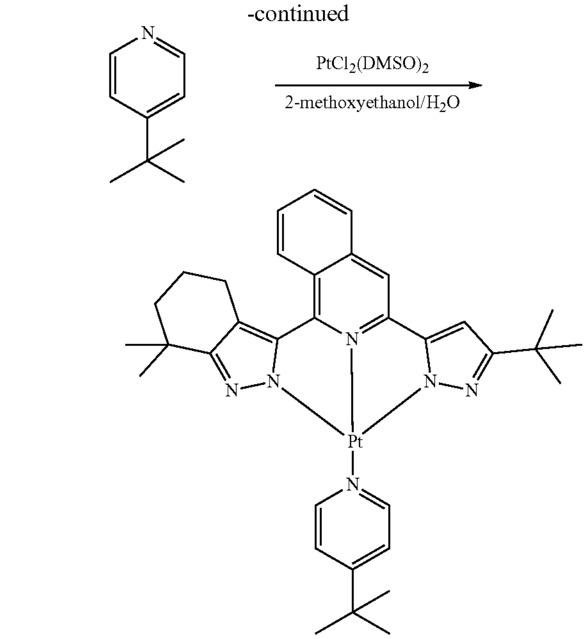

Compound 140

1.09 g (30%) of Compound 140 was obtained in the same manner as in Synthesis of Compound 11 of Synthesis Example 1, except that 2.0 g (5.00 mmol) of Intermediate $C_1$ was used instead of Intermediate A1 in synthesizing Compound 11. The obtained compound was confirmed by Mass and HPLC analysis.

HRMS(MALDI) calcd for $C_{34}H_{40}N_6Pt$: m/z 727.2962, Found: 727.2960.

Synthesis Example 5: Synthesis of Compound 5

Synthesis of Intermediate D2

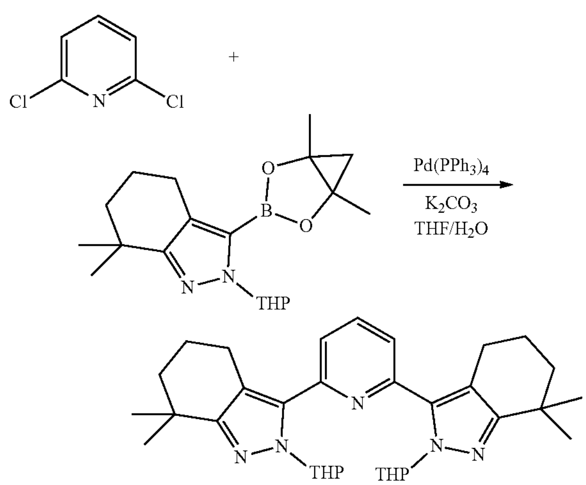

Intermediate D2

3 g (20.3 mmol) of 1,3-dichloropyridine, 15.35 g (44.6 mmol) of 3-(1,5-dimethyl-2,4-dioxa-3-borabicyclo[3.1.0]hexan-3-yl)-7,7-dimethyl-2-(tetrahydro-2H-pyran-2-yl)-4, 5,6,7-tetrahydro-2H-indazole, 1.640 g (1.4 mmol) of $Pd(PPh_3)_4$, and 5.603 g (40.5 mmol) of $K_2CO_3$ were mixed together in 60 mL of THE and 30 mL of water ($H_2O$), and the mixed solution was stirred at a temperature of 75° C. for 18 hours. The obtained solution was cooled to room temperature and filtered. The organic layer was extracted from the obtained solution by using MC. The extracted layer was dried with anhydrous magnesium sulfate ($MgSO_4$) and filtered to obtain a filtrate. The residue obtained by concentrating the filtrate was purified by column chromatography with EA:hexane=10:90, thereby completing the preparation of 7.72 g (70%) of Intermediate D2.

Synthesis of Intermediate D1

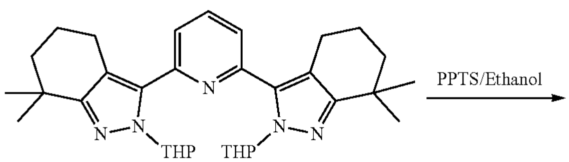

Intermediate D2

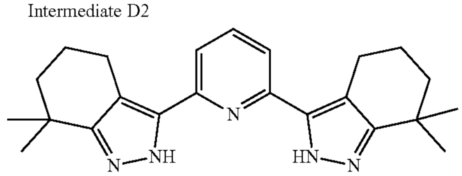

Intermediate D1

7.72 g (14.2 mmol) of Intermediate D2 and 0.15 g (1.42 mmol) of PPTS were mixed together in 100 mL of ethyl alcohol (ethanol), and the mixed solution was stirred at a temperature of 78° C. for 12 hours. The obtained solution was cooled to room temperature and filtered. The organic layer was extracted from the obtained solution by using MC. The extracted layer was dried with anhydrous magnesium sulfate ($MgSO_4$) and filtered to obtain a filtrate. The residue obtained by concentrating the filtrate was purified by column chromatography with EA:hexane:methanol=24:75:1, thereby completing the preparation of 3.31 g (62%) of Intermediate D1.

Synthesis of Compound 5

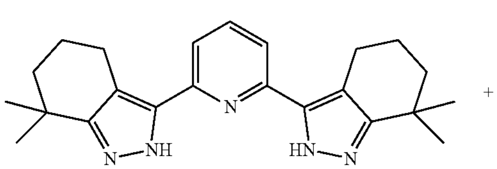

Intermediate A1

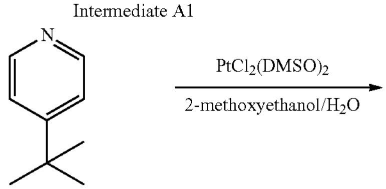

-continued

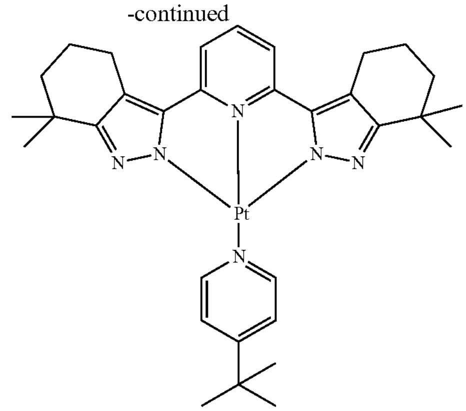

Compound 5

1.50 g (40%) of Compound 5 was obtained in the same manner as in Synthesis of Compound 11 of Synthesis Example 1, except that 2.0 g (5.33 mmol) of Intermediate D1 was used instead of Intermediate A1 in synthesizing Compound 11. The obtained compound was confirmed by Mass and HPLC analysis.

HRMS(MALDI) calcd for $C_{32}H_{40}NrPt$: m/z 703.2962, Found: 703.2963.

Synthesis Example 6: Synthesis of Compound 2

Synthesis of Intermediate E2

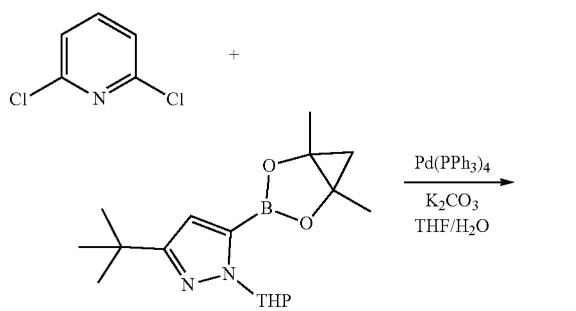

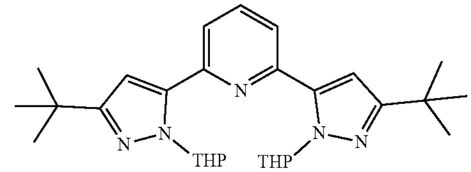

Intermediate E2

3 g (20.3 mmol) of 1,3-dichloropyridine, 14.18 g (44.6 mmol) of 3-(tert-butyl)-5-(1,5-dimethyl-2,4-dioxa-3-borabicyclo[3.1.0]hexan-3-yl)-1-(tetrahydro-2H-pyran-2-yl)-1H-pyrazole, 1.640 g (1.4 mmol) of $Pd(PPh_3)_4$, and 5.603 g (40.5 mmol) of $K_2CO_3$ were mixed together in 60 mL of THE and 30 mL of water ($H_2O$), and the mixed solution was stirred at a temperature of 75° C. for 18 hours. The obtained solution was cooled to room temperature and filtered. The organic layer was extracted from the obtained solution by using MC. The extracted layer was dried with anhydrous magnesium sulfate ($MgSO_4$) and filtered to obtain a filtrate. A residue obtained by concentrating the filtrate was purified by column chromatography with EA:hexane=10:90, thereby completing the preparation of 6.78 g (68%) of Intermediate E2.

Synthesis of Intermediate E1

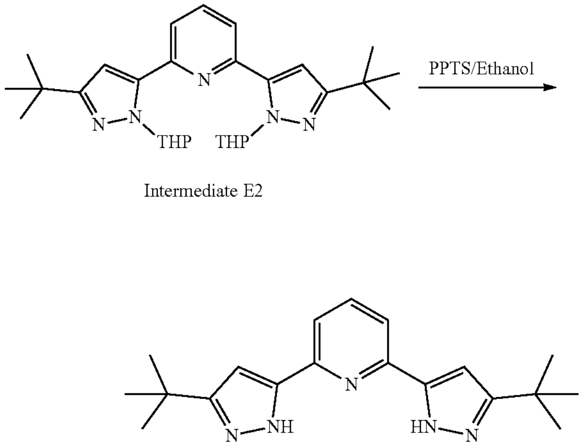

Intermediate E2

Intermediate E1

6.78 g (12.7 mmol) of Intermediate E2 and 0.32 g (1.27 mmol) of PPTS were mixed together in 100 mL of ethyl alcohol (ethanol), and the mixed solution was stirred at a temperature of 78° C. for 12 hours. The obtained solution was cooled to room temperature and filtered. The organic layer was extracted from the obtained solution by using MC. The extracted layer was dried with anhydrous magnesium sulfate ($MgSO_4$) and filtered to obtain a filtrate. The residue obtained by concentrating the filtrate was purified by column chromatography with EA:hexane:methanol=24:75:1, thereby completing the preparation of 2.72 g (61%) of Intermediate E1.

Synthesis of Compound 2

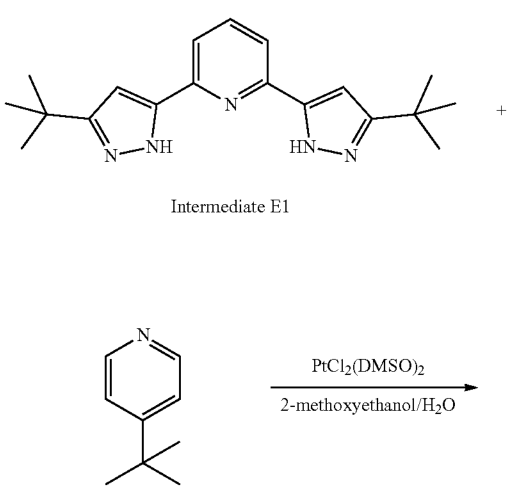

Intermediate E1

-continued

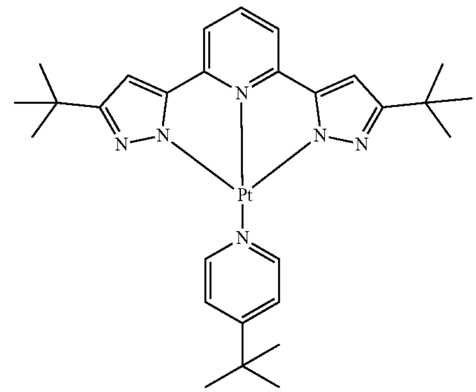

Compound 2

1.19 g (29%) of Compound 2 was obtained in the same manner as in Compound 11 of Synthesis Example 1, except that 2.0 g (6.18 mmol) of Intermediate E1 were used instead of Intermediate A1 in synthesizing Compound 11. The obtained compound was confirmed by Mass and HPLC analysis.

HRMS(MALDI) calcd for $C_{28}H_{36}N_6Pt$: m/z 651.2649, Found: 651.2650.

Synthesis Example 7: Synthesis of Compound 141

Synthesis of Intermediate F2

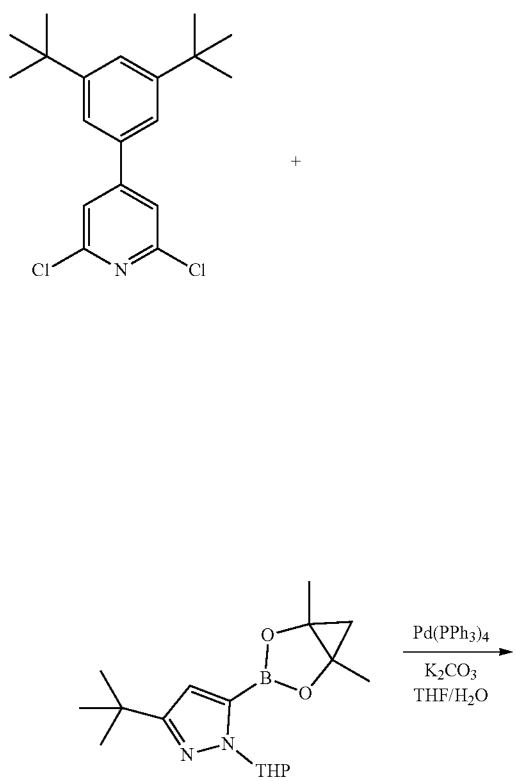

-continued

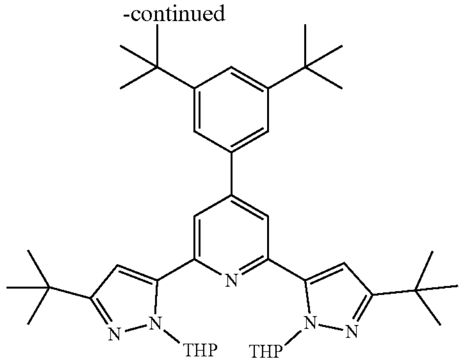

Intermediate F2

6.47 g (80%) of Intermediate F2 was obtained in the same manner as in Synthesis of Intermediate E2 of Synthesis Example 6, except that 4.0 g (11.6 mmol) of 2,6-dichloro-4-(3,5-di-tert-butylphenyl)pyridine was used instead of 3 g (20.3 mmol) of 1,3-dichloropyridine.

Synthesis of Intermediate F1

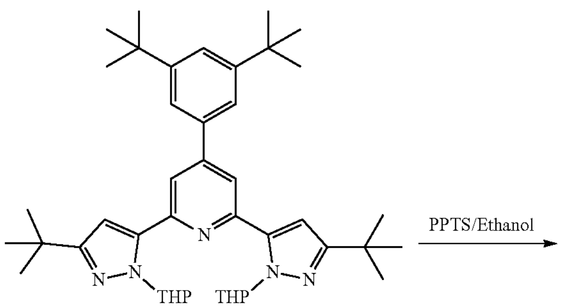

Intermediate F2

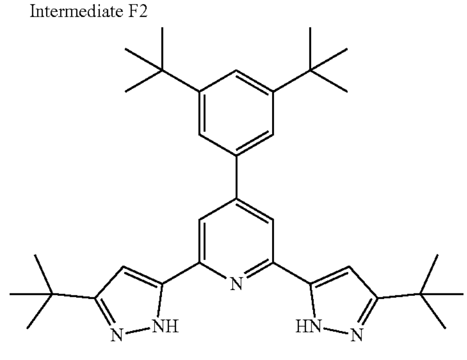

Intermediate F1

6.47 g (9.51 mmol) of Intermediate F2 and 0.24 g (0.95 mmol) of PPTS were mixed together in 100 mL of ethyl alcohol (ethanol), and the mixed solution was stirred at a temperature of 78° C. for 12 hours. The obtained solution was cooled to room temperature and filtered. The organic layer was extracted from the obtained solution by using MC. The extracted layer was dried with anhydrous magnesium sulfate ($MgSO_4$) and filtered to obtain a filtrate. The residue obtained by concentrating the filtrate was purified by column chromatography with EA:hexane:methanol=24:75:1, thereby completing the preparation of 4.09 g (84%) of Intermediate F1.

Synthesis of Compound 141

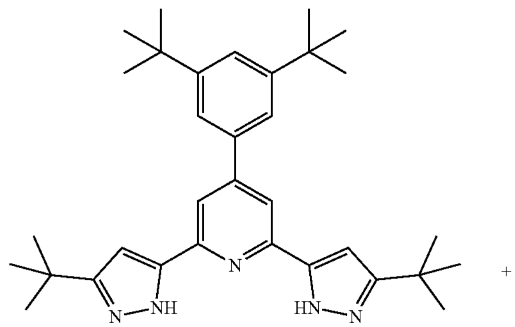

Intermediate F1

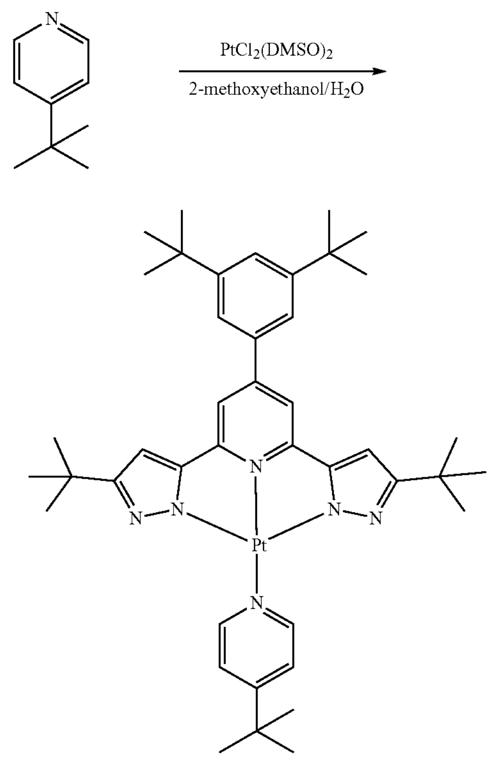

Compound 141

1.08 g (33%) of Compound 141 was obtained in the same manner as in Synthesis of Compound 11 of Synthesis Example 1, except that 2.0 g (3.91 mmol) of Intermediate F1 was used instead of Intermediate A1 in synthesizing Compound 11. The obtained compound was confirmed by Mass and HPLC analysis.

HRMS(MALDI) calcd for $C_{42}H_{56}N_6Pt$: m/z 839.4214, Found: 839.4212.

Synthesis Example 8: Synthesis of Compound 142

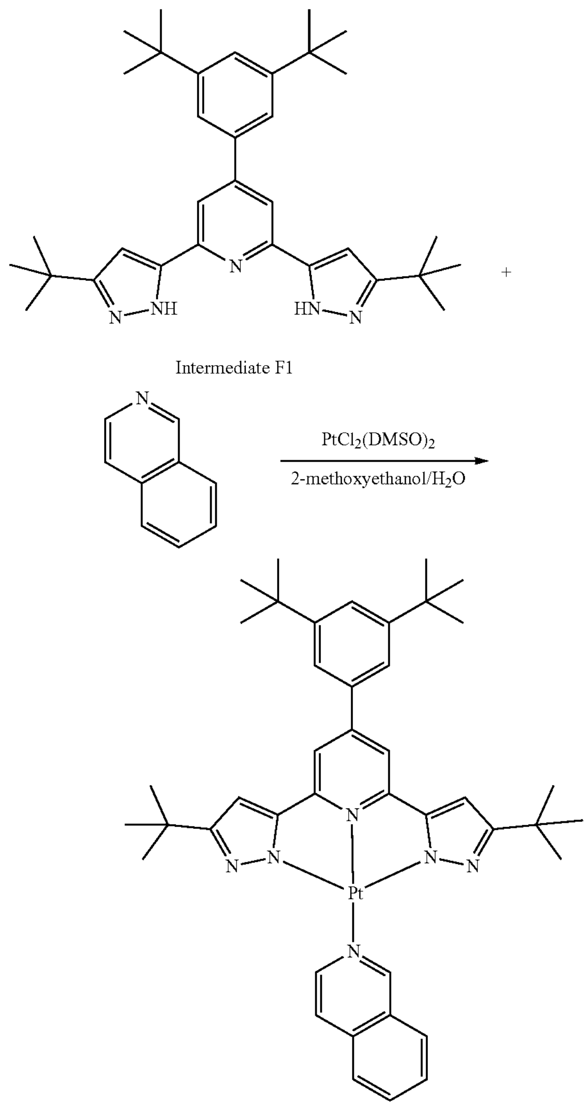

Compound 142

Compound 142 was obtained in the same manner as in Synthesis of Compound 141 of Synthesis Example 7, except that isoquinoline was used instead of tert-butyl pyridine in synthesizing Compound 141. The obtained compound was confirmed by Mass and HPLC analysis.

HRMS(MALDI) calcd for $C_{42}H_{50}N_6Pt$: m/z 833.3745, Found: 833.3746.

Example 1

An ITO glass substrate, on which an ITO electrode (anode) was deposited, was cut to a size of 50 mm×50 mm×0.5 mm (mm=millimeter), ultrasonically cleaned using acetone, iso-propyl alcohol, and pure water, each for 15 minutes, and exposed to irradiation of UV light for 30 minutes and ozone for further cleaning.

Then, m-MTDATA was deposited on the ITO electrode (anode) at a deposition rate of 1 Angstroms per second (A/sec) to form a hole injection layer having a thickness of 600 Angstroms (Å), and α-NPD was deposited on the hole injection layer at a deposition rate of 1 Å/sec to form a hole transport layer having a thickness of 250 Å.

Compound 5 (as a dopant) and CBP (as a host) were respectively co-deposited on the hole transport layer at a deposition rate of 0.1 Å/sec and a deposition rate of 1 Å/sec to form an emission layer having a thickness of 400 Å.

BAlq was deposited on the emission layer at a deposition rate of 1 Å/sec to form a hole blocking layer having a thickness of 50 Å, and $Alq_3$ was deposited on the hole blocking layer to form an electron transport layer having a thickness of 300 Å. Then, LiF was deposited on the electron transport layer to form an electron injection layer having a thickness of 10 Å. Al was vacuum-deposited on the electron injection layer to form a second electrode (cathode) having a thickness of 1,200 Å, thereby completing the manufacture of an organic light-emitting device having a structure of ITO/m-MTDATA (600 Å)/α-NPD (250 Å)/CBP+10% (Compound 5) (400 Å)/BAlq (50 Å)/$Alq_3$ (300 Å)/LiF (10 Å)/Al (1,200 Å).

Examples 2 to 5 and Comparative Examples 1 and 2

Organic light-emitting devices were manufactured in the same manner as in Example 1, except that in forming an emission layer, for use as a dopant, corresponding compounds shown in Table 2 were used instead of Compound 5.

Evaluation Example 1: Evaluation on Characteristics of Organic Light-Emitting Devices The driving voltage, luminescent efficiency, power efficiency, color purity, quantum efficiency, and lifespan ($T_{95}$) of the organic light-emitting devices manufactured in Examples 1 to 5 and Comparative Examples 1 and 2 were evaluated. The results thereof are shown in Table 2. A current-voltage meter (Keithley 2400) and a luminance meter (Minolta Cs-1000A) were used as evaluation devices. The lifespan ($T_{95}$) (at 6,000 nit) was evaluated as a period of time taken until the luminance was reduced to 95% of initial luminance.

TABLE 2

| | Dopant | Driving Voltage (V) | Luminescent Efficiency (cd/A) | Power Efficiency (lm/W) | CIEx | CIEy | Quantum Efficiency (%) | Lifespan (hr) ($T_{95}$) |
|---|---|---|---|---|---|---|---|---|
| Example 1 | Compound 5 | 5.1 | 47.7 | 29.3 | 0.362 | 0.601 | 17.1 | 180 |
| Example 2 | Compound 2 | 5.2 | 45.8 | 28.0 | 0.366 | 0.605 | 16.8 | 185 |
| Example 3 | Compound 141 | 5.5 | 49.9 | 31.0 | 0.360 | 0.600 | 18.8 | 230 |

TABLE 2-continued
| | Dopant | Driving Voltage (V) | Luminescent Efficiency (cd/A) | Power Efficiency (lm/W) | CIEx | CIEy | Quantum Efficiency (%) | Lifespan (hr) ($T_{95}$) |
|---|---|---|---|---|---|---|---|---|
| Example 4 | Compound 142 | 5.1 | 49.0 | 30.2 | 0.363 | 0.601 | 18.1 | 200 |
| Example 5 | Compound 140 | 5.2 | 48.8 | 29.9 | 0.362 | 0.599 | 18.3 | 190 |
| Comparative Example 1 | Compound A | 5.6 | 33.9 | 21.4 | 0.344 | 0.598 | 12.9 | 85 |
| Comparative Example 2 | Compound C | 5.2 | 34.3 | 22.5 | 0.368 | 0.604 | 13.7 | 100 |
5
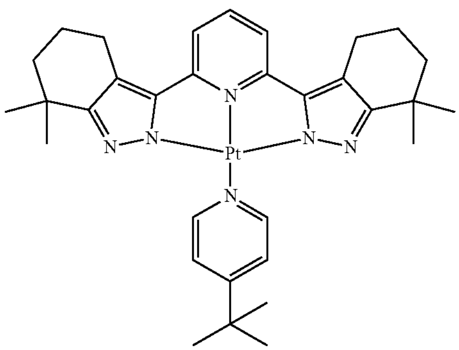
2
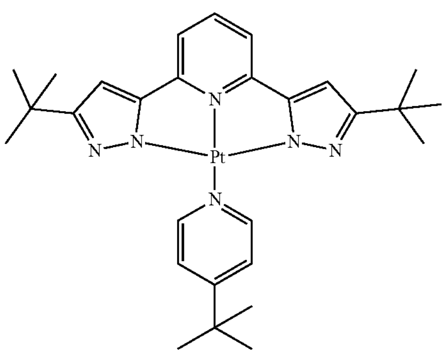
141
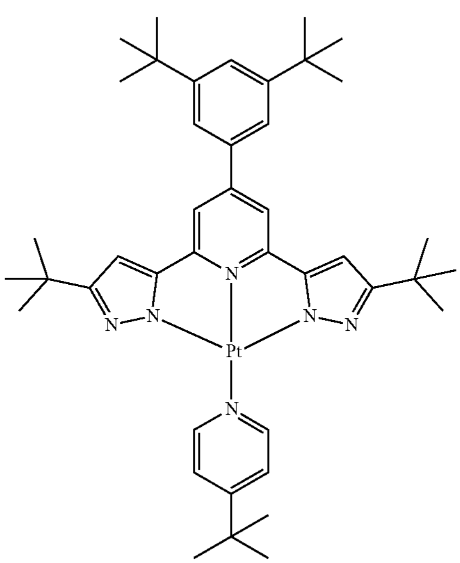
-continued
142
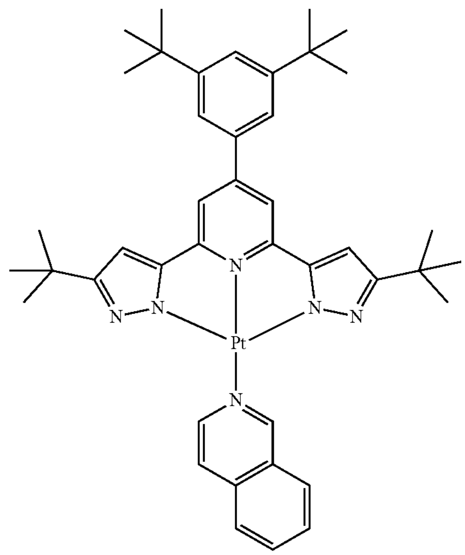
140
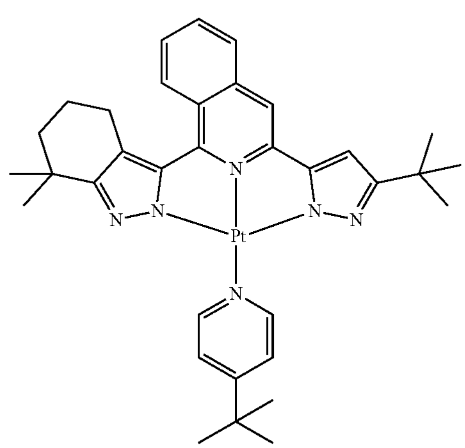

-continued

Compound A

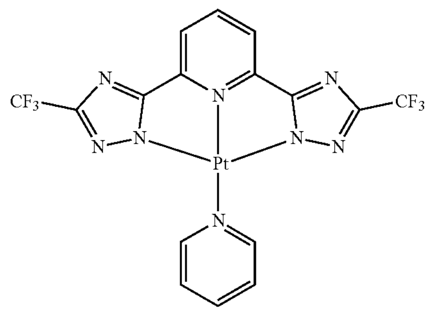

Compound C

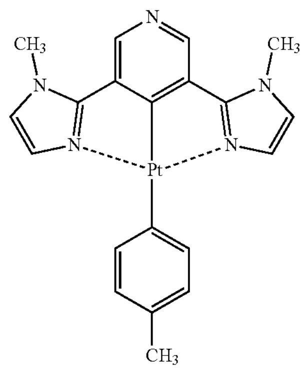

Referring to Table 2, it was determined that the organic light-emitting devices of Examples 1 to 5 had excellent driving voltage, luminescent efficiency, power efficiency, color purity, quantum efficiency, and lifespan characteristics, compared to those of the organic light-emitting devices of Comparative Examples 1 and 2.

Since an organometallic compound according to one or more embodiments has excellent electric characteristics and thermal stability, an organic light-emitting device including the organometallic compound may have excellent driving voltage, luminescent efficiency, power efficiency, color purity, quantum efficiency, and lifespan characteristics. In addition, since the organometallic compound has excellent phosphorescent luminescent characteristics, a diagnosis composition having high diagnosis efficiency may be provided by using the organometallic compound.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the FIGURES, it will be understood by those of ordinary skill in the art that various changes in form and details may be made therein without departing from the spirit and scope of the present disclosure as defined by the following claims.

What is claimed is:

1. An organic light-emitting device comprising:

a first electrode;

a second electrode; and an organic layer disposed between the first electrode and the second electrode, wherein the organic layer comprises an emission layer and an organometallic compound represented by Formula 1:

Formula 1

$M(L_1)(L_2)$

Formula 2C-1

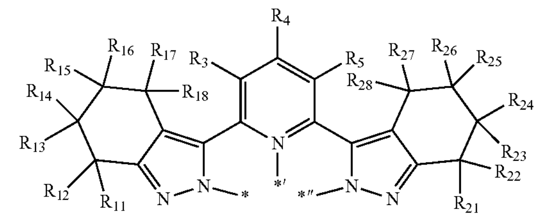

Formula 2E-2

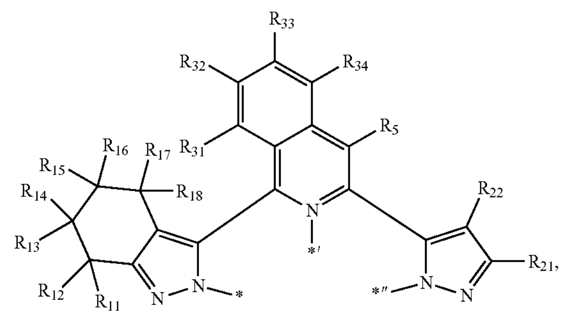

wherein, in Formulae 1, 2C-1 and 2E-2,

M is platinum (Pt), $L_1$ is selected from tridentate ligands represented by Formulae 2C-1 and 2E-2, $L_2$ is selected from monodentate organic ligands represented by Formulae 14-1 and 14-5, *, *', and *" in Formulae 2C-1 and 2E-2 each indicate a binding site to M in Formula 1, $R_3$ to $R_5$, $R_{11}$ to $R_{18}$, $R_{21}$ to $R_{28}$, and $R_{31}$ to $R_{34}$ are each independently selected from:

hydrogen, deuterium, and a $C_1$-$C_{20}$ alkyl group;

a $C_1$-$C_{20}$ alkyl group substituted with at least one deuterium; and a phenyl group; and Formula 14-1

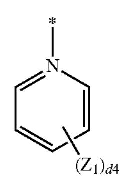

Formula 14-5

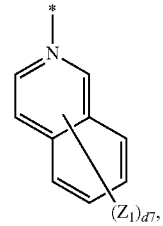

wherein, in Formula 14-1 or 14-5, $Z_1$ is selected from:

hydrogen, deuterium, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, and a phenyl group; and a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group, each substituted with at least one deuterium;

d4 is an integer selected from 1 to 4, d7 is an integer selected from 1 to 7, and

* indicates a binding site to M in Formula 1.

2. The organic light-emitting device of claim 1, wherein $R_3$ to $R_5$, $R_{11}$ to $R_{18}$, $R_{21}$ to $R_{28}$, and $R_{31}$ to $R_{34}$ are each independently selected from:

hydrogen, deuterium, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, and a phenyl group;

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group, each substituted with at least one deuterium.

3. An organic light-emitting device comprising:

a first electrode;

a second electrode; and an organic layer disposed between the first electrode and the second electrode, wherein the organic layer comprises an emission layer and an organometallic compound being one selected from Compounds 1, and 3 to 7, 9 to 15, 18, 20, to 23, 29 to 31, 33 to 35, 122, 124 to 127, 133, 134, and 140:

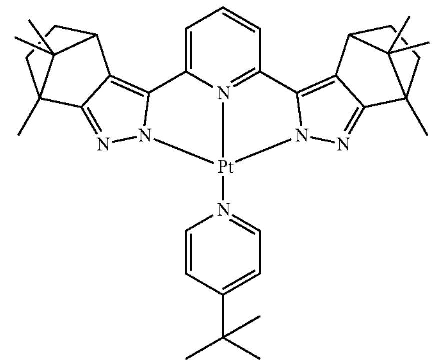

1

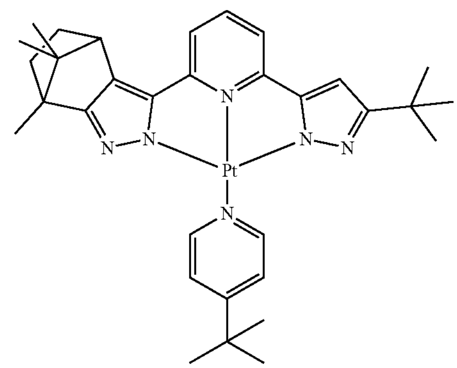

3

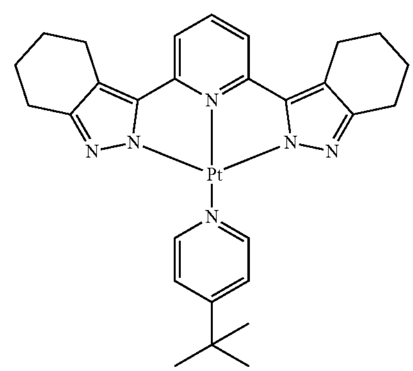

4

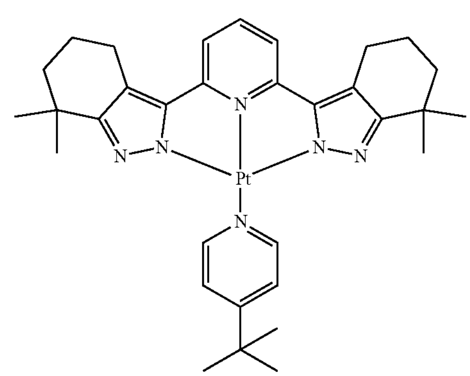

5

-continued
6
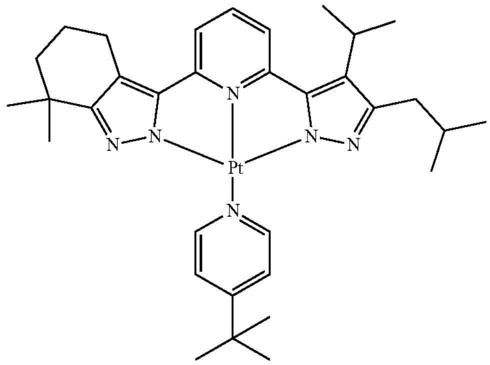
7
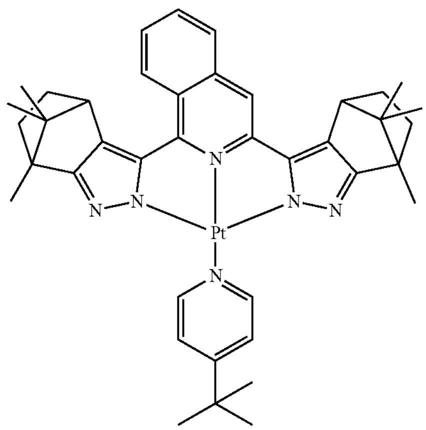
9
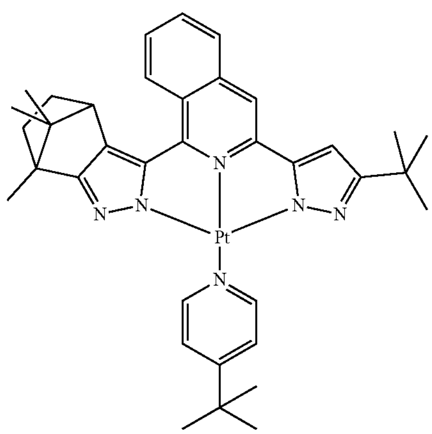
10
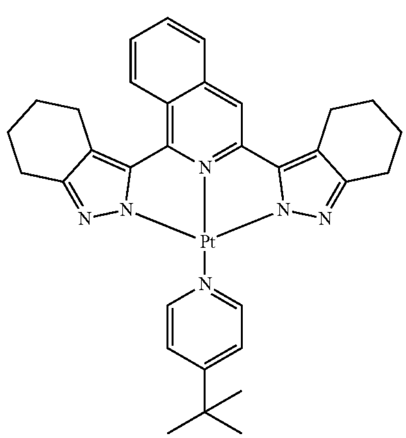
-continued
11
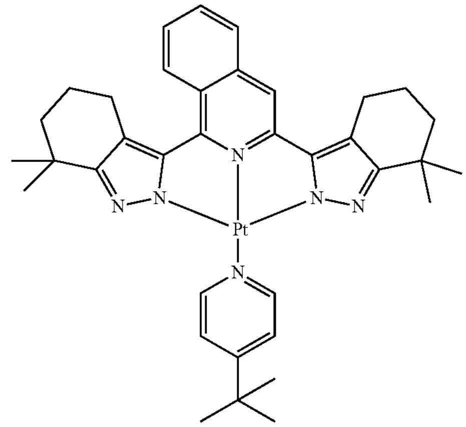
12
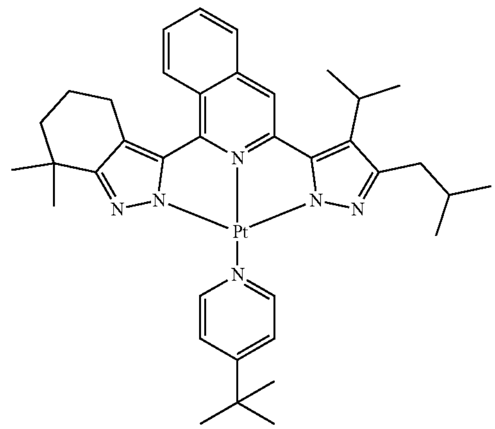
13
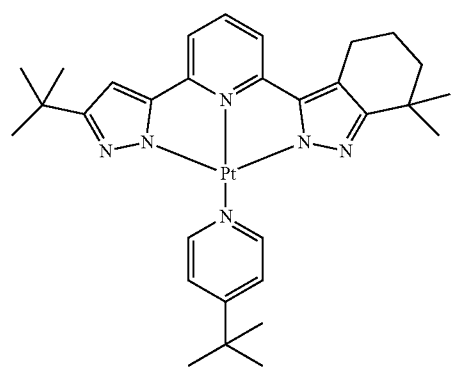
14
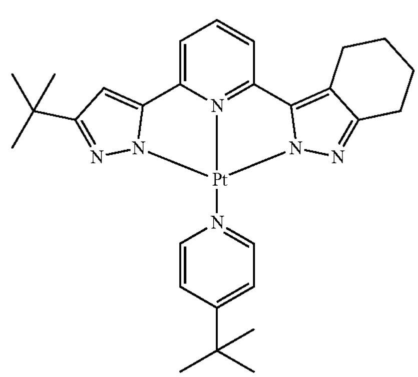

15
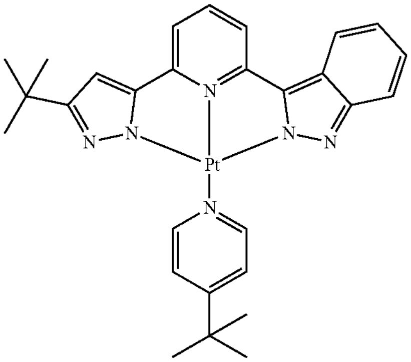
18
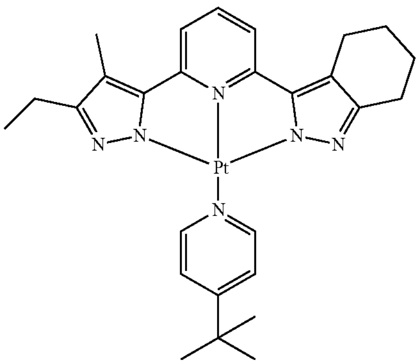
20
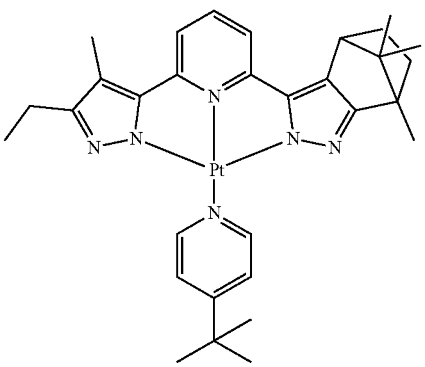
21
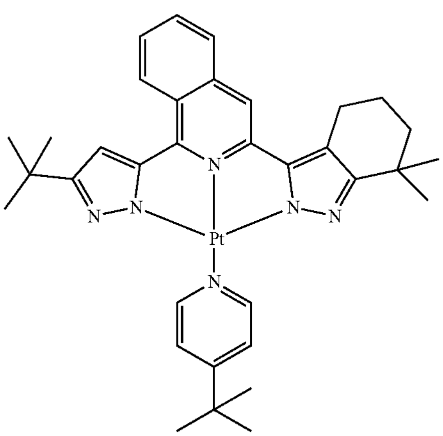
22
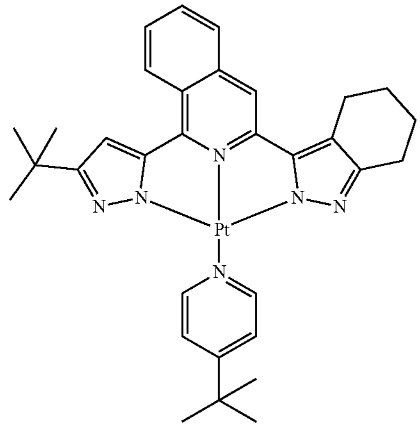
23
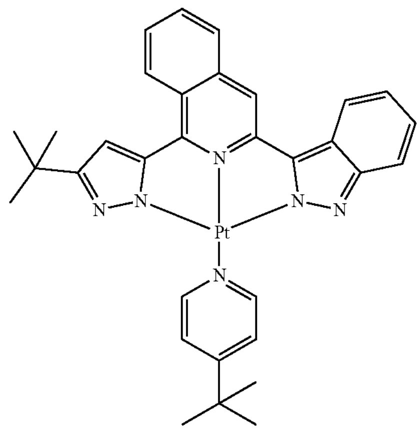
29
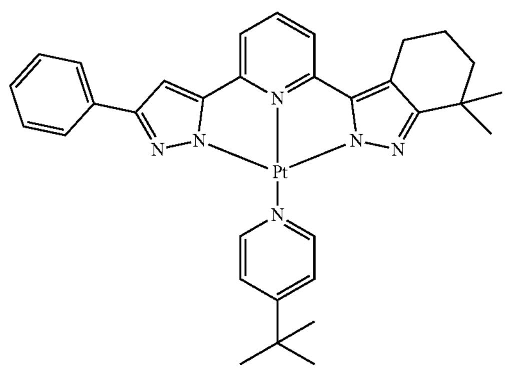
30
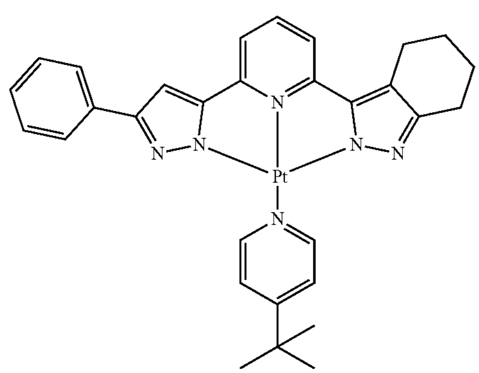

-continued
31
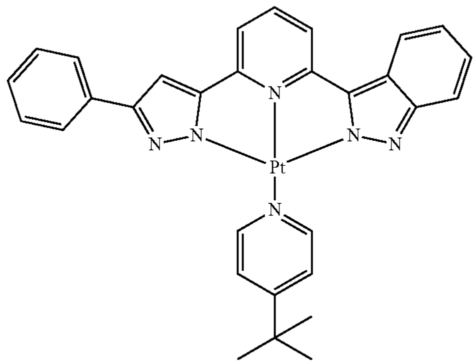
33
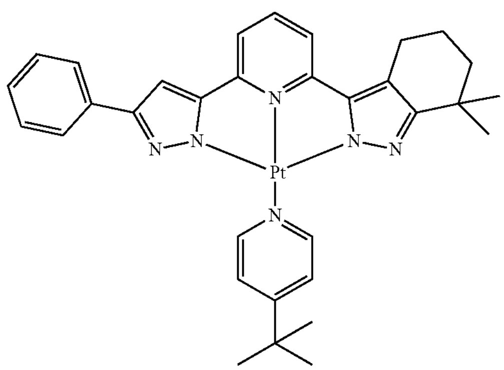
34
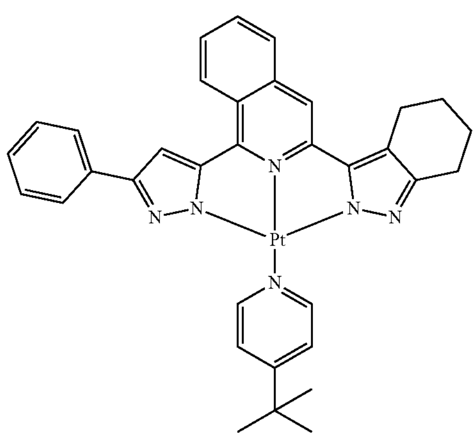
35
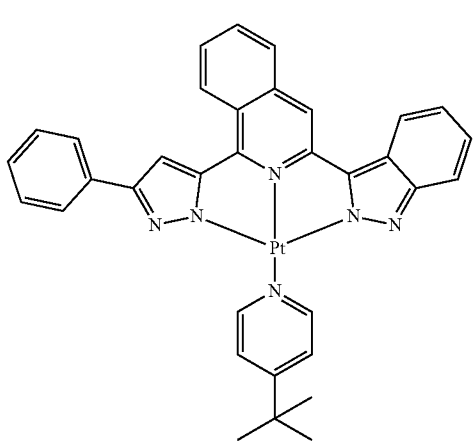
-continued
122
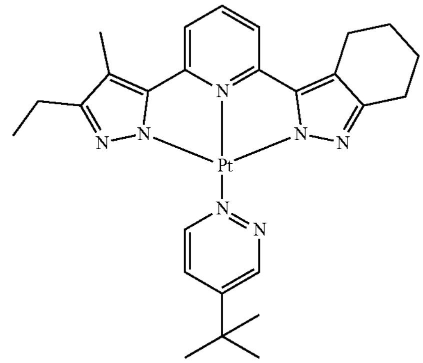
124
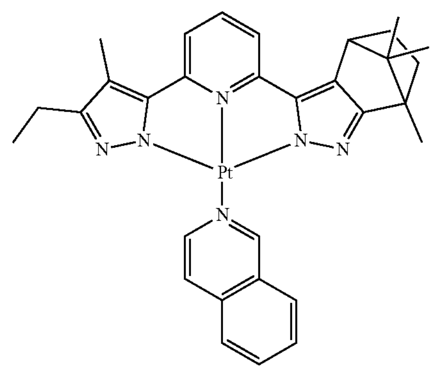
125
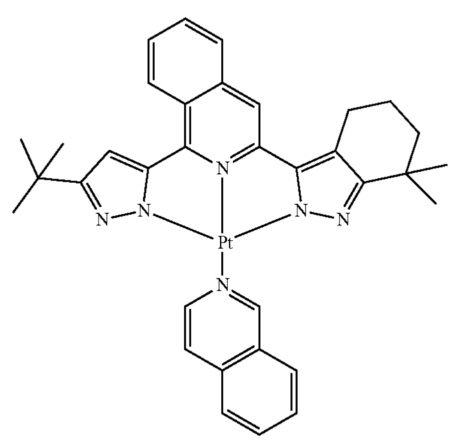
126
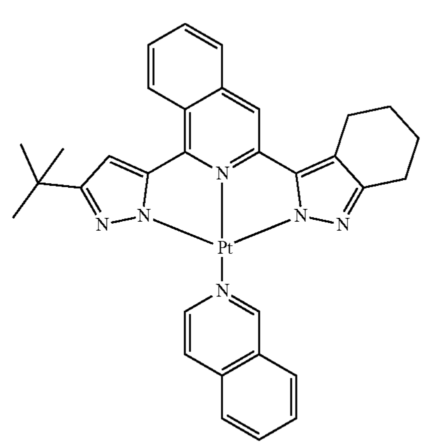

-continued

127

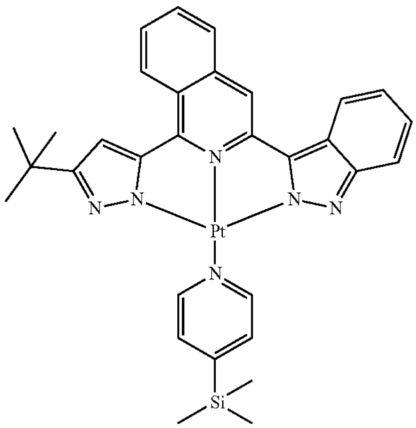

133

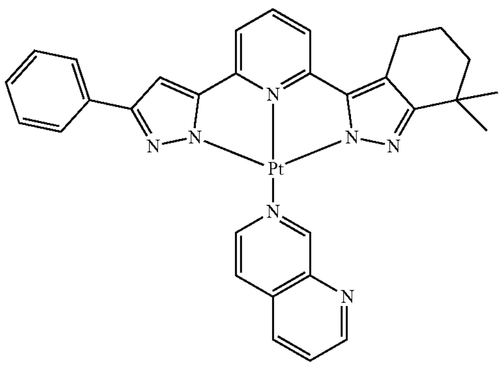

134

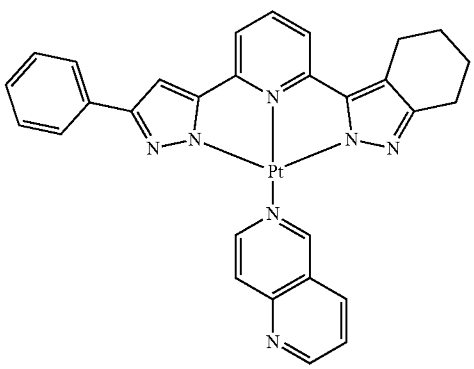

140

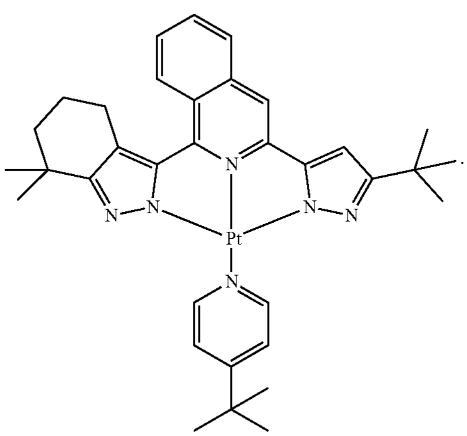

4. The organic light-emitting device of claim 1, wherein the emission layer comprises the organometallic compound.

5. The organic light-emitting device of claim 1, wherein the emission layer further comprises a host.

6. An organometallic compound represented by Formula 1:

Formula 1

$M(L_1)(L_2)$

Formula 2C-1

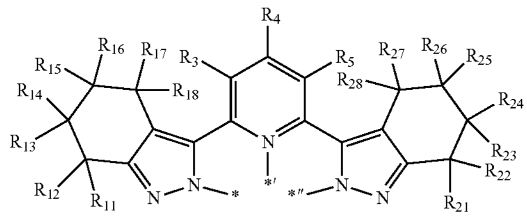

Formula 2E-2

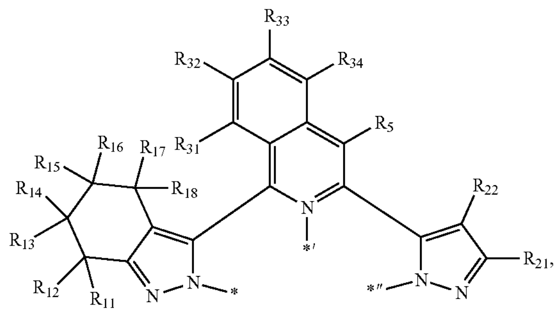

wherein, in Formulae 1, 2C-1 and 2E-2,

M is platinum (Pt), $L_1$ is selected from tridentate ligands represented by Formula 2C-1 or 2E-2, $L_2$ is selected from monodentate organic ligands represented by Formula 14-1 or 14-5,

*, *', and *" in Formulae 2A-1, 2C-1 and 2E-2 each indicate a binding site to M in Formula 1, $R_3$ to $R_5$, $R_{11}$ to $R_{18}$, $R_{21}$ to $R_{28}$, and $R_{31}$ to $R_{34}$ are each independently selected from:

hydrogen, deuterium, and a $C_1$-$C_{10}$ alkyl group;

a $C_1$-$C_{20}$ alkyl group substituted with at least one deuterium; and a phenyl group; and Formula 14-1

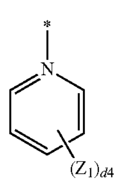

-continued

Formula 14-5

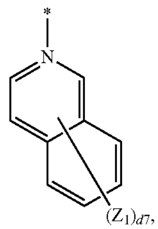

wherein, in Formula 14-1 or 14-5, $Z_1$ is selected from:

hydrogen, deuterium, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, and a phenyl group; and a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group, each substituted with at least one deuterium;

d4 is an integer selected from 1 to 4, d7 is an integer selected from 1 to 7, and

* indicates a binding site to M in Formula 1.

* * * * *